US006373748B2

(12) United States Patent
Ikehashi et al.

(10) Patent No.: US 6,373,748 B2
(45) Date of Patent: Apr. 16, 2002

(54) NONVOLATILE SEMICONDUCTOR MEMORY

(75) Inventors: Tamio Ikehashi, Kamakura; Kenichi Imamiya, Tokyo, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/842,406

(22) Filed: Apr. 26, 2001

(30) Foreign Application Priority Data

Apr. 27, 2000 (JP) ........................................ 2000-127950

(51) Int. Cl.[7] .............................................. G11C 16/06
(52) U.S. Cl. ............................ 365/185.22; 365/189.05; 365/230.08
(58) Field of Search ....................... 365/185.22, 189.05, 365/230.08, 185.09, 235, 238.5

(56) References Cited

U.S. PATENT DOCUMENTS 6,147,910 A * 11/2000 Hsu et al. ............... 365/185.22

6,172,917 B1  1/2001 Kataoka et al.

FOREIGN PATENT DOCUMENTS

JP   11-328981   11/1999

OTHER PUBLICATIONS

IEEE Digest of ISSCC95, "A 3.3V–Only 16Mb DINOR Flash Memory"; S. Kobayashi et al.; Feb. 16, 1995, pp. 122–123.

* cited by examiner

Primary Examiner—David Nelms
Assistant Examiner—David Lam
(74) Attorney, Agent, or Firm—Banner & Witcoff, Ltd.

(57) ABSTRACT

One page buffer is connected to one bit line. The page buffer latches program data for a selected memory cell. A plurality of page buffers are connected to a sense amplifier in a read/write circuit through a column gate. In a verify read, read data of a selected column is detected using a sense amplifier used in a normal data read. The read data detected by the sense amplifier, i.e., the verify read result is transferred to the page buffer of the selected column. The value of program data in the page buffer is changed on the basis of the verify read result.

32 Claims, 24 Drawing Sheets

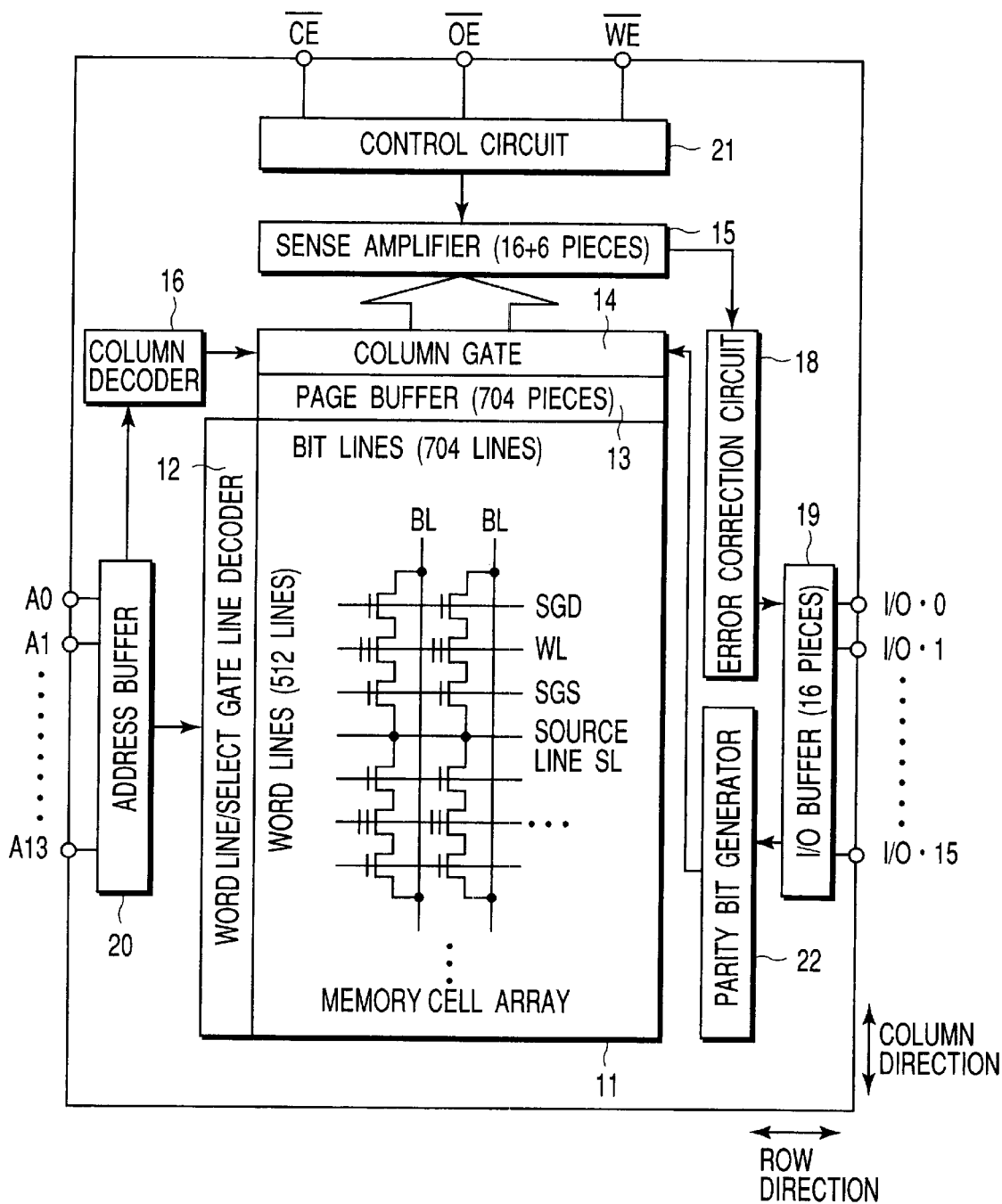
F I G. 1

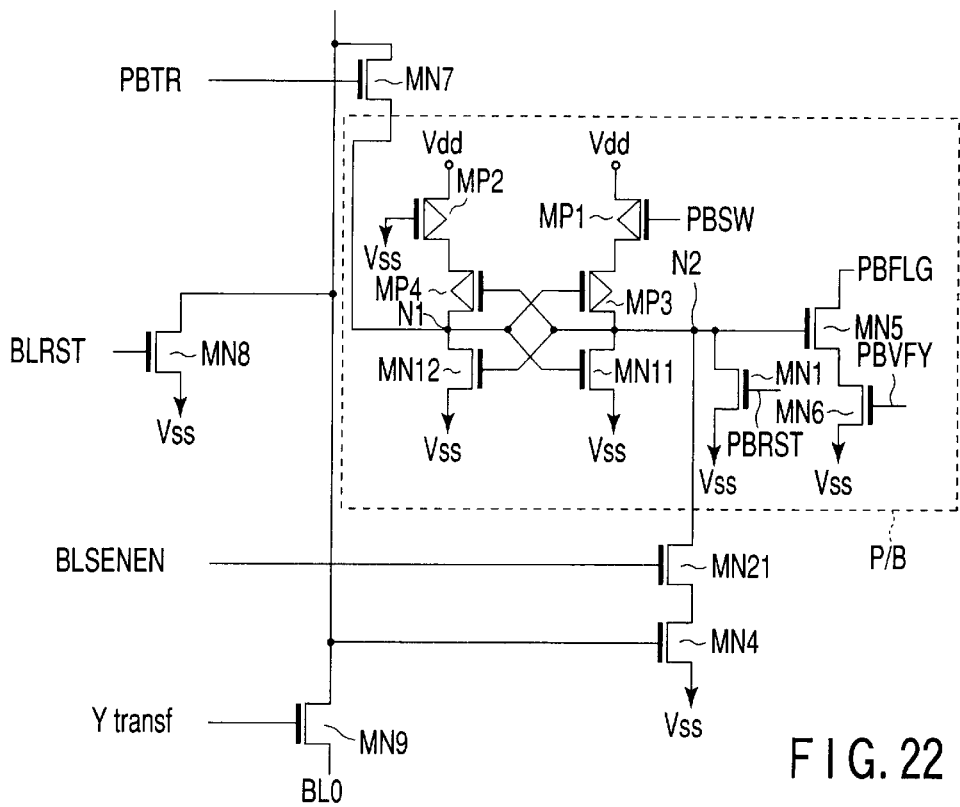
F I G. 22
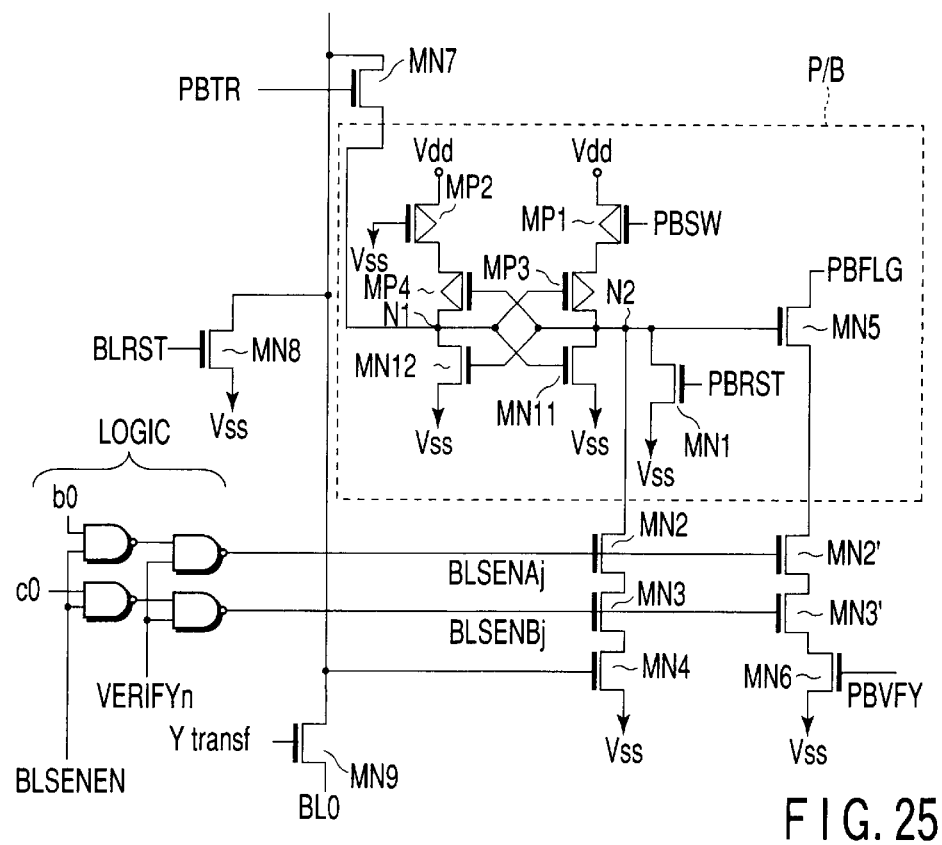
F I G. 25

NONVOLATILE SEMICONDUCTOR MEMORY

CROSS-REFERENCE TO RELATED APPLICATIONS

This application is based upon and claims the benefit of priority from the prior Japanese Patent Application No. 2000-127950, filed Apr. 27, 2000, the entire contents of which are incorporated herein by reference.

BACKGROUND OF THE INVENTION

The present invention relates to a nonvolatile semiconductor memory having one page buffer arranged in one column and connected to one bit line and a sense amplifier for a data read.

As nonvolatile semiconductor memories capable of high-speed random access, an EEPROM, NOR cell flash memory, and the like are known. In recent years, in addition to these memories, memories of a new type based on a NAND cell flash memory have been devised. One of such memories is a so-called "3Tr-NAND".

The 3Tr-NAND has been developed as a memory or memory-embedded ASIC to be assembled in a low-power portable device such as a non-contact IC card. One cell unit is constructed by three transistors, i.e., one memory cell and two select transistors which sandwich the memory cell.

A 3Tr-NAND has the following characteristic features, as compared to an EEPROM or flash memory.

(1) A high-speed data read, in units of 16 bits (=one word) is possible.

(2) A data erase can be executed in units of 32 words.

(3) Power consumption in the data read is low.

(4) The memory cell size is small.

More specifically, for example, the 3Tr-NAND has a smaller memory cell size than that of an EEPROM, so the chip size and manufacturing cost can be reduced. The 3Tr-NAND has lower power consumption and a smaller erase unit than those of a NOR cell flash memory.

Since the 3Tr-NAND has been developed based on a NAND cell flash memory, it has a page buffer for temporarily storing program data or read data. One page buffer is provided in correspondence with, e.g., one or a plurality of columns (bit lines).

In addition, the 3Tr-NAND has a sense amplifier for a data read because it is important to execute a data read at a high speed, unlike a NAND cell flash memory that mainly aims at ensuring a large memory capacity.

The sense amplifier has the same structure as that of a sense amplifier used in, e.g., a NOR cell flash memory. For example, the sense amplifier compares a current flowing to a reference cell with a current flowing to a selected memory cell, thereby determining data ("1" or "0") of the memory cell.

Normally, sense amplifiers fewer than columns are arranged in a memory chip because the size of a sense amplifier is relatively large. In the data read, only a column selected by a column decoder is electrically connected to the sense amplifier through a column gate.

In the 3Tr-NAND, a data rewrite (change) is achieved by ① load of program data to the page buffer, ② data erase ("1" state is set) for a selected memory cell, or ③ data programming ("0"-programming or "1"-programming) for a selected memory cell, as in a NAND cell flash memory.

In data programming, a program verify is performed to verify whether predetermined data has been correctly programmed in a selected memory cell. The program verify is constituted by a verify read for reading data from a selected memory cell (memory cell in which data is to be programmed) and determining the data value, and detection operation for detecting whether the data read in the verify read matches program data.

In the verify read of a NAND cell flash memory, a page buffer (latch circuit) detects (senses) data from a selected memory cell and determines the data value. In the verify read of a 3Tr-NAND as well, a page buffer can detect data from a selected memory cell and determine the data value.

However, as described above, in the 3Tr-NAND, in the normal data read, read data is detected and its data value is determined by a sense amplifier to realize a high-speed data read. If data value determination in the verify read is done by a page buffer, different data value determination circuits are used for the normal data read and the verify read.

The sense amplifier and page buffer use different levels (threshold voltages) as a determination criterion for "1" and "0". For this reason, in the 3Tr-NAND, if the data value determination in the verify read is done by the page buffer, the data value cannot be correctly determined. As a result, for example, even when programming is non-sufficient, it may be erroneously determined that programming is sufficient.

In addition to the above-described 3Tr-NAND, as a nonvolatile semiconductor memory having a page buffer and sense amplifier, a nonvolatile semiconductor memory is disclosed in, e.g., Shin-ichi Kobayashi et al., "A 3.3 V-only 16 Mb DINOR Flash Memory" IEEE International Solid-State Circuits Conference. SESSION7/FLASH MEMORY/PAPER TA 7.2, pp. 122–123, Feb. 16, 1995.

Even in the nonvolatile semiconductor memory disclosed in this reference, read data detection and data value determination in the normal data read are done by a sense amplifier, and read data detection and data value determination in the verify read are done by a page buffer. For this reason, the data value cannot be correctly determined in the verify read.

The present invention has been made to solve the above problem, and has as its object to correctly determine data (memory cell state) in the verify read in a nonvolatile semiconductor memory having a page buffer and sense amplifier.

BRIEF SUMMARY OF THE INVENTION (1) A nonvolatile semiconductor memory of the present invention comprises a memory cell, a bit line connected to the memory cell, a page buffer connected to one terminal of the bit line to latch data, a read circuit including a sense amplifier for detecting first read data read from the bit line in a normal data read, and a column gate connected between the page buffer and the sense amplifier, wherein in a verify read, second data read out from the memory cell is detected by the sense amplifier.

(2) A verify method of a nonvolatile semiconductor memory of the present invention comprises the steps of, when one page is formed from N (N is a natural number of not less than 2) groups, sequentially selecting the N groups one by one in accordance with a column address Col.Add.=1 to N, continuously performing a verify read and verify data-in for one group selected in accordance with the column address Col.Add.=i (i is one of 1 to N), and continuously performing the verify read and verify data-in for one group selected in accordance with the final column address Col.Add.=N, and then, detecting for all the N groups of one page whether programming is completed (batch detection).

In the verify read, data read out from a memory cell is detected by a sense amplifier in a read circuit, and in the verify data-in, the data is transferred from the read circuit to a page buffer.

(3) A nonvolatile semiconductor memory of the present invention comprises a memory cell, a bit line for transmitting/receiving data to/from the memory cell, and a page buffer connected to the bit line to latch the data. The page buffer comprises a latch circuit formed from first and second inverters which are flip-flop-connected, a first transistor connected between a write circuit and a first node of the latch circuit to input data in a data load, and a second transistor connected between ground and a second node of the latch circuit and having a gate to which data read out from the memory cell in a verify read is input. An input node of the first inverter is connected to the first node, an output node of the first inverter is connected to the second node, and a third transistor is connected between the first inverter and a power supply terminal, the third transistor being turned off when the data is input to the page buffer. An input node of the second inverter is connected to the second node, an output node of the second inverter is connected to the first node, and a fourth transistor normally in an ON state is connected between the second inverter and the power supply terminal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing main part of a 3Tr-NAND of the present invention;

FIG. 22 is a circuit diagram showing details of a page buffer P/B shown in FIG. 21;

FIG. 25 is a circuit diagram showing details of a page buffer P/B shown in FIG. 24;

DETAILED DESCRIPTION OF THE INVENTION

Figure 2:
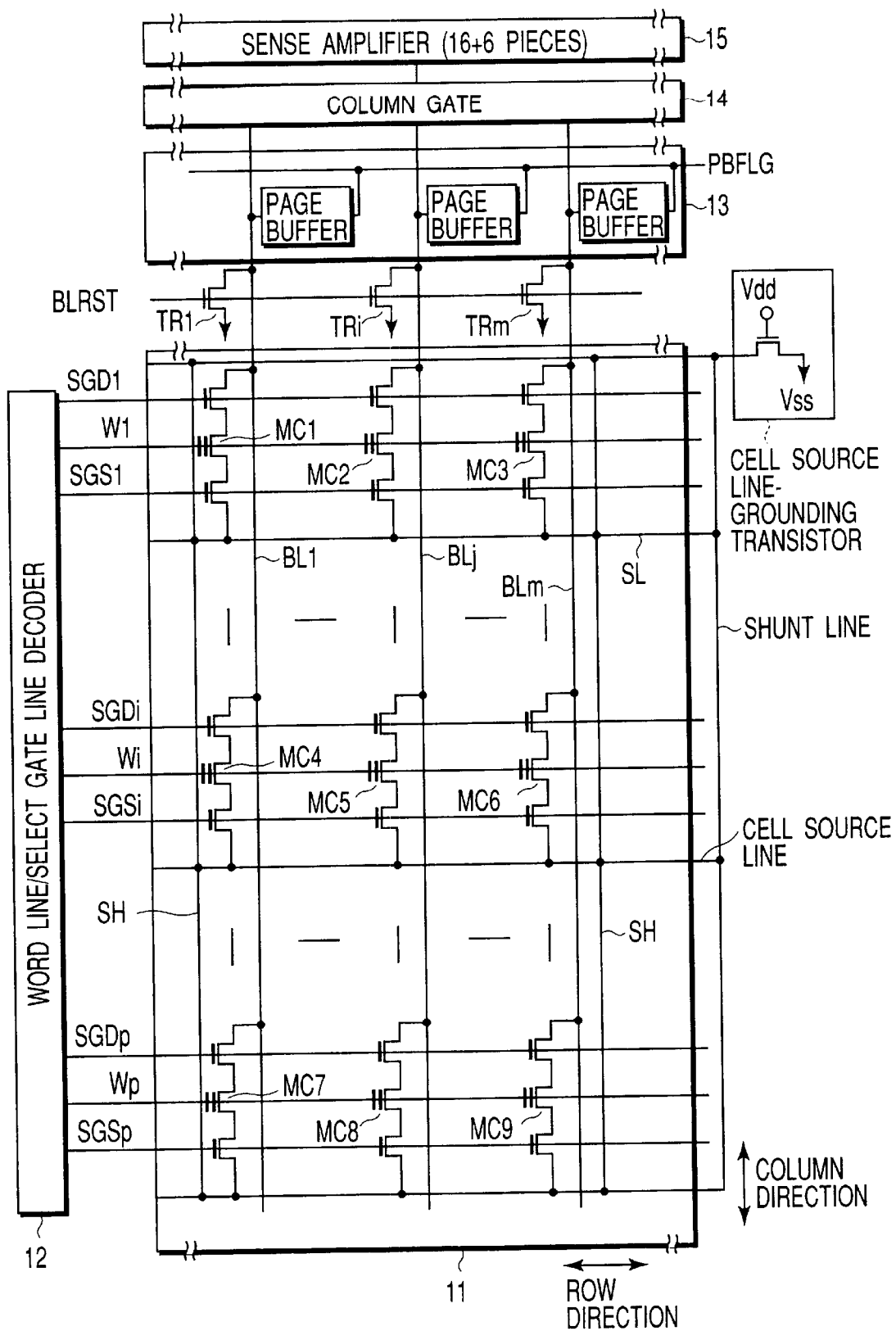
FIG. 2 is a view showing the memory cell array of the 3Tr-NAND.

1. A nonvolatile semiconductor memory of the present invention will be described below in detail with reference to the accompanying drawing.

To help understanding of the following description, definitions are made for memory cell data: a memory cell with a positive threshold voltage is defined as a memory cell ("0"-programming cell) for storing "0"-data, and a memory cell with a negative threshold voltage is defined as a memory cell ("1"-programming cell or erase cell) for storing "1"-data.

The present invention is applied to a nonvolatile semiconductor memory having a page buffer for temporarily storing data and a sense amplifier for determining the data value of a memory cell in the data read. For the sake of simplicity, a case wherein the present invention is applied to a 3Tr-NAND will be described below.

2. 3Tr-NAND

A 3Tr-NAND will be described first.

2.-1. Overall Arrangement

FIG. 1 is a block diagram showing main part of a 3Tr-NAND to which the present invention is applied.

In this example, a 3Tr-NAND having a memory capacity of 32 kbytes will be described.

A memory cell array 11 is formed from an array of a plurality of cell units. Each cell unit is formed from one memory cell and two select gate transistors respectively connected to the two terminals of the memory cell. Details of the cell unit will be described later.

The memory cell array 11 has an area (data area) for storing data and an area (parity bit area) for storing a parity bit for error correction. On the memory cell array 11, 512 word lines WL running in the row direction and 704 bit lines BL running in the column direction are arranged. Of the 704 bit lines BL, 512 bit lines BL are arranged in the data area, and 192 bit lines BL are arranged in the parity bit area.

In the data area of the memory cell array 11, memory cells corresponding to 32 kbytes are arranged in the intersections of the 512 word lines WL and 512 bit lines BL. In this example, since 512 memory cells in the data area are connected to one word line WL, one page has 64 bytes (512 bits). In the 3Tr-NAND, since only one memory cell is arranged in one cell unit, one block also has 64 bytes (=32 words: 1 word=16 bits).

The data rewrite (change) can be done in units of, e.g., pages or bytes. The data erase can be done in units of blocks (32 words).

A word line/select gate line decoder (or word line/select gate line driver) 12 is arranged at the row-direction end of the memory cell array 11. The 512 word lines WL running in the row direction are connected to the word line decoder in the word line/select gate line decoder 12.

The 512 bit lines BL in the data area of the memory cell array 11 are divided into 16 groups. Each group is formed from 32 bit lines BL. The 912 bit lines BL in the parity bit area of the memory cell array 11 are divided into six groups. Each group is formed from 32 bit lines BL.

At the column-direction end of the memory cell array 11, 704 page buffers 13 are arranged. The 704 page buffers 13 correspond to the 704 bit lines BL arranged on the memory cell array 11. Each page buffer 13 includes, e.g., one latch circuit.

Twenty-two (=16+6) sense amplifiers 15 are provided in correspondence with the 16 groups in the data area of the memory cell array 11 and the six groups in the parity bit area. A column decoder 16 and column gate 14 select one of 32 bit lines BL in each group.

That is, the data read is executed in units of 16 bits (=one word) smaller than one page (=32 words). In this example, in the data read, 16-bit data is read out from the data area of the memory cell array 11, and simultaneously, 6-bit data is read out from the parity bit area of the memory cell array 11 to execute 1-bit error correction (single error correct) and 2-bit error detection (double error detect).

The 22-bit (=16+6 bits) data read out from the memory cell array 11 is input to an error correction circuit 18 through the sense amplifiers 15. The error correction circuit 18 detects on the basis of the 22-bit read data whether the read data contains an error, and if an error is detected, the error is corrected and then the 16-bit read data is output to an I/O buffer 19.

The 16-bit read data is output from 16 data input/output terminals I/O·0, I/O·1, . . . , I/O·15.

A 14-bit address signal is input to the word line/select gate line decoder 12 and column decoder 16 through address input terminals A0, A1, . . . , A13 and address buffer 20. More specifically, the lower five bits A0, A1, . . . , A4 of the address signal are input to the column decoder 16, and the upper nine bits A5, A6, . . . , A13 of the address signal are input to the word line decoder (row decoder) of the word line/select gate line decoder 12.

A control circuit 21 controls memory operation on the basis of a chip enable signal /CE, output enable signal /OE, and write enable signal /WE. For example, the control circuit 21 controls the sense amplifiers 15 to the operative state in the data read.

A parity bit generator 22 adds 6-bit data (parity bits) to the 16-bit program data input from the data input/output terminals I/O·0, I/O·1, . . . , I/O·15 to execute 1-bit error correction and 2-bit error detection. The 22-bit (16+6 bits) data is temporarily stored in the page buffers (latch circuit) 13 and then programmed in a selected memory cell.

2.-2. Memory Cell Array

Figure 3:
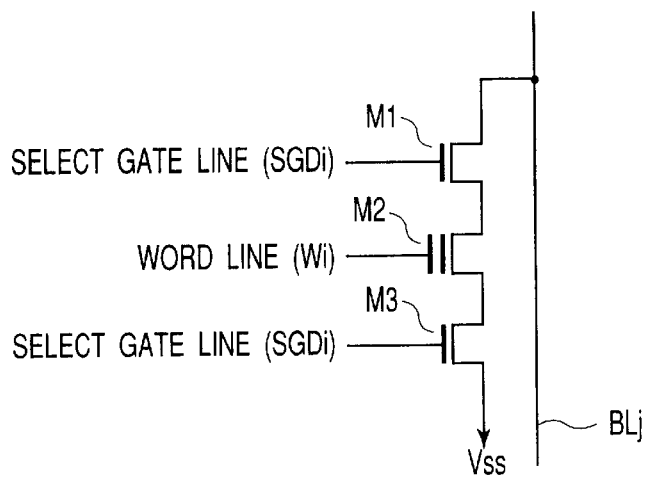
FIG. 3 is a view showing the memory cell unit of the 3Tr-NAND.

FIG. 2 is a view showing the memory cell array. FIG. 3 is a view showing a cell unit of the memory cell array.

In the 3Tr-NAND, each cell unit in the memory cell array 11 is constructed by three transistors, i.e., one memory cell M2 and two select transistors M1 and M3 which sandwich the memory cell.

The memory cell M2 has, e.g., a stacked gate structure having a floating gate electrode and control gate electrode. Each of the select transistors M1 and M3 has, e.g., a structure similar to the stacked gate structure. However, each select transistor functions as a normal MOS transistor by using a lower gate as an actual gate electrode.

One terminal of a cell unit is connected to one of bit lines BL1, . . . , BLj, . . . , BLm, and the other terminal is connected to a cell source line SL. The bit lines BL1, . . . , BLj, . . . , BLm are connected to the sense amplifiers 15 through the page buffers 13 and column gate 14.

The page buffers 13 are provided in correspondence with the bit lines BL1, . . . , BLj, . . . , BLm, and each page buffer has a latch circuit (page latch) LATCH. The latch circuit LATCH has a function of temporarily storing program data in, e.g., program operation.

The page buffer 13 has a common node for detecting in the verify operation whether the programming or erasing has been correctly executed. A batch detection signal PBFLG is output from the common node. The batch detection signal PBFLG is input to a batch detecting circuit (to be described later in detail). The batch detecting circuit detects whether the programming or erasing has been correctly executed.

Reset transistors Tr1, . . . , Trj, . . . , Trm are also provided in correspondence with the bit lines BL1, . . . , BLj, . . . , BLm. The reset transistors Tr1, . . . , Trj, . . . , Trm have a function of resetting (to the ground potential) the potential of the bit lines BL1, . . . , BLj, . . . , BLm on the basis of a control signal BLRST in each operation mode.

The cell source lines SL are connected to a cell source line-grounding transistor through shunt lines SH. The cell source line-grounding transistor has a function of setting the cell source lines SL to the ground potential.

A plurality of shunt lines SH are arranged in the memory cell array 11 and run in the column direction, like the bit lines BL1, . . . , BLj, . . . , BLm. When one bit line group in the memory cell array 11, that corresponds to one sense amplifier, includes k (e.g., 32) bit lines, one shunt line SH is preferably arranged for every k bit lines (the values m and k can be either equal or different).

In the data read, all select gate lines SGS1, ..., SGSi, ..., SGSp on the source line side are set to a potential (e.g., about 3.5 V) that turns on the select transistors on the source line side. Of select gate lines SGD1, ..., SGDi, ..., SGDp on the bit line side, a select gate line connected to a cell unit including a selected memory cell is also set to a potential (e.g., about 3.5 V) that turns on the select transistor.

Additionally, for example, of the select gate lines SGD1, ..., SGDi, ..., SGDp on the bit line side, a select gate line which is not connected to a cell unit including a selected memory cell is set to a potential (ground potential) that turns off the select transistors.

In the 3Tr-NAND, all word lines W1, ..., Wi, ..., Wp are set to the ground potential in the data read (only when a memory cell in the "0"-programming state has a positive threshold voltage, and a memory cell in the "1"-programming state has a negative threshold voltage).

2.-3. Structure of Cell Unit

Figure 4:
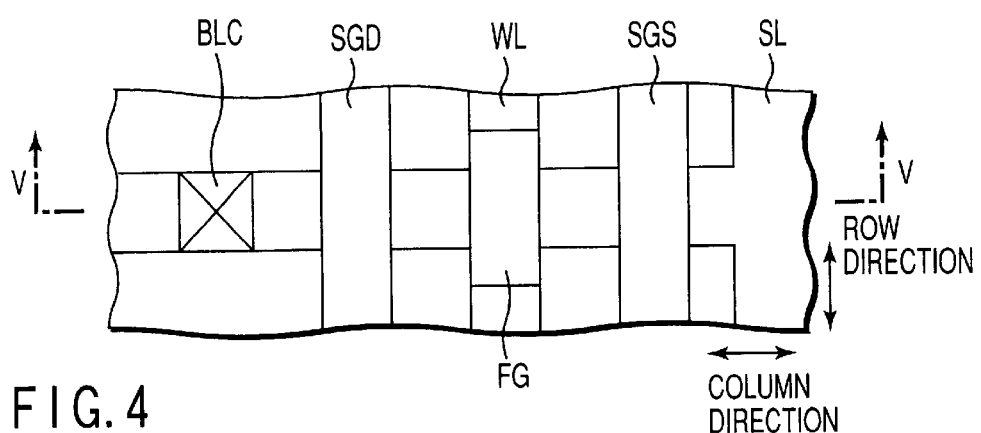
FIG. 4 is a plan view showing the device structure of the 3Tr-NAND.
Figure 5:
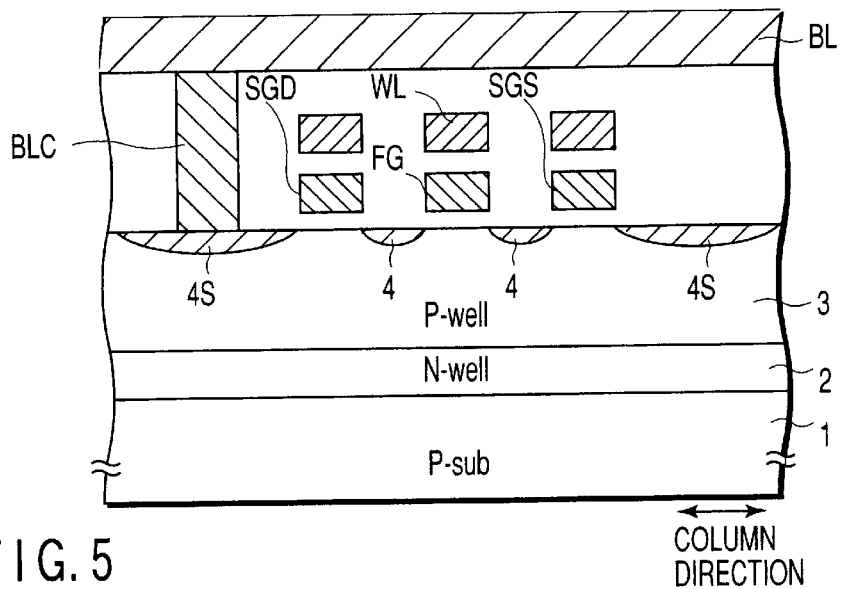
FIG. 5 is a sectional view taken along a line V—V in FIG. 4.

FIG. 4 is a plan view showing one cell unit of the 3Tr-NAND. FIG. 5 is a sectional view taken along a line V—V in FIG. 4.

The cell unit structure of the 3Tr-NAND is the same as or very similar to that of a NAND cell flash memory. However, the cell unit of the 3Tr-NAND is different from that of a NAND cell flash memory in that only one memory cell is arranged between two select transistors.

The detailed structure will be described.

An n-well region (N-well) 2 is formed in the surface region of a p-substrate (P-sub) 1, and a p-well region (P-well) 3 is formed in the n-well region 2.

N-diffusion layers 4, 4D, and 4S are formed in the p-well region 3. A floating gate electrode FG and control gate electrode (word line) CG of a memory cell are formed on the channel between the two n-diffusion layers 4. A gate electrode (select gate line) SGS of a source-side select gate transistor is formed on the channel between the two n-diffusion layers 4 and 4S. A gate electrode (select gate line) SGD of a drain-side select gate transistor is formed on the channel between the two n-diffusion layers 4 and 4D.

A bit line contact portion BLC is formed on the drain diffusion layer 4D of the cell unit. The bit line contact portion BLC is formed from, e.g., a polysilicon plug containing an impurity and buried in a contact hole. The bit line BL running in the column direction is formed on the bit line contact portion BLC.

When electrons are injected into the floating gate electrode FG of the memory cell, and the threshold voltage of the memory cell transistor becomes positive, a "0" state is set. When electrons are removed from the floating gate electrode FG of the memory cell, and the threshold voltage of the memory cell transistor becomes negative, a "1" state is set.

The operation of changing the threshold voltage of a memory cell to a negative value is called an erase operation. The operation of changing the threshold voltage of a memory cell from a negative to a positive value or maintaining the threshold voltage in the negative state is called a program operation. Of the program operation, the operation of changing the threshold voltage of a memory cell from a negative to a positive value is called "0"-programming, and the operation of maintaining the threshold voltage of a memory cell in the negative state is called "1"-programming.

In the program operation, normally, a memory cell to be subjected to the "0"-programming is called a write cell, and a memory cell to be subjected to the "1"-programming is called a write-inhibit cell.

The data write, i.e., "0"-programming is executed by, e.g., setting the potential of the control gate electrode CG of a memory cell to 16 V and the channel potential to 0 V to generate a large potential difference between the channel and the floating gate electrode FG and by flowing a F-N (Fowler-Nordheim) tunneling current from the floating gate electrode FG to the channel.

The data erase is executed by, e.g., setting the potential of the control gate electrode CG of a memory cell to 0 V and the channel potential (potential of the p-well region 3) to 20 V to generate a large potential difference between the channel and the floating gate electrode FG and by flowing a F-N (Fowler-Nordheim) tunneling current from the channel to the floating gate electrode FG.

The write/erase operation using the F-N tunneling current consumes less power than that in a write operation using hot electrons. Hence, a nonvolatile semiconductor memory using this operation is suitable to be used in a system that requires low power consumption.

2.-4. Data Rewrite (Change)

The data rewrite (page unit) in the 3Tr-NAND is executed according to the following procedure.

① Data Load

The address (row address) of a page for which data is to be rewritten is designated, and then, program data (rewrite data) of one page is latched by page buffers (latch circuits).

② Data Erase

Data in memory cells (selected memory cells) of the page for which data is to be rewritten are erased. Consequently, all data in the memory cells of the page for which data is to be rewritten becomes "1" data.

③ Data Programming

The program data in the page buffers are supplied to the channels of the selected memory cells through bit lines. On the other hand, a program potential Vpgm is supplied to the control gate electrodes CG of the selected memory cells.

TABLE 1 shows the cell bias condition of a memory cell in each of the read, program, and erase modes.

TABLE 1

|         | Read    | Program    | Erase     |
|---------|---------|------------|-----------|
| BL      | Data    | Data       | Float     |
| SGD     | Vsg/0 V | 2 V/0 V    | Float     |
| WL      | 0 V     | Vpgm/Float | 0 V/Float |
| SGS     | Vsg     | 0 V        | Float     |
| SL      | 0 V     | 2 V        | Float     |
| P-well  | 0 V     | 0 V        | 22 V      |

Select/non-select
Vsg = 3.5 V, 13 V < Vpgm < 22 V
Float = Floating

In the data read, the potentials of all word lines WL are set to 0 V, and the potentials of the source-side select gate lines SGS in all cell units are set to Vsg (e.g., about 3.5 V). The potentials of the source lines SL and p-well region (P-well) are set to 0 V. The potential of the drain-side select gate line SGD in a cell unit including a selected memory cell is set to Vsg, and the potential of the drain-side select gate line SGD in a cell unit including an unselected memory cell is set to 0 V.

The select gate transistor is turned on when the gate potential is Vsg and off when the gate potential is 0 V.

Hence, only cell units including selected memory cells are electrically connected to the bit lines BL.

The threshold voltage of "0"-programming exceeds 0 V (more specifically, equal to or more than a read potential Vpv in the program verify read), and the threshold voltage of "1"-programming is smaller than 0 V (more specifically, equal to or less than a read potential Vev in the erase verify read).

When the selected memory cell is in the "0" state, the potential of the bit line BL keeps the precharge potential. That is, data DATA (="0") is read out to the bit line BL. On the other hand, when the selected memory cell is in the "1" state, the potential of the bit line BL drops from the precharge potential to the ground potential. That is, data DATA (="1") is read out to the bit line BL.

In data programming, the potential of the bit line BL is, e.g. 0 or 2 V in accordance with the value of the program data (data latched in the page buffer) DATA. That is, when the program data is "0", the potential of the bit line (selected bit line) BL is 0 V, and when the program data is "1", the potential of the bit line (unselected bit line) BL is 2 V.

The potential of a selected word line WL is set to the program potential Vpgm, and an unselected word line WL is set in the floating state. The potentials of the source-side select gate lines SGS in all cell units are set to 0 V. The potential of the source line SL is set to 2 V, and the potential of the p-well region (P-well) is set to 0 V.

The potential of the drain-side select gate line SGD in a cell unit including a selected memory cell is set to 2 V, and the potential of the drain-side select gate line SGD in a cell unit including an unselected memory cell is set to 0 V.

If the selected memory cell is a cell to be subjected to the "0"-programming, the potential of the bit line BL is kept at 0 V. This potential is supplied to the channel of the memory cell through the drain-side select gate line. Since the potential of the control gate electrode (word line WL) of the selected memory cell is Vpgm, and the channel potential is 0 V, an F-N tunneling current flows to the tunnel oxide film (gate oxide film), and electrons are injected into the floating gate electrode FG.

On the other hand, when the selected memory cell is a cell to be subjected to the "1"-programming, the potential of the bit line BL is kept at 2 V. In addition, a channel potential (initial potential) Vini of the memory cell is (2-Vth), and the drain-side select gate transistor is cut off. Vth is the threshold voltage of the drain-side select gate transistor.

When the potential of the control gate electrode (word line WL) of the selected memory cell is set to the program potential Vpgm, the potential of the channel in the floating state rises due to capacitive coupling. That is since no large potential difference is generated between the channel and the floating gate electrode FG of the selected memory cell, no F-N tunneling current flows to the tunnel oxide film (gate oxide film).

Let $\alpha$ be the capacitive coupling ratio (or boot ratio). When the potential of the control gate electrode (word line WL) of the selected memory cell become Vpgm, the channel potential of the selected memory cell is given by $\alpha \times Vpgm$. The potential difference between the channel and the control gate electrode of the selected memory cell is given by $(1-\alpha) \times Vpgm$.

The capacitive coupling ratio $\alpha$ is about 0.6. Hence, the potential difference between the channel and the control gate electrode of a memory cell to be subjected to the "1"-programming is smaller than that in a memory cell to be subjected to the "0"-programming by about 40%. That is, for a memory cell to be subjected to the "1"-programming, "0"-programming is inhibited (erase state is maintained).

In the data erase, the potential of a selected word line WL is set to 0 V, and an unselected word line WL is set in the floating state. All bit lines BL, the source-side select gate lines SGS and drain-side select gate lines SGD in all cell units, and source lines SL are set in the floating state.

When an erase potential of, e.g., about 22 V is applied to the p-well region (P-well), for a memory cell in the selected block (memory cell connected to a selected word line), a large potential difference is generated between the floating gate electrode and the p-well region (P-well), so an F-N tunneling current flows to the tunnel oxide film (gate oxide film), and electrons are removed from the floating gate electrode to the p-well region (P-well).

For a memory cell in an unselected block (memory cell connected to an unselected word line), no large potential difference is generated between the floating gate electrode and the p-well region (P-well), so no F-N tunneling current flows to the tunnel oxide film (gate oxide film). That is, the memory cell state does not change.

2.-5. Verify

After the program operation, it is important to detect whether programming has been properly executed for the memory cell, and if programming is non-sufficient, perform a re-write to program correct data in the memory cell. These series of operations are called a program verify.

After the erase operation, it is important to detect whether the erase has been properly executed for the memory cell, and if the erase is non-sufficient, perform a re-erase to correctly execute the data erase for the memory cell. These series of operations are called an erase verify.

In the 3Tr-NAND or NAND cell flash memory, since overerase poses no problem, unlike a NOR cell flash memory, the erase verify may be omitted (to be described later in detail).

Hence, in the above-described data rewrite operation, the program verify is performed after the program operation.

Several methods are used for verify, and one of the methods is called a bit unit verify.

The bit unit verify is applied to the program verify. As a characteristic feature, the verify is performed in units of memory cells (bits), and the re-write is performed not for a completely programmed memory cell but for only a non-sufficiently programmed memory cell.

When the capacitive coupling ratio $\alpha$ lowers due to, e.g., a process variation, and a program error ("0"-programming) may occur in a memory cell to be subjected to the "1"-programming, the bit unit verify is effectively executed to prevent this program error and also prevent any overwrite (overstress on the tunnel oxide film) for a memory cell to be subjected to the "0"-programming.

The bit unit verify is a verify method already used in a NAND flash memory or NOR flash memory. The outline of the bit unit verify will be described below.

A page buffer for realizing the bit unit verify will be described.

Figure 6:
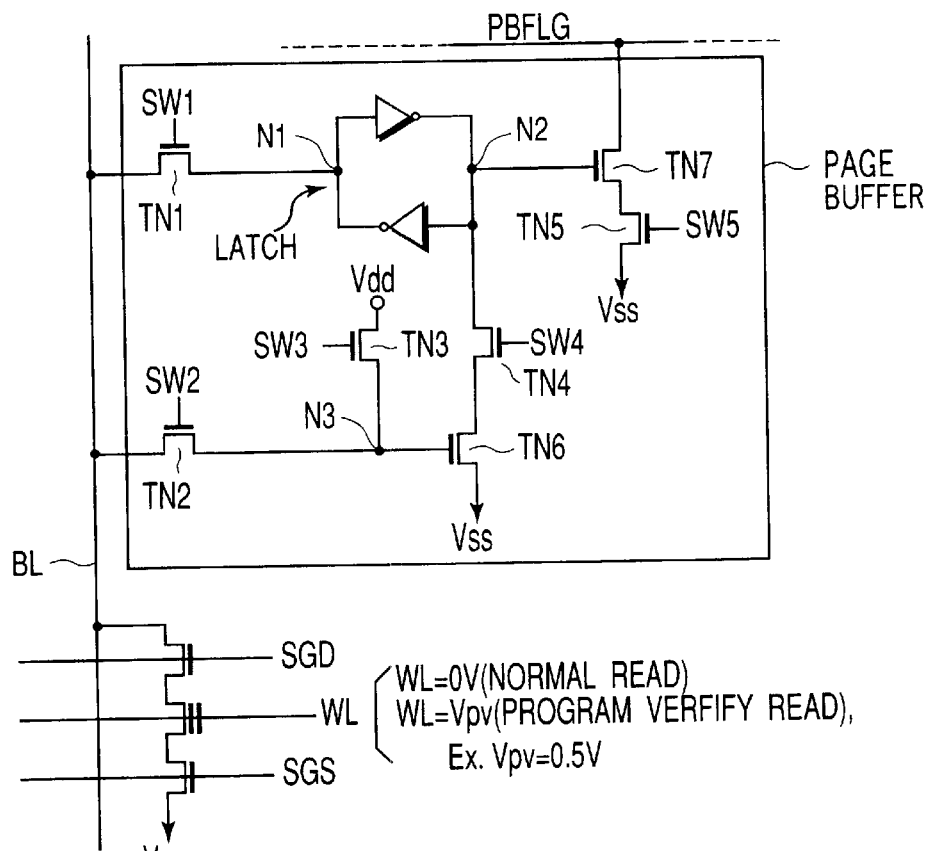
FIG. 6 is a circuit diagram showing a page buffer of the 3Tr-NAND.

FIG. 6 is a circuit diagram showing a page buffer corresponding to one column (bit line). The page buffer shown in FIG. 6 corresponds to the page buffer shown in FIG. 2.

An NMOS transistor TN1 is connected between the bit line BL and a node N1 of the latch circuit LATCH. NMOS transistors TN4 and TN6 are connected in series between ground Vss and a node N2 of the latch circuit LATCH. A control signal SW1 is input to the gate of the transistor TN1, and a control signal SW4 is input to the gate of the transistor TN4.

NMOS transistors TN5 and TN7 are connected in series between the ground Vss and the common node PBFLG for batch detection. A control signal SW5 is input to the gate of the transistor TN5. The gate of the transistor TN7 is connected to the node N2 of the latch circuit LATCH.

An NMOS transistor TN2 is connected between the bit line BL and the gate of the transistor TN6. An NMOS transistor TN3 is connected between a power supply terminal Vdd and the gate of the transistor TN6. A control signal SW2 is input to the gate of the transistor TN2. A control signal SW3 is input to the gate of the transistor TN3.

An internal power supply potential generated in the chip on the basis of an external power supply potential is applied to the power supply terminal Vdd.

In the 3Tr-NAND, the page buffer is used to temporarily store program data in the data programming. In a NAND flash memory, since no sense amplifier ("15" in FIGS. 1 and 2) is present, the page buffer is used to temporarily store program data in the data programming and to sense and amplify read data in the data read.

For the verify, detection of data read out from a memory cell (or data value determination) and batch detection for determining whether programming has been correctly performed for all memory cells in the verify read are done by the above-described page buffer.

Figure 7:
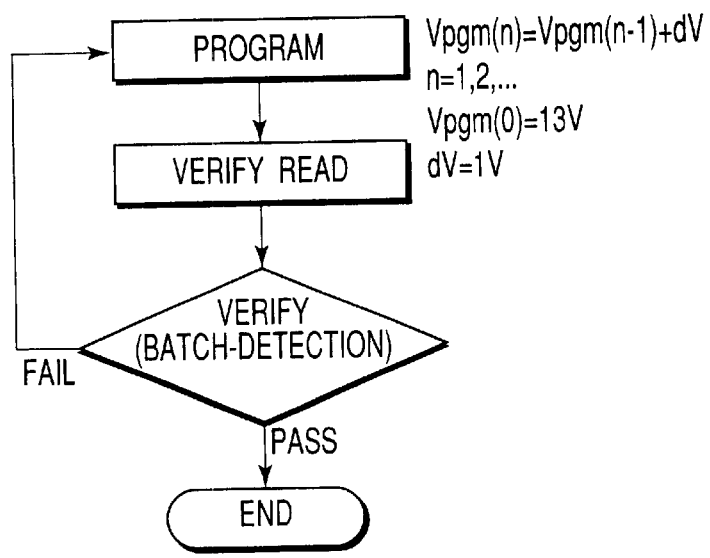
FIG. 7 is a flow chart showing the data rewrite sequence.
Figure 8:
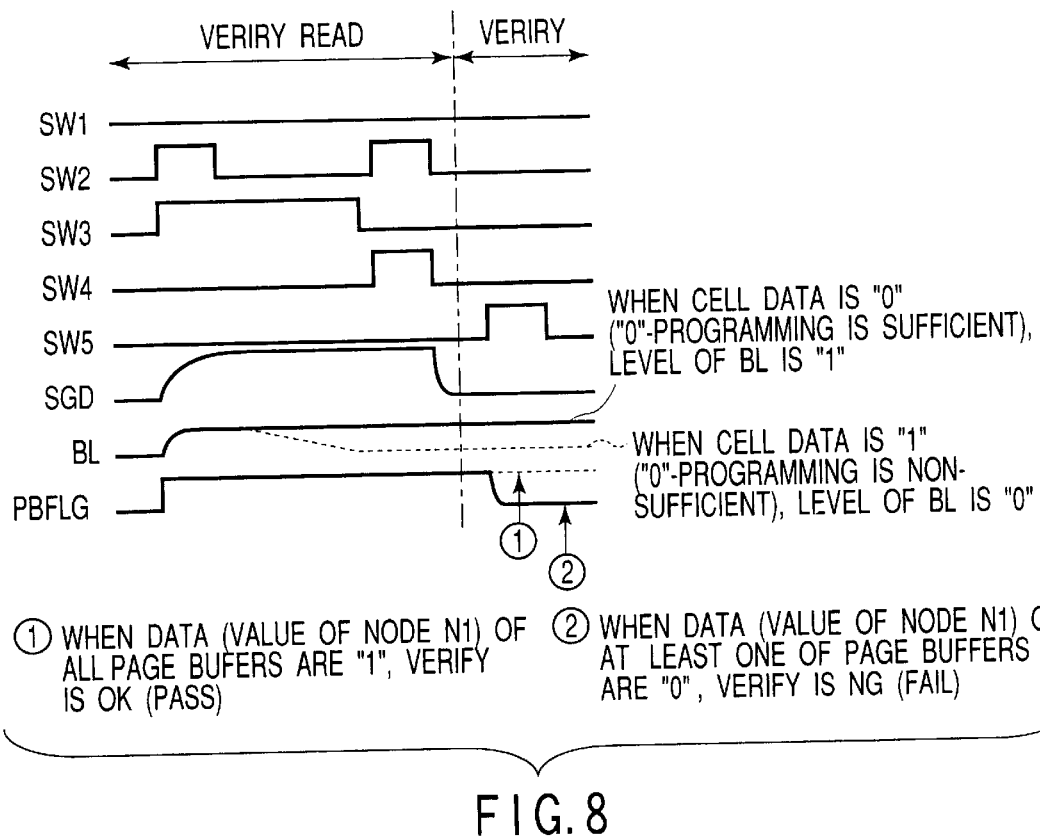
FIG. 8 is a timing chart showing signal waveforms in the verify read and in the verify.
Figure 9:
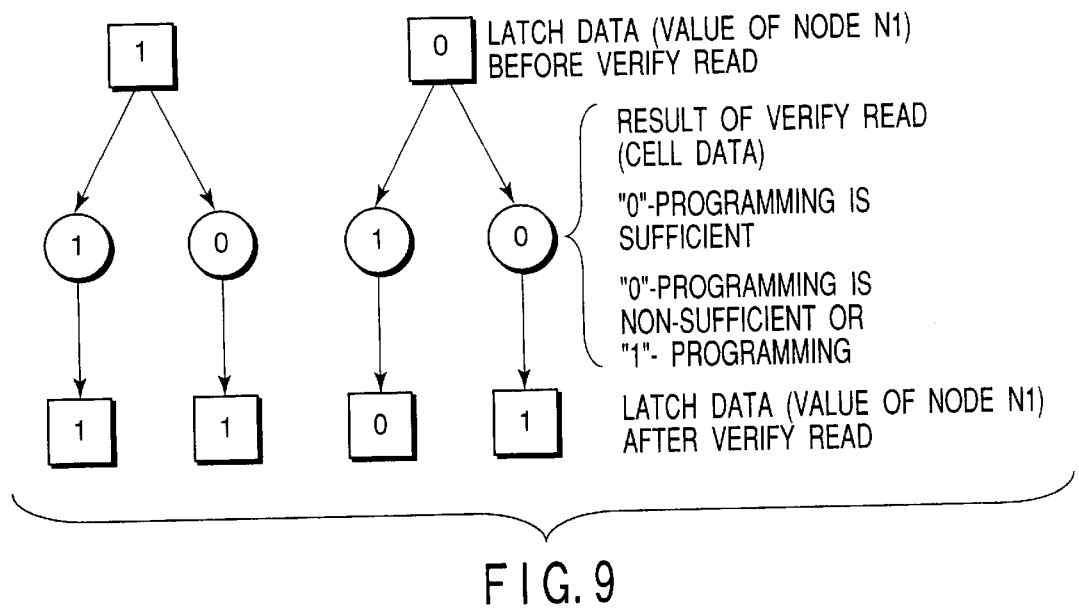
FIG. 9 is a view showing changes in latch data.

FIG. 7 is a flow chart showing the flow of the bit unit verify. FIG. 8 is a waveform chart showing the operation of the page buffer shown in FIG. 6 in the verify read and verify (batch detection). FIG. 9 is a view showing changes in latch data in the page buffer.

As is shown in the flow chart of FIG. 7, the bit unit verify is comprised of the repeat of a series of operations (sequence) of program, verify read, and verify (batch detection). This sequence is repeated in principle until the verify (batch detection) finally passes.

The program potential Vpgm is normally sequentially stepped up from the initial potential Vpgm(0) of, e.g., about 13 V in accordance with the number of times of programming. A step-up amount dV for one cycle of programming is set to, e.g., 1 V. This will be described later in detail.

The operation of the page buffer in the programming and bit unit verify will be described below with reference to FIGS. 6 to 9.

① Program Mode

Program data is transferred from the exterior of the chip to the page buffer. The program data (rewrite data) is latched by the latch circuit LATCH of the page buffer (data load).

For example, when the program data is "1", the node N1 of the latch circuit LATCH is set in the "1" state ("H" level), and the node N2 is set in the "0" state ("L" level). When the program data is "0", the node N1 of the latch circuit LATCH is set in the "0" state ("L" level), and the node N2 is set in the "1" state ("H" level).

After this, the erase operation is executed for the memory cells of, e.g., one page (memory cells in one block) to be programmed so as to set all memory cells of one page in the erase state, i.e., "1" state.

Next, the control signal SW1 is set at "H" level to turn on the transistor TN1, thereby transferring the data latched by the latch circuit LATCH to the bit line BL. That is, when the program data is "1", the node N1 of the latch circuit LATCH is in the "1" state, and therefore, a potential of, e.g., 2 V is transferred to the bit line BL. When the program data is "0", the node N1 of the latch circuit LATCH is in the "0" state, and therefore, a potential of, e.g., 0 V is transferred to the bit line BL.

② Program Verify (Bit Unit Verify) Mode

After the program operation, the control signals SW2 and SW3 are set at "H" level to precharge the bit line BL to the power supply potential Vdd ("H" level, i.e., "1" state).

After this, the program verify read is executed as in the normal data read. That is, the potentials of the source-side select gate lines SGS in all cell units are set to Vsg (e.g., about 3.5 V), and the potentials of the source lines SL and p-well region (P-well) are set to 0 V. In addition, the potential of the drain-side select gate line SGD in each cell unit including the selected memory cell is set to Vsg, and the drain-side select gate line SGD in each cell unit including the unselected memory cell is set to 0 V.

The program verify read is different from the normal data read in the read potential to be applied to the word line WL. In the normal data read, the potential of the word line WL (normal read potential) is set to 0 V. In the program verify read, the potential of the word line WL is set to the positive potential Vpv (e.g., about 0.5 V) to ensure a sufficient margin between the normal read potential and the threshold voltage of the memory cell in the "0" state.

When the threshold voltage of the memory cell exceeds Vpv, the bit line BL keeps the precharge potential ("0"-programming is sufficient). On the other hand, if the threshold voltage of the memory cell is less than Vpv, the potential of the bit line BL gradually drops from the precharge potential to the ground potential ("0"-programming is non-sufficient or "1"-programming is performed).

This change in potential of the bit line BL is detected by the page buffer shown in FIG. 6. That is, while maintaining the potential of the drain-side select gate line SGD in each cell unit including the selected memory cell at Vsg, the control signal SW2 is set at "L" level, and this state is maintained for a predetermined period.

Consequently, when the threshold voltage of the memory cell exceeds Vpv (when "0"-programming is non-sufficient), the bit line BL keeps the precharge potential ("1" state). When the threshold voltage of the memory cell is less than Vpv (when "0"-programming is non-sufficient or "1"-programming is performed), the bit line BL is set to the ground potential ("0" state).

After this, when the control signal SW3 changes to "L" level, and the control signals SW2 and SW4 change to "H" level, the data of the memory cell (data read to the bit line BL) is input to the page buffer.

When "0"-programming for a memory cell is sufficient, and the potential of the bit line BL is in the "1" state ("H" level), the transistor TN6 is turned on. For this reason, the node N2 of the latch circuit LATCH is short-circuited to the ground Vss and set to the ground potential ("0" state). That is, the node N1 of the latch circuit LATCH changes from the "0" state to the "1" state.

When "0"-programming for a memory cell is non-sufficient, and the potential of the bit line BL is in the "0" state ("L" level), the transistor TN6 is turned off. For this reason, the node N2 of the latch circuit LATCH is not short-circuited to the ground Vss and keeps the present state. That is, the node N1 of the latch circuit LATCH is kept in the "0" state in the "0"-programming, and kept in the "1" state in the "1"-programming.

FIG. 9 shows the changes in latch data (value of the node N1) according to the verify result.

When the value of the node N1 of the latch circuit LATCH is "1" ("H" level) (in the "1"-programming), the data in the latch circuit (page latch) LATCH of the page buffer does not change before and after the verify read. That is, the program-inhibit state is always maintained.

To the contrary, when the value of the node N1 of the latch circuit LATCH of the page buffer is "0" ("L" level) (in the "0"-programming), the data in the latch circuit (page latch) LATCH changes or is kept unchanged in accordance with the verify read result.

That is, in the "0"-programming, if it is determined that the "0"-programming is sufficient (the verify read result, i.e., cell data is "0"), the node N1 of the latch circuit LATCH is changed from the "0" state to the "1" state to prevent further "0"-programming.

With this operation, any overwrite in the memory cell is prevented, and any overstress on the tunnel oxide film is prevented (in the 3Tr-NAND, over-programming poses no problem, unlike a NAND cell flash memory, though the stress on the tunnel oxide film can be relaxed by preventing the overwrite).

In the "0"-programming, if it is determined that the "0"-programming is non-sufficient (the verify read result, i.e., cell data is "1"), the node N1 of the latch circuit LATCH is kept in the "0" state to continuously allow "0"-programming (re-write).

As described above, when the verify read is ended, the result is input to the page buffer, and the values of the nodes N1 and N2 of the latch circuit LATCH are determined, batch detection (verify) is executed.

To do batch detection, first, the potential PBFLG of the common node that is common to all page buffers is charged to "H" level. After that, the control signal SW5 changes to "H" level to turn on the transistor TN5. As a result, when the node N1 of the latch circuit LATCH is in the "0" state, and the node N2 is in the "1" state, the transistor TN7 is turned on. When the node N1 of the latch circuit LATCH is in the "1" state, and the node N2 is in the "0" state, the transistor TN7 is turned off.

That is, since the common node is connected to all page buffers, the potential PBFLG of the common node keeps "H" level when the nodes N2 of the latch circuits LATCH in all page buffers are at "0" level. That the potential PBFLG of the common node is at "H" level means that the "0"-programming is sufficient for all "0"-programming cells.

In this case, the program operation is ended.

On the other hand, if the node N2 of the latch circuit LATCH in at least one page buffer is at "1" level, the potential PBFLG of the common node changes from "H" level to "L" level. That the potential PBFLG of the common node is at "L" level means that the "0"-programming is non-sufficient for at least one "0"-programming cell.

In this case, the program potential Vpgm is stepped up, and the program operation is executed again.

The bit unit verify has been described above. When this bit unit verify is applied to the 3Tr-NAND, any program error ("0"-programming) for a "1"-programming cell can be prevented, and stress on the tunnel oxide film of a "0"-programming cell can be relaxed.

That is, the capacitive coupling ratio α changes between the memory cells due to the influence of a process variation or the like. For this reason, the optimum value of the program potential Vpgm (program characteristic) for the "0"-programming also changes between the memory cells.

With the bit unit verify, the "0"-programming can be executed using the program potential Vpgm that is optimized in units of memory cells. In addition, since the program-inhibit state is set after the "0"-programming is sufficiently executed, any stress on the memory cells due to the overwrite can be eliminated.

When the bit unit verify is not used, the program potential Vpgm must be set so high that the programming can be sufficiently performed for a cell that is most difficult to program (cell with poor program characteristic).

To the contrary, when the bit unit verify is used, the programming need not be executed using only a very high program potential Vpgm because the program potential Vpgm optimized in units of memory cells is used. Hence, any program error ("0"-programming) for a "1"-programming cell can be suppressed.

2.-6. Others

In a nonvolatile semiconductor memory having a page buffer for temporarily storing program data and a sense amplifier for sensing and amplifying read data, e.g., 3Tr-NAND described above, in the verify (erase/program verify), the page buffer detects (senses) read data read out from a memory cell by the verify read and determines the data value.

However, in a nonvolatile semiconductor memory having a page buffer and sense amplifier, e.g., 3Tr-NAND, read data detection and data value determination in the normal data read are done by the sense amplifier. If read data detection and data value determination in the verify read are done by the page buffer, different data value determination circuits are used for the normal data read and the verify read.

The sense amplifier and page buffer use different determination levels for "1" and "0". For this reason, if the read data detection and data value determination in the verify read are executed by the page buffer, correct verify cannot be executed. As a result, for example, even when erase/programming is non-sufficient, it may be erroneously determined that erase/programming is sufficient.

3. 3Tr-NAND of Present Invention

The present invention assumes the above-described nonvolatile semiconductor memory having a page buffer (page latch) and sense amplifier, e.g., 3Tr-NAND and aims at correctly determining read data, i.e., a memory cell state (programming is sufficient/non-sufficient) in the verify read (program verify read).

To help understanding, a description will be made below assuming the above-described 3Tr-NAND about a program verify after program operation, which is executed to rewrite (change) data in the 3Tr-NAND. As the program verify, a so-called bit unit verify method is employed.

3.-1. Outline

The outline of the present invention will be described first.

Figure 10:
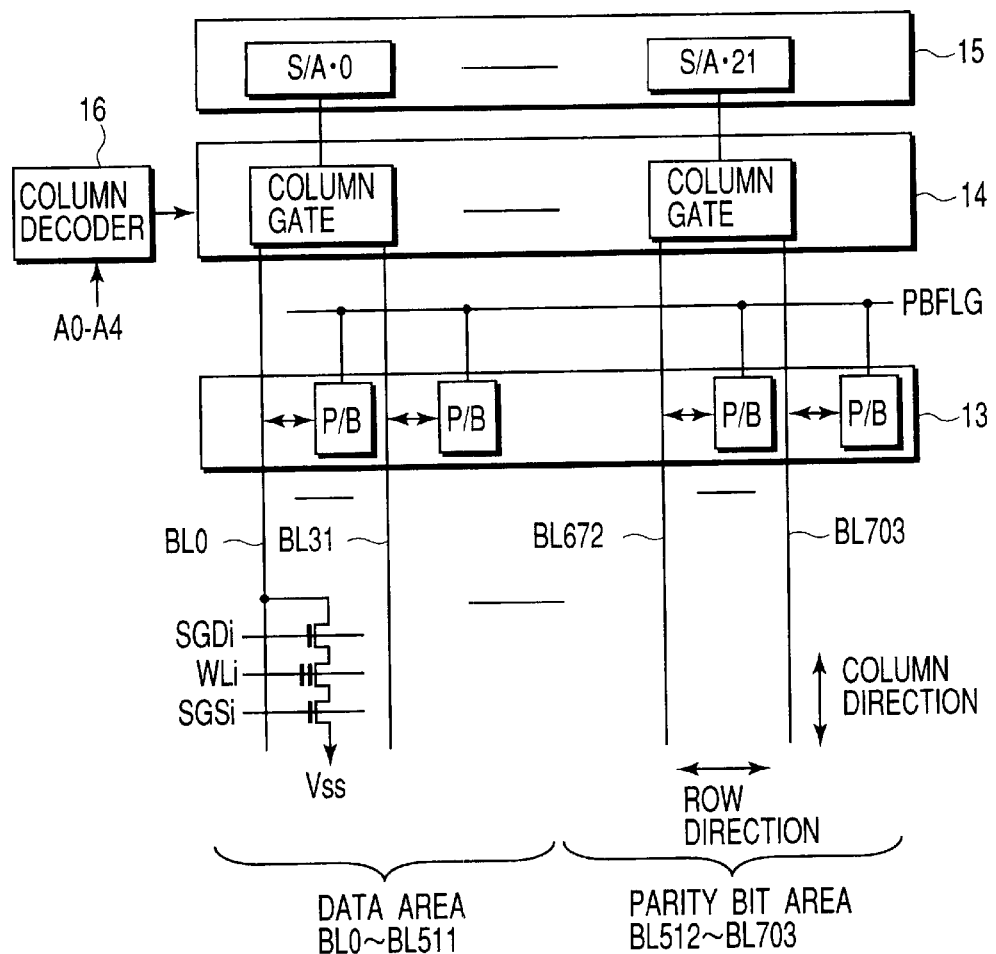
FIG. 10 is a view showing the concept of a 3Tr-NAND according to the present invention.

FIG. 10 is a block diagram showing a main part of a 3Tr-NAND to which the present invention is applied.

FIG. 10 corresponds to the block diagram of FIG. 1, and the same reference numerals as in FIG. 1 denote the same blocks in FIG. 10.

For example, 704 bit lines (columns) BL0 to BL703 are present. Of these bit lines, 512 bit lines BL0 to BL511 are arranged in the data area, and the remaining 192 bit lines BL512 to BL703 are arranged in the parity bit area.

For example, 22 sense amplifiers S/A·0 to S/A·21 are present. Of these sense amplifiers, 16 sense amplifiers S/A·0 to S/A·15 are arranged in correspondence with memory cells in the data area, and the remaining six sense amplifiers S/A·16 to S/A·21 are arranged in correspondence with memory cells in the parity bit area. Thirty-two bit lines are connected to one sense amplifier S/A·k (k=1, . . . , 21) through a column gate.

One page buffer P/B is arranged in correspondence with one bit line BLj (j=0, . . . , 703).

A column decoder 16 selects one of 32 bit lines (columns) corresponding to one sense amplifier S/A·k on the basis of 5-bit column address signals A0 to A4. The selected bit line is electrically connected to one sense amplifier S/A·k through a column gate.

In the circuit shown in FIG. 10, by one cycle of data load operation, program data of 16 bits (one word) and six parity bits are input to the page buffers P/B connected to 22 simultaneously selected bit lines (columns) through sense amplifiers 15. By 32 cycles of data load operation, program data are input to all page buffers P/B. After that, program operation is performed.

In the normal data read, read data are input from 22 bit lines (columns) simultaneously selected in accordance with the column address signals A0 to A4 to the 22 sense amplifiers S/A·0 to S/A·21. Data of 16 bits (one word) are output from 16 sense amplifiers S/A·0 to S/A·15, and six parity bits are output from six sense amplifiers S/A·16 to S/A·21.

In the present invention, in the program verify read, read data of 22 (=16+6) bits are input from 22 bit lines (columns) simultaneously selected in accordance with the column address signals A0 to A4 to the 22 sense amplifiers S/A·0 to S/A·21, and read data detection (sensing) and data value determination are done by the sense amplifiers S/A·0 to S/A·21.

In a nonvolatile semiconductor memory having a page buffer (page latch), such as a NAND flash memory, verify read data detection and data value determination are performed by the page buffer. In the 3Tr-NAND of the present invention, however, verify read data detection and data value determination are done by the sense amplifiers S/A·0 to S/A·21, as in the normal read, although the 3Tr-NAND has the page buffer P/B.

Additionally, in the present invention, the data (verify read results) detected by the sense amplifiers S/A·0 to S/A·21 are input to the page buffers P/B connected to 22 bit lines (which are the same as the 22 bit lines selected in the verify read) simultaneously selected in accordance with the column address signal bits A0 to A4, and the latch data (program data) in each page buffer P/B is changed or kept unchanged in accordance with the verify read result.

The operation of inputting data (verify read results) detected by the sense amplifiers S/A·0 to S/A·21 to the page buffers P/B after the verify read is unique to the present invention. This operation will be referred to as a "verify data-in" hereinafter.

Normally, the number of sense amplifiers S/A·0 to S/A·21 is set smaller than the number of bit lines BL0 to BL703. In this example as well, one sense amplifier S/A·k is provided in correspondence with 32 bit lines.

Hence, to rewrite data of one page (one block), the verify data read and verify data-in after the program operation are executed a plurality of number of times. For example, when one page (one block) is formed from 32 words, as in this example, data of one word (16 bits)+6 bits are read by one cycle of verify read. After the program operation, the verify data read and verify data-in are executed 32 times.

For the verify data-in, data must be transferred from the sense amplifiers S/A·0 to S/A·21 to only the page buffers P/B connected to selected bit lines (columns). At this time, it is important to prevent any influence on latch data in the page buffers P/B connected to unselected bit lines (columns). This will be described later in detail using embodiments.

3.-2. First Embodiment

A nonvolatile semiconductor memory according to the first embodiment of the present invention will be described below in detail.

3.-2.-1. Overall Arrangement

Figure 11:
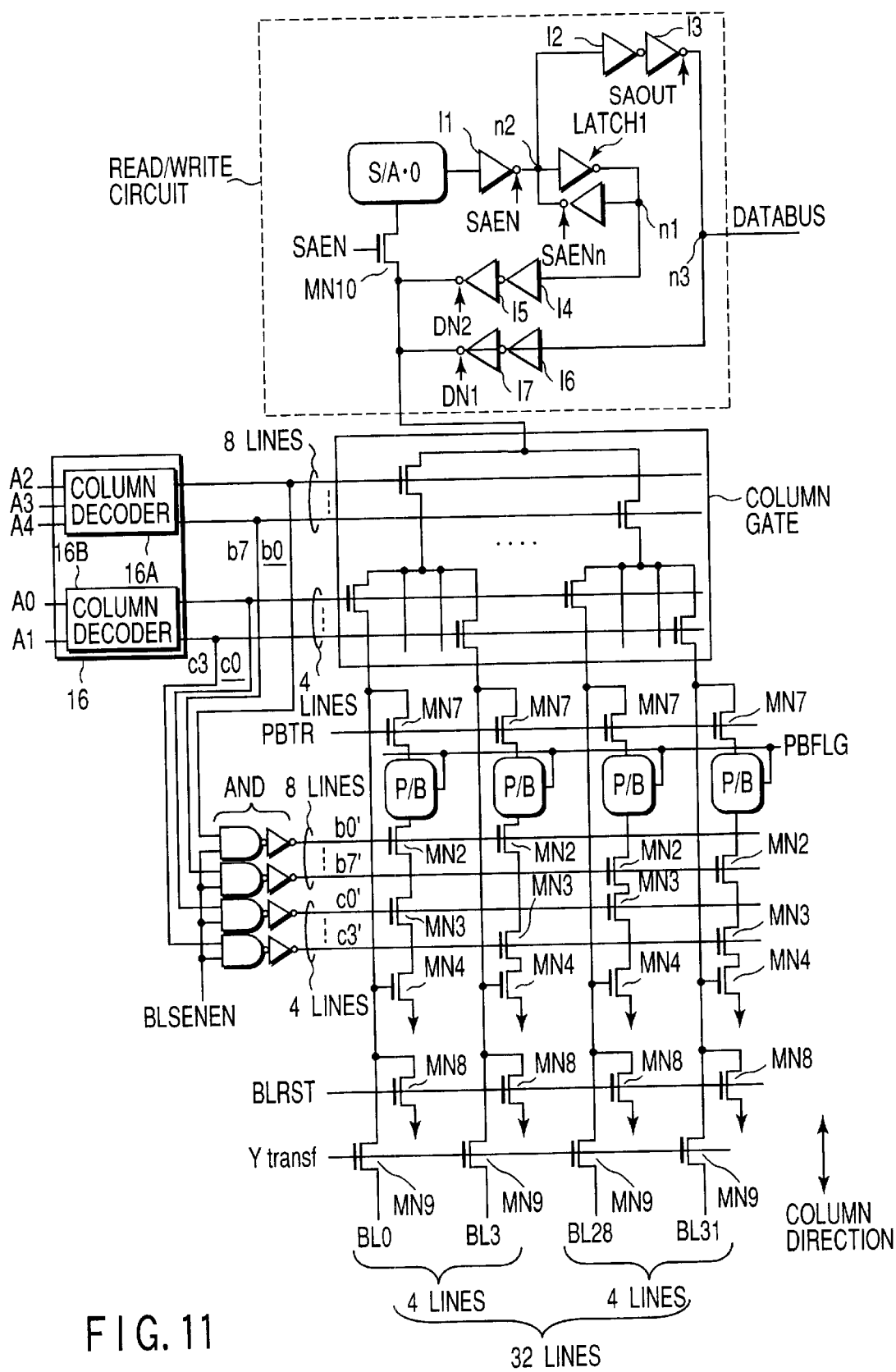
FIG. 11 is a block diagram showing a 3Tr-NAND according to the present invention.

FIG. 11 is a block diagram showing a main part of a 3Tr-NAND according to the present invention.

FIG. 11 corresponds to the block diagram of FIG. 1, and the same reference numerals as in FIG. 1 denote the same blocks in FIG. 11. FIG. 11 shows details of a portion corresponding to one sense amplifier S/A·0 and 32 bit lines (one bit line group) BL0 to BL31 connected to the sense amplifier in FIG. 10. Each of the remaining sense amplifiers S/A·1 to S/A·21 and 32 bit lines connected to the sense amplifier in FIG. 10 also have the same circuit arrangement as in FIG. 11.

The 32 bit lines (bit line group) BL0 to BL31 corresponding to one sense amplifier S/A·0 are formed from eight bit line subgroups each including four bit lines BLj, BLj+1, BLj+2, and BLj+3.

A column decoder 16A selects one of the eight bit line subgroups on the basis of three column address signal bits A2, A3, and A4. More specifically, NMOS transistors that construct the column gate are turned on/off in accordance with the decoding results of the column address signal bits A2, A3, and A4, i.e., column select signal bits b0 to b7, thereby selecting one bit line subgroup.

A column decoder 16B selects one of the four bit lines BLj, BLj+1, BLj+2, and BLj+3 in each bit line subgroup on the basis of two column address signal bits A0 and A1. For example, NMOS transistors that construct the column gate are turned on/off in accordance with the decoding results of the column address signal bits A0 and A1, i.e., column select signal bits c0 to c3, thereby selecting one bit line.

That is, one bit line is electrically connected to the read/write circuit (sense amplifier S/A·0) in accordance with the five column address signal bits A0 to A4.

A bit line clamp NMOS transistor MN9 is connected between the column gate and each of the bit lines BL0 to BL31 to electrically connect/disconnect the bit line to/from the column gate. The transistor MN9 is ON/OFF-controlled by a control signal Ytransf.

A bit line reset NMOS transistor MN8 is connected between ground and each of the bit lines BL0 to BL31. The transistor MN8 has a function of setting the potential of each of the bit lines BL0 to BL31 to a ground potential Vss on the basis of a bit line reset signal BLRST.

An NMOS transistor MN7 is connected between each of the bit lines BL0 to BL31 and a corresponding page buffer P/B and serves as a transfer gate for inputting data to the latch circuit in the page buffer P/B or outputting data from the latch circuit in the page buffer P/B. The transistor MN7 is controlled by a control signal PBTR.

The transistor MN7 is mainly turned on when program data is input from the exterior of the chip to the page buffer P/B, or program data is output from the page buffer P/B to the bit line BLj. In the program verify according to the present invention, the transistor MN7 is always OFF.

NMOS transistors MN2, MN3, and MN4 are connected in series between the page buffer P/B and ground. The gate of the transistor MN4 is connected to the bit line BLj. The transistor MN4 inputs read data (verify result) from the sense amplifier S/A·0 to the page buffer P/B in the verify data-in.

The transistors MN2 and MN3 electrically connect only the selected bit line BLj to the page buffer P/B in the verify data-in. That is, for the 32 bit lines BL0 to BL31 corresponding to one sense amplifier S/A·0, only one bit line BLj selected by the column address signal bits A0 to A4 is electrically connected to the page buffer P/B.

In a mode except the verify data-in, since a control signal BLSENEN is always at "L" level, all signal bits b0' to b7' and c0' to c3' output from an AND circuit AND change to "L" level independently of the values of the column select signal bits b0 to b7 and c0 to c3 output from the column decoder 16.

Only in the verify data-in, since the control signal BLSENEN changes to "H" level, only one bit line BLj is electrically connected to the page buffer P/B on the basis of the output signal bits b0' to b7' and c0' to c3' from the AND circuit AND.

The 32 bit lines BL0 to BL31 are connected to the read/write circuit through the column gate. The read/write circuit includes one sense amplifier S/A·0.

An NMOS transistor MN10 is connected between the sense amplifier S/A·0 and the column gate. The transistor MN10 is ON/OFF-controlled by a control signal (sense amplifier enable signal) SAEN. The control signal SAEN changes to "H" level in the verify read. At this time, the sense amplifier S/A·0 is also simultaneously activated (set in the operative state).

The output node of the sense amplifier S/A·0 is connected to a node n2 of a latch circuit LATCH1 through an inverter I1. The inverter I1 is set in the operative state when the control signal SAEN is at "H" level. When the control signal SAEN is at "H" level, the latch circuit LATCH1 senses the output data from the inverter I1. When the control signal SAEN changes to "L" level, and a control signal SAENn (inverted signal of control signal SAEN) changes to "H" level, the latch circuit LATCH1 latches the output data from the inverter I1.

A node n1 of the latch circuit LATCH1 is connected to the column gate through inverters I4 and I5. The inverter I5 is set in the operative state when a control signal DN2 is at "H" level. In the verify data-in, since the control signal DN2 changes to "H" level, data (verify read result) latched by the latch circuit LATCH1 is input, through the column gate, to the page buffer P/B connected to the selected bit line BLj.

The node n2 of the latch circuit LATCH1 is connected to a node n3 through inverters I2 and I3. The node n3 is connected to a data bus DATABUS. The inverter I3 is set in the operative state when a control signal SAOUT is at "H" level. In the normal data read, since the control signal SAOUT changes to "H" level, read data is output to the data bus DATABUS.

In the verify read according to the present invention, the control signal SAOUT is always at "L" level.

Inverters I6 and I7 are connected between the node n3 and the column gate. The inverter I7 is set in the operative state when a control signal DN1 is at "H" level. In the data load in the program mode, the control signal DN1 changes to "H" level. Hence, the program data is input, through the inverters I6 and I7 and column gate, to the page buffer P/B connected to the selected bit line BLj.

Figure 12:
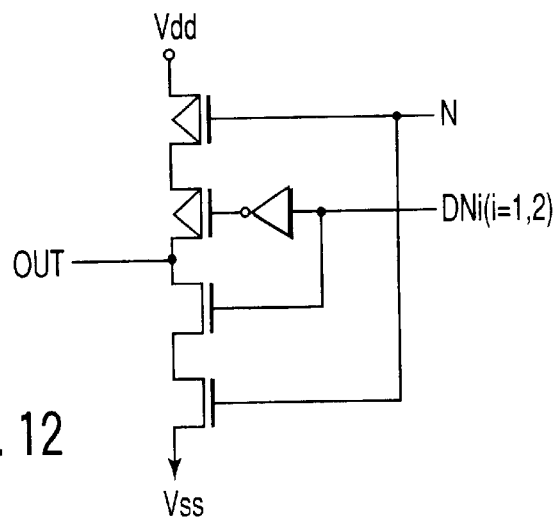
FIG. 12 is a circuit diagram showing inverters I5 and I7 in FIG. 11.

FIG. 12 is a circuit diagram showing the inverters I5 and I7 in FIG. 11.

As is apparent from FIG. 12, when the control signal DNi (i=1 or 2) is at "H" level, an output signal OUT corresponding to an input signal IN is obtained.

Figure 21:
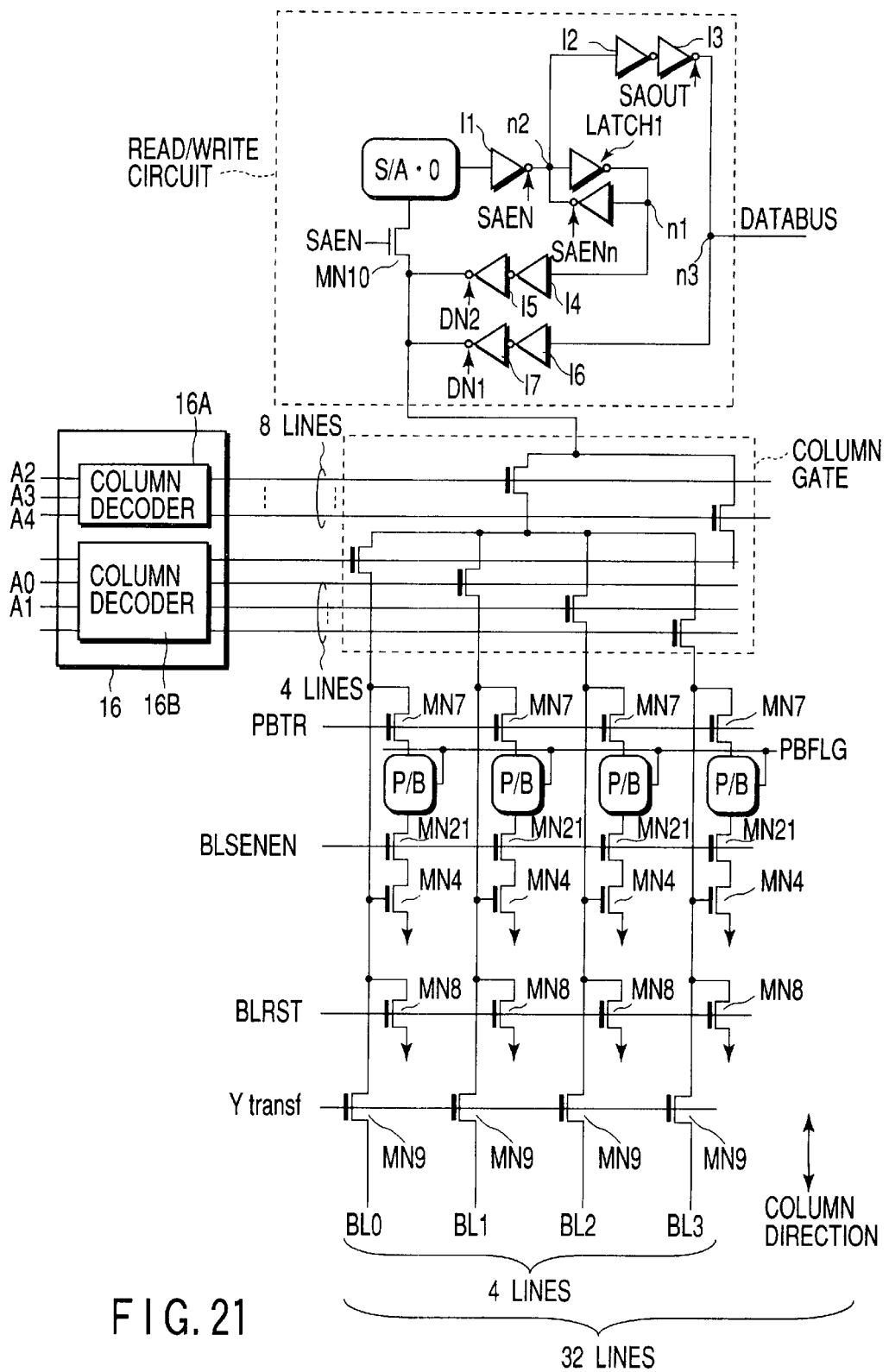
FIG. 21 is a block diagram showing a 3Tr-NAND of the present invention.

The inverters I1 and I3 and the latch inverter in the latch circuit LATCH1 can also have the same circuit arrangement as in FIG. 12. That is, when the control signal DNi in FIG. 21 is changed to the control signals SAEN, SAENn, and SAOUT, the inverters I1 and I3 and the latch inverter in the latch circuit LATCH1 can be obtained.

Figure 13:
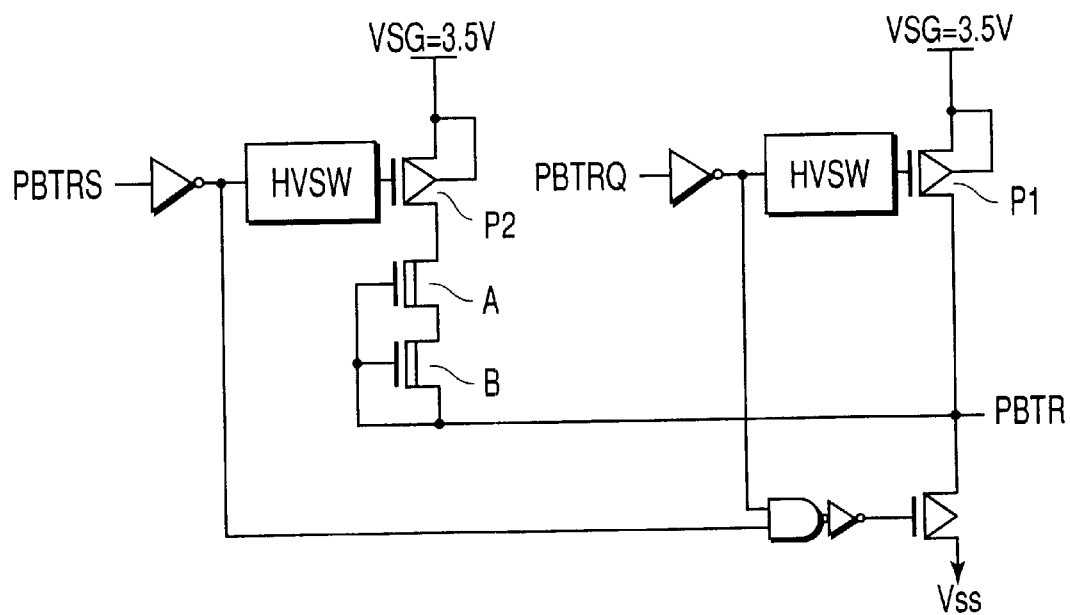
FIG. 13 is a circuit diagram showing a circuit for generating a control signal PBTR in FIG. 11.
Figure 14:
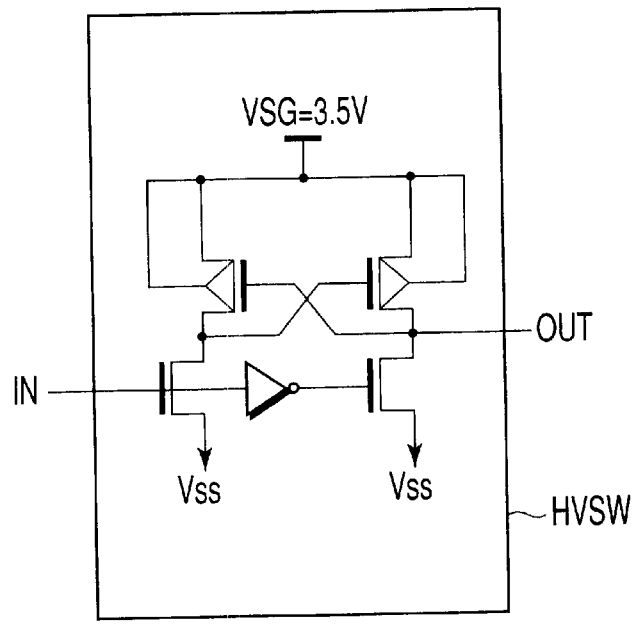
FIG. 14 is a circuit diagram showing the level shifter HVSW in FIG. 13.

FIG. 13 is a circuit diagram showing a circuit for generating the control signal PBTR in FIG. 11. FIG. 14 is a circuit diagram showing a detailed example of a level shifter HVSW in FIG. 13.

The control signal PBTR changes to "H" level (e.g., about 3.5 V) when program data input from the exterior of the chip is to be transferred into the page buffer P/B, or latch data (program data) in the page buffer P/B is to be transferred to the bit line BLj.

In changing the control signal PBTR to "H" level, the latch data in the page buffer P/B must be prevented from being destroyed by so-called charge sharing. To prevent this phenomenon, the potential of the control signal PBTR is slowly changed from "L" level to the "H" level using the circuit shown in FIG. 13 (details will be described later).

3.-2.-2. Page Buffer

The plurality of (e.g., 704) page buffers (page latches) P/B shown in FIG. 11 have the same arrangement. The page buffer P/B connected to the bit line BL0 will be described below.

Figure 15:
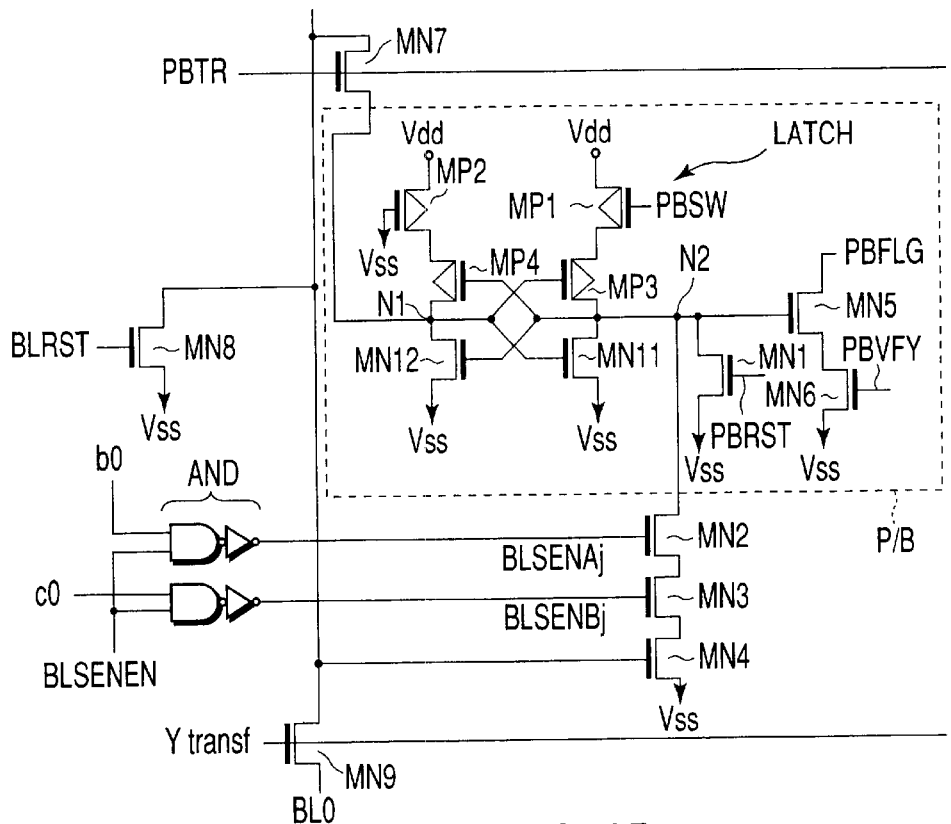
FIG. 15 is a circuit diagram showing details of the page buffer shown in FIG. 11.

FIG. 15 is a circuit diagram showing one page buffer corresponding to one column (bit line BL0).

A latch circuit LATCH is constituted by MOS transistors MP1, MP3, and MN11 connected in series between a power supply terminal Vdd and a ground terminal Vss, and MOS transistors MP2, MP4, and MN12 connected in series between the power supply terminal Vdd and the ground terminal Vss.

The gate of the PMOS transistor MP3 and that of the NMOS transistor MN11 are connected to a node N1, and the gate of the PMOS transistor MP4 and that of the NMOS transistor MN12 are connected to a node N2. A control signal PBSW is input to the gate of the PMOS transistor MP1, and the ground potential is input to the gate of the PMOS transistor MP2.

The NMOS transistor MN7 is connected between the bit line BL and the node N1 of the latch circuit LATCH. The NMOS transistors MN2, MN3, and MN4 are connected in series between the ground terminal Vss and the node N2 of the latch circuit LATCH. A control signal BLSENAi is input to the gate of the transistor MN2, and a control signal BLSENBj is input to the gate of the transistor MN3.

The control signals BLSENAi and BLSENBj change to "H" level when the bit line BL0 connected to this page buffer P/B is selected, and the control signal BLSENEN changes to "H" level to execute the verify data-in.

NMOS transistors MN5 and MN6 are connected in series between the ground terminal Vss and a common node PBFLG for batch detection. A control signal PBVFY is input to the gate of the transistor MN6 and the gate of the transistor MN5 is connected to the node N2 of the latch circuit LATCH. The control signal PBVFY changes to "H" level to execute batch detection to determine whether programming is sufficient or non-sufficient.

An NMOS transistor MN1 is connected between the ground terminal Vss and the node N2 of the latch circuit LATCH. A control signal PBRST is input to the gate of the transistor MN1. The control signal PBRST sets the latch circuit LATCH in the initial state (reset state) in advance in the data load in the program mode.

In the data rewrite (change), the program data is latched by the latch circuit LATCH. For example, when the program data is "0", the node N1 is set in the "0" state ("L" level), and the node N2 is set in "1" state ("H" level). When the program data is "1", the node N1 is set in the "1" state, and the node N2 is set in the "0" state.

In the initial state (when the verify read has not been executed yet), data (latch data) to be latched by the latch circuit LATCH in the page buffer P/B is determined in accordance with program data. When the verify read and verify data-in are executed, the value of the latch data is changed or kept unchanged in accordance with the verify read result.

For example, when the latch data is "1" (when the value of the node N1 is "1"), the value of the latch data is always kept unchanged. That is, the node N1 of the latch circuit LATCH is always in the "1" state, and the node N2 is always in the "0" state.

When the latch data is "0" (when the value of the node N1 is "0"), and the "0"-programming is sufficient (the verify read result is "OK"), the value of the latch data changes from "0" to "1". That is, the node N1 of the latch circuit LATCH is set in the "1" state, and the node N2 is set in the "0" state. If the "0"-programming is non-sufficient (the verify read result is "NG"), the value of the latch data keeps the "0" state. That is, the node N1 of the latch circuit LATCH is in the "0" state, and the node N2 is in the "1" state (FIG. 9).

3.-2.-3. Data Rewrite Operation

A data rewrite (change) operation according to the present invention will be described below in detail using, as an example, a 3Tr-NAND having the block arrangement shown in FIG. 1 and the circuit arrangement shown in FIGS. 11 to 15.

The data rewrite operation comprises three steps: the data load step, data erase step, and data programming step, as described above in Section 2.-4.

The operations of the data load, data erase, and data programming will be described below with reference to the timing chart shown in FIG. 16.

① Data Load

In a 3Tr-NAND having a memory capacity of 32 kbytes, as shown in FIG. 1, for example, the number of word lines (rows) is 512, and the number of bit lines (the total number of columns in the data area and parity bit area) is 704. The bit lines are divided into 22 bit line groups each including 32 bit lines.

Hence, address signals include a 5-bit column address signal (A0 to A4) for selecting one of the 32 bit lines in each bit line group, and a 9-bit row address signal (A5 to A13) for selecting one of the 512 word lines.

In the data load in the data rewrite mode, first, the row address signal bits A5 to A13 are input to select memory cells of one page, i.e., one word line (row) for which the data rewrite is to be executed.

In the data load, to designate the target (memory cells of one page) for which the data rewrite is to be executed, the row address signal bits A5 to A13 are input from the exterior to the interior of the chip. The column address signal bits A0 to A4 are automatically generated by, e.g., an address counter in the chip.

Figure 16:
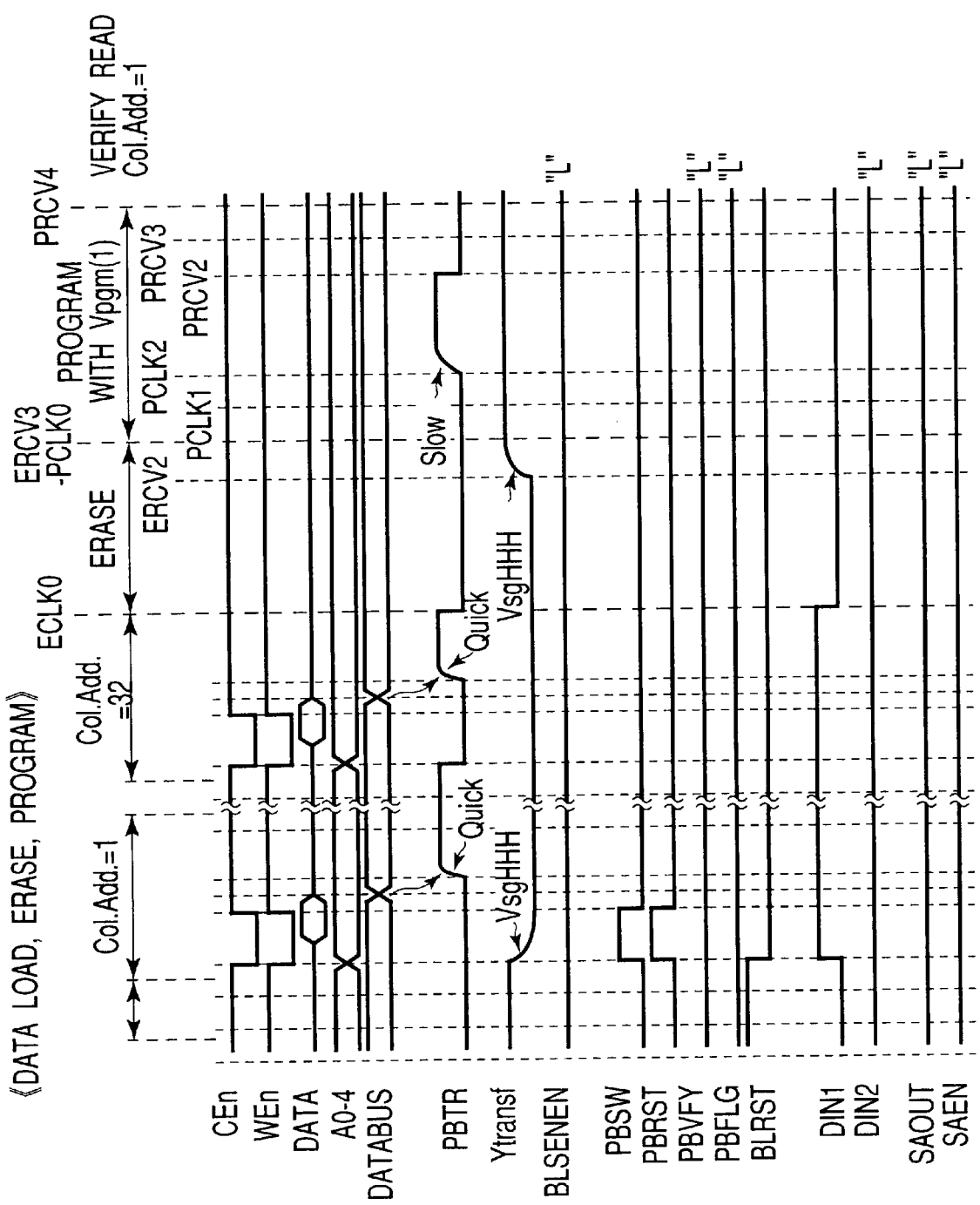
FIG. 16 is a timing chart showing signal waveforms in the data load, erase, and programming of the 3Tr-NAND shown in FIG. 11.

More specifically, a value Col.Add. of the column address signal bits A0 to A4 is sequentially incremented from 1 to 32 (in correspondence with the 32 bit lines), i.e., in the order of 1, 2, 3, . . . , 32 every time a write enable signal WEn falls from "H" level to "L" level, as shown in FIG. 16.

TABLE 2 shows the correspondence between the value Col.Add. of the column address signal bits A2, A3, and A4 and bit lines to be selected by these column address signal bits.

TABLE 2

| Column address Col.Add. | Selected bit lines (columns) |
|---|---|
| 1 | BL0, BL32 . . . , BL672 |
| 2 | BL1, BL33, . . . , BL673 |
| . | |
| . | |
| . | |
| 32 | BL31, BL63, . . . , BL703 |

Program data (rewrite data) of 16 bits (one word) are input from the exterior to the interior of the chip by one cycle of data load. Actually, since six parity bits are added to the 16-bit data in the chip, data of 22 bits are input to the page buffers P/B by one cycle of data load.

Since one page is formed from 32 words, the data load for the page buffers P/B is continuously executed 32 times. The 16-bit program data is input into the chip every time the write enable signal WEn rises from "L" level to "H" level.

The operation of latching the program data (rewrite data) to the latch circuit in each page buffer is performed in the following way (for example, when Col.Add. in FIG. 16=1).

First, the control signals BLRST and Ytransf change to "H" level to reset all the 704 bit lines. After this, the control signals BLRST and Ytransf change from "H" level to "L" level.

In the first cycle of data load (Col.Add.=1), when the write enable signal WEn falls from "H" level to "L" level, the control signals PBSW and PBRST change from "L" level to "H" level. As a result, all the (704) page buffers P/B are reset.

For example, as shown in FIG. 15, when the control signals PBSW and PBRST change to "H" level, the transistor MN1 is turned on, and the transistor MP1 is turned off. The node N1 of the latch circuit LATCH in the page buffer (page latch) P/B is set in the "1" state ("H" level), and the node N2 is set in the "0" state ("L" level). After this, both the control signals PBSW and PBRST change to "L" level.

From the second cycle of data load (Col.Add.=2), the page buffers P/B are not reset.

To reset the page buffer P/B or to execute the verify data-in (to be described later), the control signal PBSW is set at "H" level to turn off the transistor MP1 in the latch circuit LATCH shown in FIG. 15.

The reason for this is as follows. The channel width of each of the NMOS transistors MN1 to MN4 is smaller than that of the PMOS transistor MP1. If the transistor MP1 is ON, the latch data cannot be inverted (for example, the node N2 cannot be changed from "H" level to "L" level). To invert the latch data, the ON current flowing to the transistors MN1 to MN4 must be made larger than that flowing to the transistor MP1.

This means that the channel width (driving force) of each of the NMOS transistors MN1 to MN4 is made larger than the channel width (driving force) of the PMOS transistor MP1. However, when the channel width of each of the transistors MN1 to MN4 is increased, the layout area of the page buffer P/B and its accessories increases, and for example, it is difficult to insert the page buffer P/B between two bit lines.

Setting the control signal PBSW at "H" level and turning off the transistor MP1 in the latch circuit LATCH shown in FIG. 15 in resetting the page buffer P/B mean that the latch data can be inverted even by the transistors MN1 to MN4 each having a small channel width, i.e., the layout area of the page buffer P/B can be reduced.

On the other hand, when a control signal DIN1 changes to "H" level, the program data (rewrite data) is transferred from the data bus DATABUS, through the data read/write circuit and column gate, to the input of the page buffer P/B of the column selected by, e.g., the column address signal bits A0 to A4 (Col.Add.=1).

After this, when the control signal PBTR changes to "H" level, the program data is input to the latch circuit LATCH in the page buffer P/B, as shown in FIGS. 11 and 15.

When the program data is "1", since the node N1 of the latch circuit LATCH in the page buffer P/B is in the "1" state ("H" level), the state of the latch circuit LATCH is kept unchanged. When the program data is "0", since the node N1 of the latch circuit LATCH in the page buffer P/B is set in the "0" state ("L" level), the node N2 of the latch circuit LATCH is set in the "1" ("H" level).

As shown in FIGS. 11 and 15, the control signal PBTR is common to the transistors MN7 of all columns. Hence, during the data load, the control signal Ytransf is set at "L" level to turn off the transistors MN9, thereby electrically disconnecting the input nodes of the page buffers P/B of all columns from the bit lines.

With this operation, from the second cycle of data load, the latch data (value of the node N1) already input to the page buffer P/B by the preceding cycle of data load is prevented from being destroyed by so-called charge sharing (charge sharing of the nodes N1 of the page buffers P/B of unselected columns) when the control signal PBTR changes to "H" level.

During the data load, when the control signal Ytransf is set at "L" level, the input node of the page buffer P/B of each selected column is disconnected from the bit line. For this reason, the bit line having a large capacitance need not be charged by the inverter I7 in the read/write circuit shown in FIG. 11. That is, the inverter I7 needs to charge only the input node of the page buffer P/B having a small capacitance. This contributes to reduced power consumption and high-speed data load.

When the above operation is repeated 32 times (Col.Add.=1, 2, 3, . . . , 32) (for reset of the page buffers P/B, the operation is performed only once), the data load is ended.

② Data Erase

As shown in the timing chart of FIG. 16, after the data load for all page buffers P/B is ended, data of memory cells of one page selected as a target for which the data rewrite is to be performed are erased.

During the erase operation, an erase potential Vee (e.g., about 20 V) for erase is applied to the p-well region that is common to all memory cells and select gate transistors, and the control gate electrodes (word lines) of the memory cells of one selected page are set to 0 V.

At this time, all bit lines, all source- and drain-side select gate lines, source lines, and unselected word lines have been set in the floating state.

During the erase operation, the potentials of all bit lines rise to almost the erase potential Vee due to capacitive coupling. However, during the erase operation, since the control signal Ytransf has been set at "L" level, the page buffers P/B and bit lines are electrically disconnected from each other. That is the high potentials of the bit lines are not transmitted to the page buffers P/B.

Figure 17:
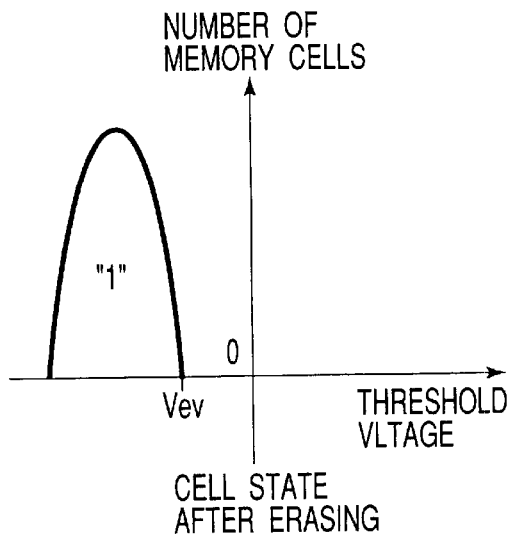
FIG. 17 is a graph showing the memory cell state after erasing.

FIG. 17 is a graph showing the state of memory cells of one selected page after the erase operation.

After the erase operation is ended, the erase verify may be executed to verify whether the erase has been properly executed. In the erase verify read, the read potential is set to Vev (negative potential), and the verify read, verify data-in, and batch detection (verify) according to the present invention are performed. A description of a circuit for the erase verify will be omitted.

In the data erase, data of all memory cells of one selected page are set in the "1" state. For a NOR cell flash memory, it is important to avoid a so-called overerase because each unselected cell must be turned off. In the 3Tr-NAND according to the present invention, since only one memory cell is connected between two select gate transistors, the overerase poses no problem.

Hence, the erase potential Vee may be set relatively high to erase data of all memory cells by one cycle of erase operation, and thus the erase verify may be omitted.

For the 3Tr-NAND, the over-programming also poses no problem, unlike a NAND cell flash memory, as will be described later. However, for the program operation, the operation includes "0"-programming and "1"-programming, and the program verify (bit unit verify) must always be performed to prevent any program error in a "1"-programming cell or to relax stress on the tunnel oxide film of a "0"-programming cell.

③ Data Programming

As shown in the timing chart of FIG. 16, after the erase operation is ended, the control signal Ytransf is set at "H" level (e.g., VsgHHH=about 6 V). At this time, the transistor MN9 shown in FIGS. 11 and 15 is turned on to electrically connect the bit line and page buffer P/B.

After this, when the control signal PBTR is set at "H" level (e.g., about 3.5 V), the transistor MN7 shown in FIGS. 11 and 15 is turned on. Consequently, the latch data (value of the node N1) in each page buffer P/B is transferred to a corresponding bit line through the transistors MN7 and MN9.

For example, when the program data is "0", since the value of the node N1 is in the "0" state ("L" level), the ground potential (data "0") is transferred from the page buffer P/B to the bit line. When the program data is "1", since the value of the node N1 is in the "1" state ("H" level), the internal power supply potential Vdd, e.g., a potential of about 2 V (data "1") is transferred from the page buffer P/B to the bit line.

The potentials (6 V and 3.5 V) of the control signals Ytransf and PBTR are generated by a booster circuit.

In transferring the latch data in the page buffer P/B to the bit line, the control signal PBTR is slowly boosted from "L" level to "H" level, as shown in the timing chart of FIG. 16, to prevent the latch data from being destroyed by so-called charge sharing.

As described above, when the circuit shown in FIGS. 13 and 14 is used, the control signal PBTR can be slowly boosted from "L" level to "H" level.

For the circuit shown in FIGS. 13 and 14, to set the control signal PBTR at "H" level in the data load, a control signal PBTRQ is set at "H" level to supply the control signal PBTR from a PMOS transistor P1 to the output node. At this time, the control signal PBTR quickly rises, as shown in FIG. 16.

To set the control signal PBTR at "H" level in the programming, a control signal PBTRS is set at "H" level to supply the control signal PBTR from a PMOS transistor P2 to the output node. At this time, the control signal PBTR slowly rises, as shown in FIG. 16. This is because depression NMOS transistors A and B act to keep the output current constant.

After the latch data (program data) in the page buffer P/B is transferred to the bit line, a program potential Vpgm is supplied to the selected word line to start data programming.

As in a NAND cell flash memory, the program potential Vpgm is sequentially stepped up by a predetermined step-up amount dV (e.g., 1 V) from the initial value Vpgm(1) as the number of times of programming increases.

Figure 19:
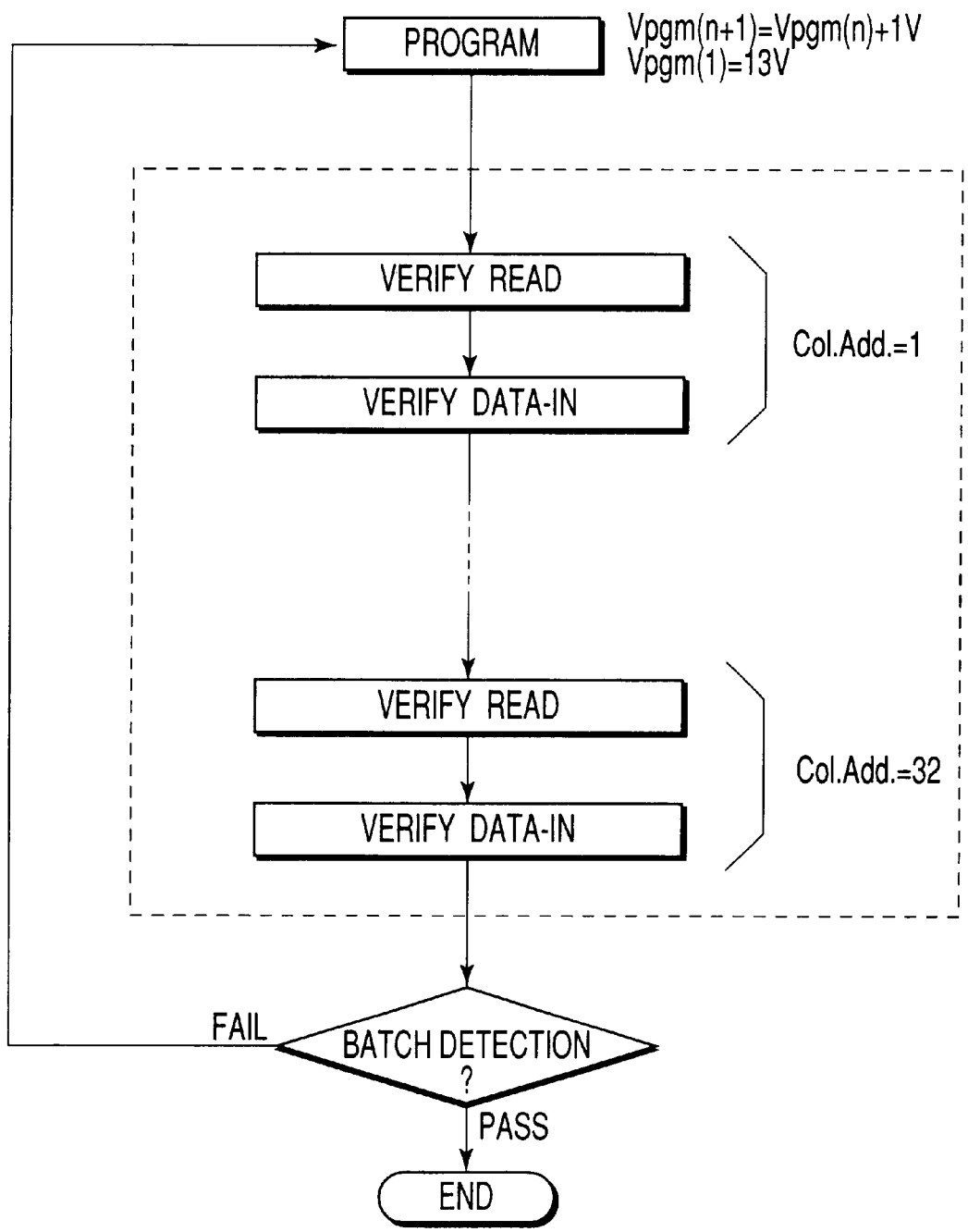
FIG. 19 is a flow chart showing the verify sequence of the 3Tr-NAND shown in FIG. 11.

For example, as shown in FIG. 19, in the first cycle of program operation, the program potential Vpgm(1) is set to 13 V. After this, if it is determined by the verify that the programming is non-sufficient (fail), Vpgm(1)+1 V is used as the program potential Vpgm(2) for the second cycle of program operation. That is, every time the number of times of programming increases, the program potential Vpgm rises by 1 V.

Figure 18:
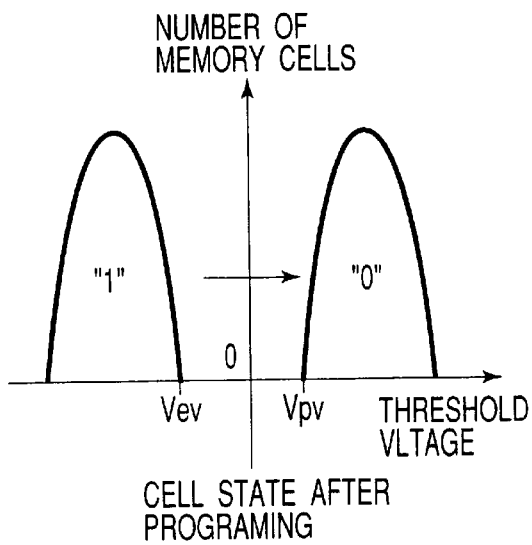
FIG. 18 is a graph showing the memory cell state after programming.

When the programming for all memory cells of one page is ended, these memory cells exhibit threshold voltages as shown in FIG. 18 in accordance with their states ("0" or "1").

The data load, data erase, and data programming in the data rewrite operation have been described above.

In the 3Tr-NAND, after one cycle of program operation is performed, the program verify is executed. The program verify operation according to the present invention will be described below in detail.

3.-2.-4. Program Verify

When one cycle of program operation is ended, the program verify is subsequently performed.

The program verify comprises the steps of verify read, verify data-in, and batch detection (verify), as shown in the flow chart of FIG. 19.

The verify read and verify data-in are continuously executed 32 times (Col.Add.=1, 2, . . . , 32). In one cycle of verify read and verify data-in, memory cells of 16 bits (one word) are simultaneously selected by the column address signal bits A0 to A4.

Figure 20:
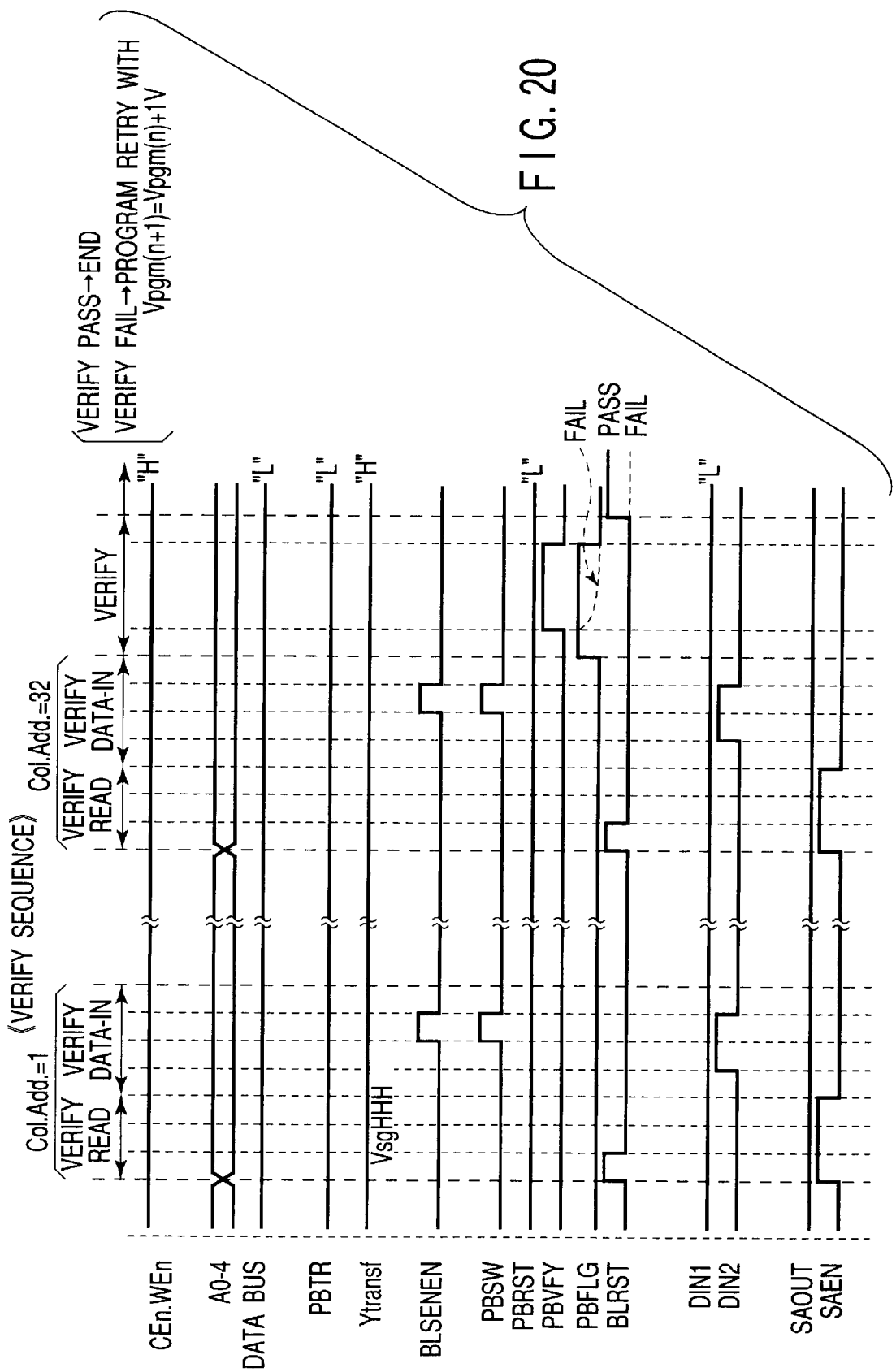
FIG. 20 is a timing chart showing signal waveforms in the verify of the 3Tr-NAND shown in FIG. 11.

FIG. 19 is a flow chart showing the flow of the bit unit verify. FIG. 20 is a timing chart showing the operation of the 3Tr-NAND in the verify data-in and verify (batch detection).

The operation in the bit unit verify according to the present invention will be described below with reference to FIGS. 11, 15, 19, and 20.

① Verify Read

The program verify read is performed as in the normal data read (read potential is 0 V) except a read potential Vpv to be applied to a selected word line is set to a positive potential (e.g., about 0.5 V).

In the normal data read, after read data detection (sensing) and data value determination are done by the sense amplifier in the read/write circuit shown in FIG. 11, the read data is output to the data bus DATABUS. However, in the program verify read, after read data detection (sensing) and data value determination are done by the sense amplifier in the read/write circuit shown in FIG. 11, the read data (verify result) is only latched to the latch circuit LATCH1 in the read/write circuit shown in FIG. 11.

The read potential Vpv in the program verify read is set to the positive potential to ensure a sufficient margin between the read potential (0 V) in the normal data read and the threshold voltage of a memory cell in the "0" state.

Detailed operation will be described.

First, since the control signals BLRST and SAEN change to "H" level, all bit lines are reset to the ground potential Vss, the transistor MN10 in the read/write circuit shown in FIG. 11 is turned on, and the sense amplifier S/A·0 is set in the operative state.

After this, the bit line BL is precharged to the power supply potential Vdd ("H" level, i.e., "1" state) (the precharge circuit is not illustrated in FIG. 11).

The potentials of the source-side select gate lines SGS in all cell units are set to Vsg (e.g., about 3.5 V), and the potentials of source lines SL and p-well region (P-well) are set to 0 V. The potential of the drain-side select gate line SGD in each cell unit including the selected memory cell is set to Vsg, and the drain-side select gate line SGD in each cell unit including the unselected memory cell is set to 0 V.

The potentials of all word lines are set to the read potential Vpv.

As a result, the data of the memory cells of one selected page are read out to the bit lines. Since the control signal Ytransf is set at "H" level (e.g., VsgHHH) in advance, the read data of the memory cells of the selected page are transferred to the input section of the page buffer P/B through the transistor MN9 in FIG. 11.

In the program verify read, since the control signal BLSENEN is at "L" level, the transistors MN2 and MN3 shown in FIGS. 11 and 25 are normally in the OFF state regardless of the values of the column address signal bits A0 to A4 (Col.Add.). The control signal PBTR is also always at "L" level, and the transistor MN7 shown in FIGS. 11 and 15 is also in the OFF state.

Hence, in the program verify read, the read data of the memory cells of the selected page are transferred to the input section of the page buffer P/B but are not input to the page buffer P/B.

When the threshold voltage of the memory cell exceeds Vpv, the bit line BL keeps the precharge potential ("0"-programming is sufficient). On the other hand, if the threshold voltage of the memory cell is less than Vpv, the potential of the bit line BL gradually drops from the precharge potential to the ground potential ("0"-programming is non-sufficient or "1"-programming is performed).

This change in potential of the bit line BL is detected (sensed) by the sense amplifier S/A·0 shown in FIG. 11. However, as shown in FIG. 11, in one bit line group including the 32 bit lines BL0 to BL31, only one bit line is electrically connected to the sense amplifier S/A·0.

In addition, since the control signal SAEN is at "H" level, the read data detected by the sense amplifier S/A·0 is detected by the latch circuit LATCH1 through the inverter I1.

In the program verify read, the control signal SAOUT is set at "L" level, unlike the normal data read. For this reason, the read data (verify read result) is not output to the data bus DATABUS. The read data is not output to the data bus DATABUS because if the read data is output to the data bus DATABUS having a large capacitance, power is wasted.

After that, when the control signal SAEN changes to "L" level, and the control signal SAENn (inverted signal of the control signal SAEN) changes to "H" level, the read data is latched by the latch circuit LATCH1 in the read/write circuit shown in FIG. 11.

② Verify Data-In

When the verify read is ended, the verify data-in is performed.

First, the control signal DIN2 changes to "H" level, the inverter I5 shown in FIG. 11 is set in the operative state, and the read data (verify read result) in the latch circuit LATCH1 is transferred to the bit line selected by the column address signal bits A0 to A4.

The bit line selected in the verify data-in is the same as that selected in the program verify read (bit line electrically connected to the sense amplifier).

After that, when the control signal BLSENEN changes to "H" level, the AND circuit AND shown in FIG. 11 is activated, and only the NMOS transistors MN2 and MN3 corresponding to the selected bit line (column) are turned on. As a consequence, the read data (verify read result) transferred from the latch circuit LATCH1 in the read/write circuit to the bit line is input to the page buffer P/B through the NMOS transistor MN4.

The data (value of the node N2) in the latch circuit LATCH in the page buffer P/B changes in accordance with the verify read result.

For example, when the selected memory cell is a cell to be subjected to "0"-programming, and the "0"-programming is sufficient, the read data, i.e. the gate potential of the transistor MN4 is in the "1" state ("H" level). Since the transistor MN4 is turned on, the node N2 of the latch circuit LATCH is short-circuited to the ground Vss and is set at the ground potential ("0" state). That is, the node N1 of the latch circuit LATCH changes from the "0" state to the "1" state.

When the selected memory cell is a cell to be subjected to "0"-programming, and the "0"-programming is non-sufficient, the read data, i.e. the gate potential of the transistor MN4 is in the "0" state ("L" level). Since the transistor MN4 is turned off, the node N2 of the latch circuit LATCH keeps the "1" state without being short-circuited to the ground Vss. That is, the node N1 of the latch circuit LATCH maintains the "0" state.

When the selected memory cell is a cell to be subjected to "1"-programming, no programming is performed, and the read data, i.e. the gate potential of the transistor MN4 is in the "0" state ("L" level). Since the transistor MN4 is turned off, the node N2 of the latch circuit LATCH keeps the "0" state. That is, the node N1 of the latch circuit LATCH maintains the "1" state.

Hence, when all memory cells to be subjected to the "0"-programming are sufficiently programmed, the nodes N1 of the latch circuits LATCH in all page buffers P/B are set in the "1" state ("H" level), and the nodes N2 are set in the "0" state ("L" level).

FIG. 9 shows such changes in latch data (value of the node N1) according to the verify read result.

That is, in the "0"-programming, if it is determined that the "0"-programming is non-sufficient (the verify read result, i.e., cell data is "1"), the node N1 of the latch circuit LATCH is kept in the "0" state to continuously allow "0"-programming (re-write).

In the verify data-in, the control signal PBSW is set at "H" level. This is because the transistor MP1 is turned off to change the value of the node N2 from the "1" state ("H" level) to the "0" state ("L" level) when the "0"-programming is sufficient, as shown in FIG. 15.

③ Batch Detection (Verify)

After ① verify read and ② verify data-in described above are repeated 32 times (Col.Add.=1, 2, . . . , 32), batch detecting operation is performed to verify whether the programming is completely executed for all memory cells of one selected page.

To do the batch detecting operation, first, the potential PBFLG of the common node of all page buffers P/B is charged to "H" level.

After this, the control signal PBVFY changes to "H" level to turn on the transistor MN6. Consequently, when the node N1 of the latch circuit LATCH is in the "0" state, and the node N2 is in the "1" state, the transistor MN5 is turned on. When the node N1 of the latch circuit LATCH is in the "1" state, and the node N2 is in the "0" state, the transistor MN5 is turned off.

That is, since the common node is connected to all page buffers, the potential PBFLG of the common node maintains "H" level when the nodes N2 of the latch circuits LATCH in all page buffers. That the potential PBFLG of the common node is at "H" level means that the "0"-programming is sufficient for all "0"-programming cells.

In this case, the program operation is ended.

On the other hand, if the node N2 of the latch circuit LATCH in at least one page buffer is at "1" level, the potential PBFLG of the common node changes from "H" level to "L" level. That the potential PBFLG of the common node is at "L" level means that the "0"-programming is non-sufficient for at least one "0"-programming cell.

In this case, the program potential Vpgm is stepped up, and the program operation is executed again.

3.-2.-5. Summary

The program verify operation has been described above. According to the present invention, in the program verify read, read date (verify read result) detection and data value determination are done by the sense amplifier, and the verify read result is input to the page buffer (page latch) P/B to determine the value of the latch data in the page buffer P/B.

Hence, the circuit for detecting read data and determining its value is the sense amplifier for both the normal data read and the verify read. That is, according to the present invention, the read data can be properly determined in the verify read.

In addition, since the bit unit verify method is employed, any overwrite for a "0"-programming cell can be prevented, and overstress on the tunnel oxide film can be prevented. In the 3Tr-NAND, over-programming poses no problem, unlike a NAND cell flash memory, though the overwrite can be prevented by relaxing stress on the tunnel oxide film.

Furthermore, since the program potential Vpgm optimized in units of memory cells can be used, any program error ("0"-programming) for a "1"-programming cell can be suppressed as compared to a case wherein only a very high program potential is used. This effect can be obtained by employing the program potential step-up method together with the bit unit verify method.

3.-3. Second Embodiment

A nonvolatile semiconductor memory according to the second embodiment of the present invention will be described below.

In the above-described first embodiment (FIG. 11), in transferring the verify read result from the read/write circuit to the page buffer P/B of a selected column, the transistors MN2 and MN3 of the selected column are turned on, and the transistors MN2 and MN3 of each unselected column are turned off.

The transistors MN2 and MN3 are ON/OFF-controlled by the control signal BLSENEN for distinguishing between the verify read mode and the verify data-in mode, the output signal bits b0 to b7 and c0 to c3 from the column decoder 16, and the results b0' to b7' and c0' to c3' from the AND logics AND.

In this case, however, 12 signal lines must be prepared on the page buffer P/B to transmit the control signal bits b0' to b7' and c0' to c3' to the gates of the transistors MN2 and MN3, as shown in FIG. 11. This places a burden on the design of the 12 signal lines and transistors MN2 and MN3 and also increases the layout area of the page buffer P/B and its neighboring circuits.

In the second embodiment, a 3Tr-NAND which can decrease the numbers of signal lines and transistors, and can execute the verify read and verify data-in according to the present invention with a simple circuit arrangement will be described.

3.-3.-1. Overall Arrangement

FIG. 21 is a block diagram showing a 3Tr-NAND according to the second embodiment of the present invention. FIG. 22 is a circuit diagram showing details of a page buffer P/B shown in FIG. 21.

FIG. 21 corresponds to the block diagram of FIG. 1, and the same reference numerals as in FIG. 1 denote the same blocks in FIG. 21. FIG. 21 shows details of a portion corresponding to one sense amplifier S/A·0 and 32 bit lines (one bit line group) BL0 to BL31 connected to the sense amplifier in FIG. 10. Each of the remaining sense amplifiers S/A·1 to S/A·21 and 32 bit lines connected to the sense amplifier in FIG. 10 also have the same circuit arrangement as in FIG. 21.

The circuit of this embodiment is different from that of the above-described first embodiment (FIG. 11) only in the connection between the page buffer P/B and the bit line. The remaining portions are the same as in the circuit of the above-described first embodiment.

Hence, the circuit of the second embodiment will be described below only regarding its characteristic portion that is different from the circuit of the above-described first embodiment. A description of the remaining portions, i.e., portions that are the same as in the circuit of the above-described first embodiment will be omitted.

As shown in FIG. 22, a node N2 of a latch circuit LATCH in the page buffer P/B is connected to ground through NMOS transistors MN21 and MN4. A control signal BLSENEN is input to the gate of the transistor MN21. The control signal BLSENEN changes to "L" level in the verify read and to "H" level in the verify data-in.

In the circuit of this embodiment, the circuit arrangement near the page buffer P/B is much simpler than in the circuit according to the above-described first embodiment (FIG. 11). That is, only one signal line to transmit the control signal BLSENEN to the gate of the transistor MN21 is arranged on the page buffer P/B, and therefore, the number of signal lines can be largely reduced as compared to the circuit shown in FIG. 11 (the circuit requires 12 signal lines).

In addition, in the circuit of this embodiment, the number of transistors near the page buffer P/B can also be largely decreased.

Hence, the layout area of the circuit near the page buffer P/B can be reduced, and the verify read and verify data-in according to the present invention can be executed with a very simple circuit arrangement.

In this embodiment, however, the page buffers P/B of all columns are electrically connected to the bit lines in the verify data-in. For this reason, the operation timing must be improved not to vary latch data in the page buffer P/B of an unselected column.

This will be described later in detail together with a program verify operation.

3.-3.-2. Program Verify

The program verify in, e.g., the data rewrite mode will be described. The data rewrite operation has already been described in detail in the first embodiment (Section 3.-2.-3. "Data Rewrite Operation"), and a repetitive description will be omitted here.

After one cycle of a program operation is ended, the program verify is executed.

As in the above-described first embodiment, the program verify comprises the steps of verify read, verify data-in, and batch detection (verify), as shown in the flow chart of FIG. 19.

The verify read and verify data-in are continuously executed 32 times (Col.Add.=1, 2, . . . , 32). In one cycle of verify read and verify data-in, memory cells of 16 bits (one word) are simultaneously selected by column address signal bits A0 to A4.

Figure 23:
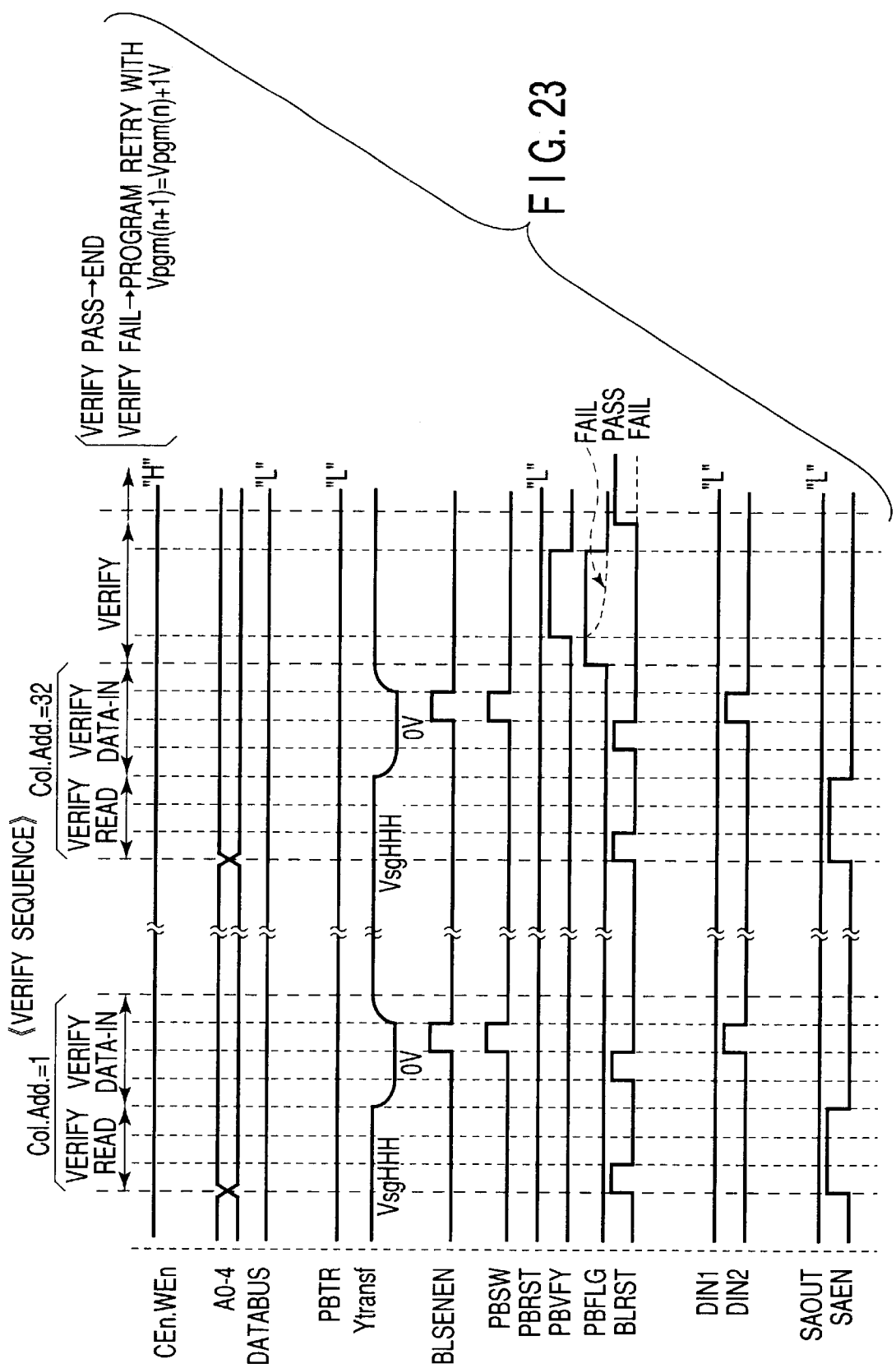
FIG. 23 is a timing chart showing signal waveforms in the verify of the 3Tr-NAND shown in FIG. 21.

FIG. 23 is a waveform chart showing the operation of the 3Tr-NAND in the verify read, verify data-in, and verify (batch detection).

The operation in the bit unit verify according to the present invention will be described below with reference to FIGS. 19, 21, 22, and 23.

① Verify Read

The program verify read is executed as in the normal data read (read potential is 0 V) except a read potential Vpv to be applied to a selected word line is set to a positive potential (e.g., about 0.5 V).

In the normal data read, after read data detection (sensing) and data value determination are done by the sense amplifier in the read/write circuit shown in FIG. 21, the read data is output to a data bus DATABUS. However, in the program verify read, after read data detection (sensing) and data value determination are done by the sense amplifier in the read/write circuit shown in FIG. 21, the read data (verify result) is only latched to a latch circuit LATCH1 in the read/write circuit shown in FIG. 21.

The read potential Vpv in the program verify read is set to the positive potential to ensure a sufficient margin between the read potential (0 V) in the normal data read and the threshold voltage of a memory cell in the "0" state.

Detailed operation will be described.

First, since control signals BLRST and SAEN change to "H" level, all bit lines are reset to ground potential Vss, a transistor MN10 in the read/write circuit shown in FIG. 21 is turned on, and the sense amplifier S/A·0 is set in the operative state.

After this, a bit line BL is precharged to a power supply potential Vdd ("H" level, i.e., "1" state) (the precharge circuit is not illustrated in FIG. 21).

The potentials of source-side select gate lines SGS in all cell units are set to Vsg (e.g., about 3.5 V), and the potentials of source lines SL and p-well region (P-well) are set to 0 V. The potential of drain-side select gate line SGD in each cell unit including the selected memory cell is set to Vsg, and the drain-side select gate line SGD in each cell unit including the unselected memory cell is set to 0 V.

The potentials of all word lines are set to the read potential Vpv.

As a result, the data of the memory cells of one selected page are read out to the bit lines. Since a control signal Ytransf is set at "H" level (e.g., VsgHHH) in advance, the read data of the memory cells of the selected page are transferred to the input section of the page buffer P/B through a transistor MN9 in FIG. 21.

In the program verify read, since the control signal BLSENEN is at "L" level, the transistor MN21 shown in FIGS. 21 and 22 is normally in the OFF state. A control signal PBTR is also always at "L" level, and a transistor MN7 shown in FIGS. 21 and 22 is also in the OFF state.

Hence, in the program verify read, the read data of the memory cells of the selected page are transferred to the input section of the page buffer P/B but are not input to the page buffer P/B.

When the threshold voltage of the memory cell exceeds Vpv, the bit line BL keeps the precharge potential ("0"-programming is sufficient). On the other hand, if the threshold voltage of the memory cell is less than Vpv, the potential of the bit line BL gradually drops from the precharge potential to the ground potential ("0"-programming is non-sufficient or "1"-programming is performed).

This change in potential of the bit line BL is detected (sensed) by the sense amplifier S/A·0 shown in FIG. 21. However, as shown in FIG. 21, in one bit line group including the 32 bit lines BL0 to BL31, only one bit line is electrically connected to the sense amplifier S/A·0.

In addition, since a control signal SAEN is at "H" level, the read data detected by the sense amplifier S/A·0 is detected by the latch circuit LATCH1 through an inverter I1.

In the program verify read, a control signal SAOUT is set at "L" level, unlike the normal data read. For this reason, the read data (verify read result) is not output to the data bus DATABUS. The read data is not output to the data bus DATABUS because if the read data is output to the data bus DATABUS having a large capacitance, power is wasted.

After that, when the control signal SAEN changes to "L" level, and a control signal SAENn (inverted signal of the control signal SAEN) changes to "H" level, the read data is latched by the latch circuit LATCH1 in the read/write circuit shown in FIG. 21.

② Verify Data-In

When the verify read is ended, the verify data-in is performed.

First, since the control signal Ytransf changes from "H" level to "L" level, the transistors MN9 shown in FIG. 21 is turned off. That is, the input nodes of all page buffers P/B and bit lines are electrically disconnected from each other.

This is because when the bit line having a large capacitance is disconnected from the page buffer P/B, any variation in potential of the input node of the page buffer P/B of an unselected column can be prevented in transferring the read data (verify read result) from the latch circuit LATCH1 of the read/write circuit to the page buffer P/B of the selected column.

That is, for example, when the verify read result indicates that the "0"-programming is sufficient, data "1" ("H" level) is transferred from the read/write circuit to the page buffer P/B of the selected column. At this time, to prevent the latch data in the page buffer P/B of each unselected column from varying, the input node of the page buffer P/B must be kept in the "0" state ("L" level).

However, when the capacitance between the input node of the page buffer P/B of the selected column and the input node of the page buffer P/B of the unselected column is large, the input node of the page buffer P/B of the unselected column may vary from the "0" state to the "1" state ("0"-programming is sufficient) due to capacitive coupling, and the latch data of the page buffer P/B of the unselected column may vary.

For this reason, the input nodes of all page buffers P/B and the bit lines are electrically disconnected from each other in advance.

In this embodiment, after the input nodes of all page buffers P/B are electrically disconnected from the bit lines, a control signal BLRST changes to "H" level to reset the input nodes of all page buffers P/B to "L" level.

The input nodes of the page buffers P/B are set at "L" level in the verify data-in because the control signal BLSENEN changes to "H" level to turn on the transistors MN21 of all columns in the verify data-in. That is, for an unselected column, the transistor MN4 shown in FIG. 21 must always be set in the OFF state to prevent any variation in latch data of the page buffer P/B of the unselected column.

After that, a control signal DIN2 changes to "H" level, an inverter I5 shown in FIG. 21 is set in the operative state, and the read data (verify read result) in the latch circuit LATCH1 is transferred to the bit line selected by the column address signal bits A0 to A4.

The bit line selected in the verify data-in is the same as that selected in the program verify read (bit line electrically connected to the sense amplifier).

After that, when the control signal BLSENEN changes to "H" level, all NMOS transistors MN21 shown in FIG. 21 are turned on. As a consequence, the read data (verify read result) transferred from the latch circuit LATCH1 in the read/write circuit to the bit line is input to the page buffer P/B through the NMOS transistor MN4.

At this time, in an unselected column (bit line), since the input node of the page buffer P/B is reset to "L" level, and the capacitance between the input node of the page buffer P/B of the selected column and the input node of the page buffer P/B of the unselected column becomes small, as described above, the latch data in the page buffer P/B of the unselected column does not vary.

FIG. 9 shows such changes in latch data (value of a node N1) according to the verify read result.

In the verify data-in, a control signal PBSW is set at "H" level. This is because a transistor MP1 is turned off to change the value of the node N2 from the "1" state ("H" level) to the "0" state ("L" level) when the "0"-programming is sufficient, as shown in FIG. 22.

③ Batch Detection (Verify)

After ① verify read and ② verify data-in described above are repeated 32 times (Col.Add.=1, 2, . . . , 32), a batch detecting operation is performed to verify whether the programming is completely executed for all memory cells of one selected page.

To do the batch detecting operation, first, a potential PBFLG of the common node of all page buffers P/B is charged to "H" level.

After this, a control signal PBVFY changes to "H" level to turn on a transistor MN6. Consequently, when the node N1 of the latch circuit LATCH is in the "0" state, and the node N2 is in the "1" state, a transistor MN5 is turned on. When the node N1 of the latch circuit LATCH is in the "1" state, and the node N2 is in the "0" state, the transistor MN5 is turned off.

That is, since the common node is connected to all page buffers, the potential PBFLG of the common node maintains "H" level when the nodes N2 of the latch circuits LATCH in all page buffers. That the potential PBFLG of the common node is at "H" level means that the "0"-programming is sufficient for all "0"-programming cells.

In this case, the program operation is ended.

On the other hand, if the node N2 of the latch circuit LATCH in at least one page buffer is at "1" level, the potential PBFLG of the common node changes from "H" level to "L" level. That the potential PBFLG of the common node is at "L" level means that the "0"-programming is non-sufficient for at least one "0"-programming cell.

In this case, a program potential Vpgm is stepped up, and the program operation is executed again.

3.-3.-3. Summary

In the circuit according to the second embodiment, since the number of signal lines and the number of transistors are largely decreased, the layout area of the page buffer P/B becomes small, and the design is facilitated.

In the verify read and verify data-in according to the present invention, the operation timing must be improved, as described above, to, e.g., prevent the latch data of an unselected column from varying. With this operation timing, the level of the control signal Ytransf must be repeatedly changed from "H" to "L" or "L" to "H".

However, the gate of the transistor MN9 to which the control signal Ytransf is input has a large capacitance with respect to the bit line. Hence, that the level of the control signal Ytransf is often changed means that power consumption becomes large.

When the present invention is to be applied to an actual product, whether the first embodiment is to be employed or the second embodiment is to be employed is determined in consideration of the application purpose and the like of the product.

3.-4. Third Embodiment

A nonvolatile semiconductor memory according to the third embodiment of the present invention will be described below in detail.

In the above-described first embodiment (FIG. 11), after one cycle of a program operation is ended, the verify read and verify data-in are repeatedly executed 32 times, and after that, batch detection (verify) is performed.

The reason why the verify read and verify data-in are repeated a plurality of number of times (e.g., 32 times) is that the number of sense amplifiers for detecting and determining read data (verify read result) in the verify is smaller than the number of bit lines. In the 3Tr-NAND according to the above-described first embodiment, for the data area, 16 sense amplifiers (corresponding to one word) are arranged for 512 bit lines. Consequently, to execute the verify for all memory cells of one page (512 bits=32 words), the verify read and verify data-in must be repeated 32 times, as shown in FIG. 19.

In this case, however, batch detection (verify) is performed for all memory cells of one page. For this reason, for example, for 16 memory cells corresponding to at least one predetermined column address of the 32 column addresses (Col.Add.=1, 2, ..., 32), even when batch detection passes ("0"-programming is sufficient), the verify read and verify data-in must always be executed by one cycle for each of the 32 columns, i.e., a total of 32 times until batch detection passes for all memory cells of one page.

For this reason, in the verify method according to the above-described first embodiment, the time required for the verify is sometimes very long.

In the third embodiment, a new verify method is provided in which batch detection for all memory cells of one page is performed, after the verify read and verify data-in are executed for each column address, batch detection is performed for 16 memory cells corresponding to the column address (this will be referred to as "batch detection by column address unit"), and for the memory cells of a column address for which the batch detection by column address unit has passed, further verify read and verify data-in are not executed.

According to this verify method, for memory cells corresponding to a column address for which the batch detection by column address unit has passed, the verify read and verify data-in can be omitted, so the verify time can be shortened.

This verify method is effective when the number of memory cells for which the "0"-programming is non-sufficient is small. Conversely, when the number of memory cells for which the "0"-programming is non-sufficient is large, the verify read and verify data-in must be eventually executed for memory cells corresponding to almost all column addresses, so this method is not effective.

That is, when the number of memory cells for which the "0"-programming is non-sufficient is large, the influence of an increase in number of times of batch detection by column address unit becomes large, resulting in a long verify time. A method of solving this problem will be described later.

3.-4.-1. Overall Arrangement

Figure 24:
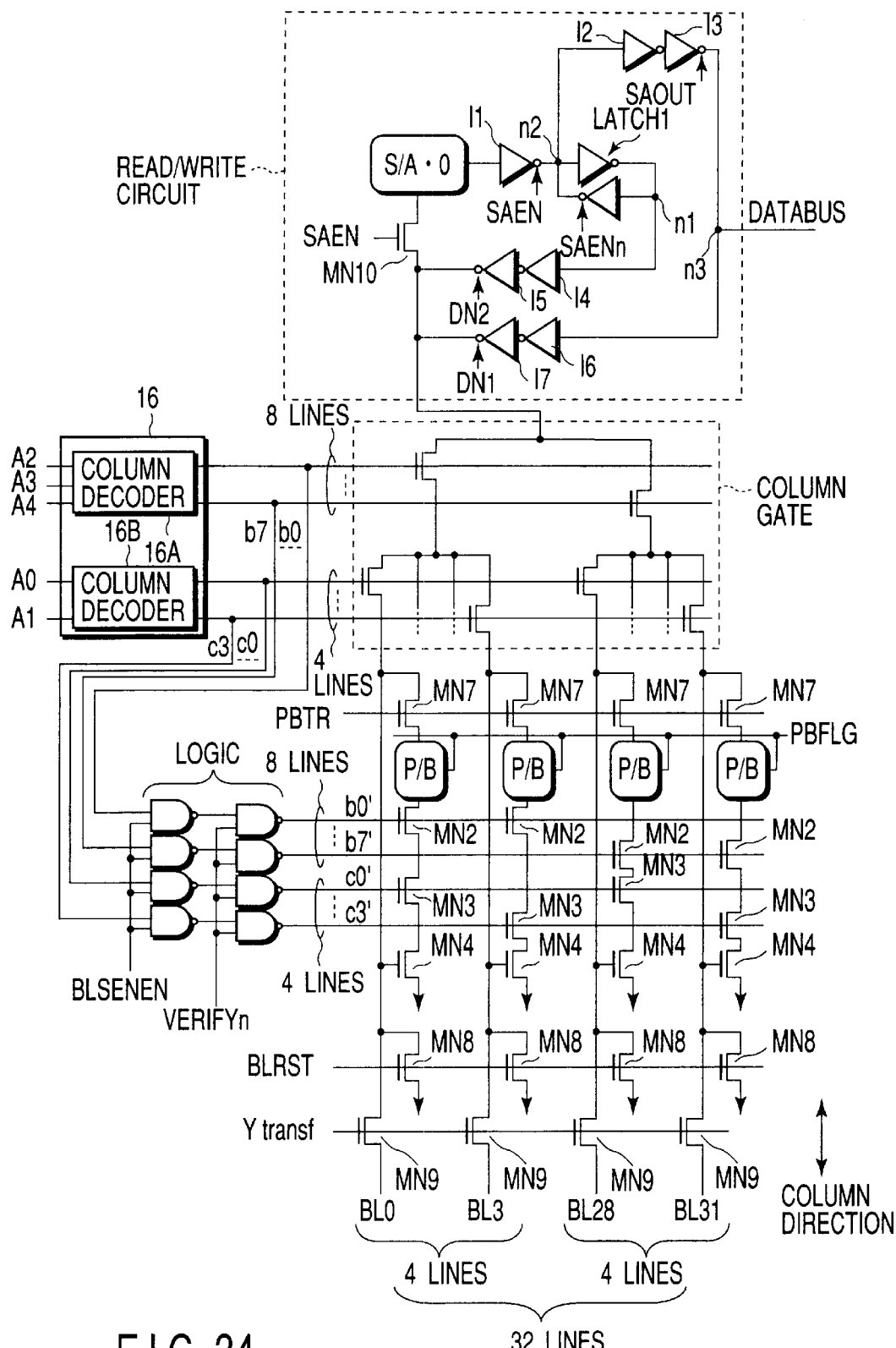
FIG. 24 is a block diagram showing a 3Tr-NAND of the present invention.

FIG. 24 is a block diagram showing a 3Tr-NAND according to the third embodiment of the present invention. FIG. 25 is a circuit diagram showing details of a page buffer P/B shown in FIG. 24.

FIG. 24 corresponds to the block diagram of FIG. 1, and the same reference numerals as in FIG. 1 denote the same blocks in FIG. 24. FIG. 24 shows details of a portion corresponding to one sense amplifier S/A·0 and 32 bit lines (one bit line group) BL0 to BL31 connected to the sense amplifier in FIG. 10. Each of the remaining sense amplifiers S/A·1 to S/A·21 and 32 bit lines connected to the sense amplifier in FIG. 10 also have the same circuit arrangement as in FIG. 24.

The circuit of this embodiment is different from that of the above-described first embodiment (FIG. 11) only in a portion for controlling batch detection in the batch detection mode and in that the electrical connection/disconnection between the page buffer P/B and the bit line is controlled in the verify read and verify data-in. The remaining portions are the same as in the circuit of the above-described first embodiment.

Hence, the circuit of the third embodiment will be described below only about its characteristic portion that is different from the circuit of the above-described first embodiment. A description of the remaining portions, i.e., portions that are the same as in the circuit of the above-described first embodiment will be omitted.

As shown in FIG. 25, a node N2 of a latch circuit LATCH in the page buffer P/B is connected to ground through NMOS transistors MN2, MN3, and MN4. NMOS transistors MN5. MN2', and MN3' are connected in series between ground and the common node for batch detection. A control signal BLSENAi is input to the gates of the transistors MN2 and MN2'. A control signal BLSENBj is input to the gates of the transistors MN3 and MN3'.

The control signals BLSENAi and BLSENBj are generated by a logic circuit LOGIC. The logic circuit LOGIC is a modification of the AND circuit AND related to the first embodiment shown in FIG. 11. The control signals BLSENAi and BLSENBj are generated by control signals BLSENEN and VERIFYn and column select signal bits b0 to b7 and c0 to c3.

Some of signal bits b0' to b7' and c0' to c3' in FIG. 24 are equivalent to the control signals BLSENAi and BLSENBj.

3.-4.-2. Program Verify

The program verify in the data rewrite mode will be described below. The data rewrite operation has already been described in detail in the first embodiment (Section 3.-2.-3. "Data Rewrite Operation"), and a repetitive description will be omitted here.

Figure 26:
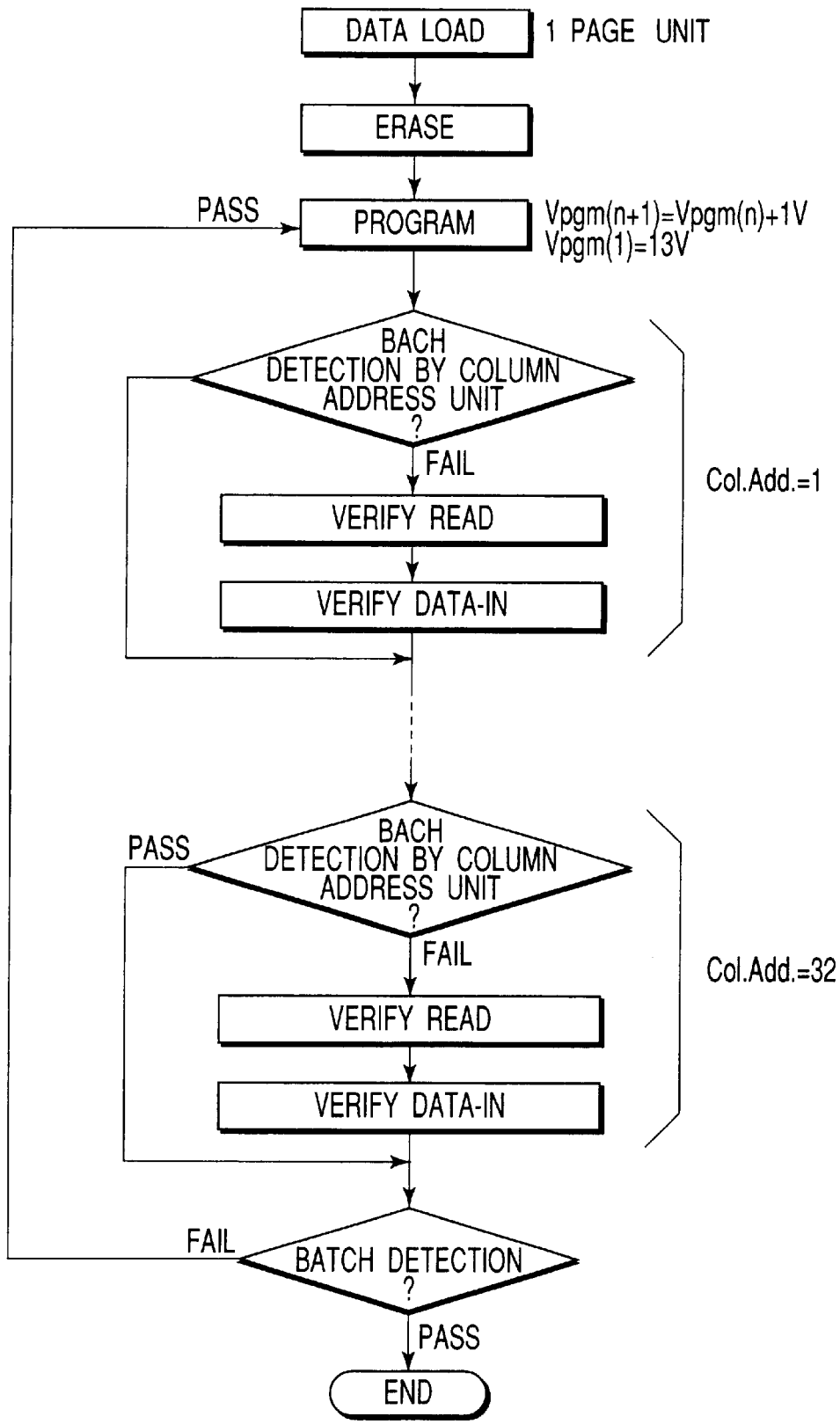
FIG. 26 is a flow chart showing the verify sequence of the 3Tr-NAND shown in FIG. 24.

As shown in FIG. 26, after the data load and erase, the programming step is executed. When one cycle of a program operation is ended, the program verify is executed. The program verify comprises the steps of batch detection by column address unit, verify read, verify data-in, and batch detection.

Batch detection for all memory cells of one page is executed because batch detection by column address unit for 16+6 memory cells corresponding to one column address is executed before the verify read and verify data-in for the 16+6 memory cells.

That is, when batch detection by column address unit passes ("0"-programming is sufficient), the verify read and verify data-in need not be performed for the memory cells of the column address. However, when batch detection by column address unit fails ("0"-programming is non-sufficient), the verify read and verify data-in must be performed for the memory cell of the column address to determine the result of the programming step.

When batch detection by column address unit fails, after the verify read and verify data-in for the memory cells of the column address are performed, batch detection for verifying the verify read result need be executed.

Figure 27:
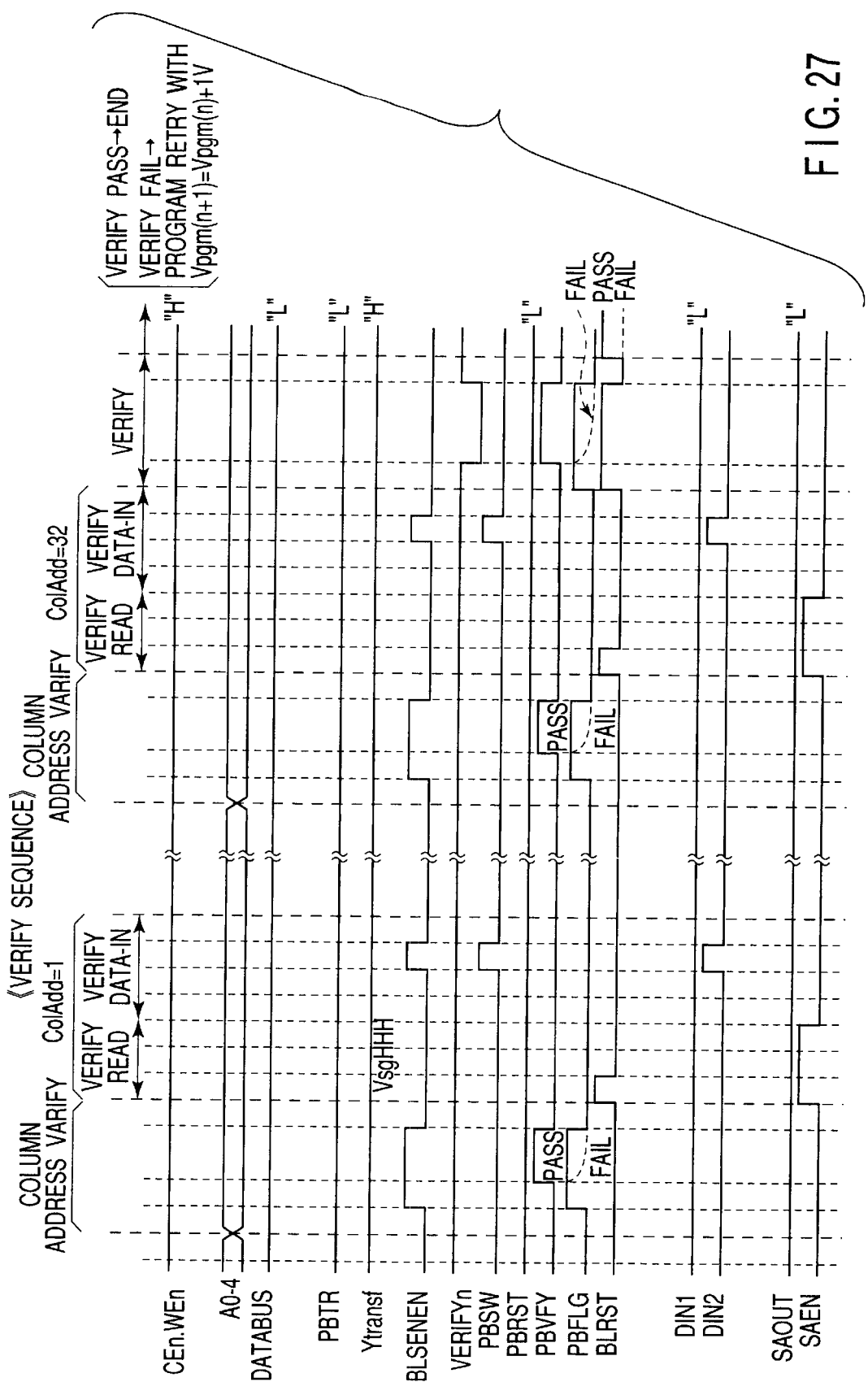
FIG. 27 is a timing chart showing signal waveforms in the verify of the 3Tr-NAND shown in FIG. 24.

FIG. 27 is a timing chart showing the operation of the 3Tr-NAND in the verify read, verify data-in, and verify (batch detection).

① Batch Detection by Column Address Unit

In batch detection by column address unit, the control signals VERIFYn and BLSENEN are set at "H" level. Since the control signals VERIFYn and BLSENEN are at "H" level, the logic circuit LOGIC shown in FIGS. 24 and 25 is activated. More specifically, since a NAND circuit on the output side of the logic circuit LOGIC functions as an inverter, only the control signals BLSENAi and BLSENBj in one column change to "H" level on the basis of the column select signal bits b0 to b7 and c0 to c3.

In each of the (16+6) columns selected by the column select signals, the transistors MN2' and MN3 shown in FIG. 25 are turned on, and in each unselected column, the transistors MN2' and MN3 shown in FIG. 25 are turned off.

That is, batch detection by column address unit can be performed for only the memory cells of the selected column, i.e., 16+6 memory cells corresponding to one column address. For the memory cells of unselected columns, i.e., memory cells corresponding to the remaining column addresses, batch detection by column address unit cannot be performed.

A potential PBFLG of the common node for batch detection, which is common to the page buffers P/B of all columns, is precharged to "H" level.

After this, when a control signal PBVFY changes to "H" level, the potential PBFLG of the common node changes depending on the latch data in the page buffer P/B of the selected column. In the page buffer P/B of an unselected column, since the transistors MN2' and MN3 are OFF, the potential PBFLG of the common node is not affected.

For example, when nodes N2 of the latch circuits LATCH in all page buffers P/B of the selected column are at "0" level, the potential PBFLG of the common node maintains "H" level. That the potential PBFLG of the common node is at "H" level means that the "0"-programming is sufficient for all "0"-programming cells in the selected column.

In this case, the verify read and verify data-in for memory cells corresponding to this column address are omitted, and batch detection by column address unit is performed for memory cells corresponding to the next column address.

If the node N2 of the latch circuit LATCH in at least one page buffer in the selected column is at "1" level, the potential PBFLG of the common node changes from "H" level to "L" level. That the potential PBFLG of the common node is at "L" level means that the "0"-programming is non-sufficient for at least one "0"-programming cell in the selected column.

In this case, the verify read and verify data-in for memory cells corresponding to this column address are executed, and then, batch detection by column address unit is performed for memory cells corresponding to the next column address.

② Verify Read

The program verify read is executed as in the normal data read (read potential is 0 V) except a read potential Vpv to be applied to a selected word line is set to a positive potential (e.g., about 0.5 V).

In the normal data read, after read data detection (sensing) and data value determination are performed by the sense amplifier in the read/write circuit shown in FIG. 24, the read data is output to a data bus DATABUS. However, in the program verify read, after read data detection (sensing) and data value determination are done by the sense amplifier in the read/write circuit shown in FIG. 24, the read data (verify result) is only latched to a latch circuit LATCH1 in the read/write circuit shown in FIG. 24.

The read potential Vpv in the program verify read is set to the positive potential to ensure a sufficient margin between the read potential (0 V) in the normal data read and the threshold voltage of a memory cell in the "0" state.

An operation will be described in detail.

First, since control signals BLRST and SAEN change to "H" level, all bit lines are reset to ground potential Vss, a transistor MN10 in the read/write circuit shown in FIG. 24 is turned on, and the sense amplifier S/A·0 is set in the operative state.

After this, a bit line BL is precharged to a power supply potential Vdd ("H" level, i.e., "1" state) (the precharge circuit is not illustrated in FIG. 24).

The potentials of source-side select gate lines SGS in all cell units are set to Vsg (e.g., about 3.5 V), and the potentials of source lines SL and p-well region (P-well) are set to 0 V. The potential of drain-side select gate line SGD in each cell unit including the selected memory cell is set to Vsg, and the drain-side select gate line SGD in each cell unit including the unselected memory cell is set to 0 V.

The potentials of all word lines are set to the read potential Vpv.

As a result, the data of the memory cells of one selected page are read out to the bit lines. Since a control signal Ytransf is set at "H" level (e.g., VsgHHH) in advance, the read data of the memory cells of the selected page are transferred to the input section of the page buffer P/B through a transistor MN9 in FIG. 24.

In the program verify read, since the control signal BLSENEN is at "L" level, and the control signal VERIFYn is at "H" level, all control signal bits b0' to b7' and c0' to c3' shown in FIG. 24 change to "L" level. That is, in all columns, the control signals BLSENAi and BLSENBj are at "L" level, and the transistors MN2 and MN3 shown in FIGS. 24 and 25 are normally in the OFF state. A control signal PBTR is also always at "L" level, and a transistor MN7 is also in the OFF state.

Hence, in the program verify read, the read data of the memory cells of the selected page are transferred to the input section of the page buffer P/B but are not input to the page buffer P/B.

When the threshold voltage of the memory cell exceeds Vpv, the bit line BL keeps the precharge potential ("0" -programming is sufficient). On the other hand, if the threshold voltage of the memory cell is less than Vpv, the potential of the bit line BL gradually drops from the precharge potential to the ground potential ("0"-programming is non-sufficient or "1"-programming is performed).

This change in potential of the bit line BL is detected (sensed) by the sense amplifier S/A·0 shown in FIG. 24. However, as shown in FIG. 24, in one bit line group including the 32 bit lines BL0 to BL31, only one bit line is electrically connected to the sense amplifier S/A·0.

In addition, since a control signal SAEN is at "H" level, the read data detected by the sense amplifier S/A·0 is detected by the latch circuit LATCH1 through an inverter I1.

In the program verify read, a control signal SAOUT is set at "L" level, unlike the normal data read. For this reason, the read data (verify read result) is not output to the data bus DATABUS. The read data is not output to the data bus DATABUS because if the read data is output to the data bus DATABUS having a large capacitance, power is wasted.

After that, when the control signal SAEN changes to "L" level, and a control signal SAENn (inverted signal of the control signal SAEN) changes to "H" level, the read data is latched by the latch circuit LATCH1 in the read/write circuit shown in FIG. 24.

③ Verify Data-In

When the verify read is ended, the verify data-in is performed.

First, a control signal DIN2 changes to "H" level, an inverter I5 shown in FIG. 24 is set in the operative state, and the read data (verify read result) in the latch circuit LATCH1 is transferred to the bit line selected by the column address signal bits A0 to A4.

The bit line selected in the verify data-in is the same as that selected in the program verify read (bit line electrically connected to the sense amplifier).

After that, when the control signal BLSENEN changes to "H" level, the logic circuit LOGIC shown in FIG. 24 is activated, and only the NMOS transistors MN2 and MN3 corresponding to the selected bit line (column) are turned on. As a consequence, the read data (verify read result) transferred from the latch circuit LATCH1 in the read/write circuit to the bit line is input to the page buffer P/B through the NMOS transistor MN4.

The data (value of the node N2) in the latch circuit LATCH in the page buffer P/B changes in accordance with the verify read result.

For example, when the selected memory cell is a cell to be subjected to "0"-programming, and the "0"-programming is sufficient, the read data, i.e. the gate potential of the transistor MN4 is in the "1" state ("H" level). Since the transistor MN4 is turned on, the node N2 of the latch circuit LATCH is short-circuited to ground Vss and is set at the ground potential ("0" state). That is, the node N1 of the latch circuit LATCH changes from the "0" state to the "1" state.

When the selected memory cell is a cell to be subjected to "0"-programming, and the "0"-programming is non-sufficient, the read data, i.e. the gate potential of the transistor MN4 is in the "0" state ("L" level). Since the transistor MN4 is turned off, the node N2 of the latch circuit LATCH keeps the "1" state without being short-circuited to the ground Vss. That is, the node N1 of the latch circuit LATCH maintains the "0" state.

When the selected memory cell is a cell to be subjected to "1"-programming, no programming is performed, and the read data, i.e. the gate potential of the transistor MN4 is in the "0" state ("L" level). Since the transistor MN4 is turned off, the node N2 of the latch circuit LATCH keeps the "0" state. That is, the node N1 of the latch circuit LATCH maintains the "1" state.

Hence, when all memory cells to be subjected to the "0"-programming are sufficiently programmed, the nodes N1 of the latch circuits LATCH in all page buffers P/B are set in the "1" state ("H" level), and the nodes N2 are set in the "0" state ("L" level).

FIG. 9 shows such changes in latch data (value of the node N1) according to the verify read result.

That is, in the "0"-programming, if it is determined that the "0"-programming is non-sufficient (the verify read result, i.e., cell data is "1"), the node N1 of the latch circuit LATCH is kept in the "0" state to continuously allow "0"-programming (re-write).

In the verify data-in, a control signal PBSW is set at "H" level. This is because a transistor MP1 is turned off to change the value of the node N2 from the "1" state ("H" level) to the "0" state ("L" level) when the "0"-programming is sufficient, as shown in FIG. 25.

④ Batch Detection (Verify)

After ① batch detection by column address unit, ② verify read, and ③ verify data-in described above are repeated 32 times (Col.Add.=1, 2, . . . , 32) (② and ③ are omitted when the result of ① passes), a batch detecting operation is performed to verify whether the programming is completely executed for all memory cells of one selected page.

To do the batch detecting operation, first, the potential PBFLG of the common node of all page buffers P/B is charged to "H" level. In addition, the control signal BLRST changes to "H" level to reset the input nodes of all page buffers P/B to "L" level.

After that, when the control signal VERIFYn changes to "L" level, all output signal bits b0' to b7' and c0' to c3' from the logic circuit LOGIC shown in FIG. 24 change to "H" level. That is, in all columns, the control signals BLSENAi and BLSENBj change to "H" level to turn on the transistors MN2' and MN3'.

With this process, preparation for batch detection for all memory cells of one page is completed.

Hence, when the control signal PBVFY changes to "H" level to turn on a transistor MN6, batch detection is performed.

More specifically, when the node N1 of the latch circuit LATCH is in the "0" state, and the node N2 is in the "1" state, the transistor MN5 is turned on. When the node N1 of the latch circuit LATCH is in the "1" state, and the node N2 is in the "0" state, the transistor MN5 is turned off.

That is, since the common node is connected to all page buffers P/B, the potential PBFLG of the common node maintains "H" level when the nodes N2 of the latch circuits LATCH in all page buffers P/B. That the potential PBFLG of the common node is at "H" level means that the "0"-programming is sufficient for all "0"-programming cells.

In this case, the program operation is ended.

On the other hand, if the node N2 of the latch circuit LATCH in at least one page buffer P/B is at "1" level, the potential PBFLG of the common node changes from "H" level to "L" level. That the potential PBFLG of the common node is at "L" level means that the "0"-programming is non-sufficient for at least one "0"-programming cell.

In this case, the program potential Vpgm is stepped up, and the program operation is executed again.

3.-4.-3. Summary

In the circuit according to the third embodiment, before the verify read is performed for each column address, batch detection by column address unit is performed for only the memory cells of the column address.

Once the batch detection by column address unit passes, the memory cells of this column address are sufficiently programmed, and therefore, the verify read and verify data-in are not performed anymore. The process advances to batch detection by column address unit for only the memory cells of the next column address.

For memory cells of column addresses, which have already been programmed, the verify read and verify data-in can be omitted, and the verify time can be shortened.

If batch detection by column address unit fails, it means that programming for at least one of the memory cells of the column address is non-sufficient. Hence, after the verify read and verify data-in are performed, the process advances to batch detection by column address unit for only the memory cells of the next column address.

At the end of a process, normal batch detection is performed. When this batch detection passes, the program operation is ended. When the batch detection fails, the program potential Vpgm is stepped up, and the program operation is executed again.

This operation can be attained by newly adding the transistors MN2' and MN3' and logic circuit LOGIC, as shown in FIGS. 24 and 25.

The verify method of this embodiment is effective when the number of memory cells for which the programming is non-sufficient is small. That is, when the number of memory cells for which the programming is non-sufficient is small, the number of column addresses for which the verify read and verify data-in are omitted increases.

Hence, the verify method of this embodiment is unsuitable when the number of memory cells for which the programming is non-sufficient is large. If the number of memory cells for which the programming is non-sufficient is large, the number of column addresses for which the verify read and verify data-in are omitted is zero or very small. As a consequence, the time prolongs by additional batch detection by column address unit.

However, this problem can be avoided by employing the following method.

In the program method of stepping up the program potential Vpgm, normally, the number of times of the program operation is small, and when the program potential Vpgm is low, most memory cells are insufficiently programmed. However, when the number of times of program operation increases, and the program potential Vpgm becomes high, most memory cells are sufficiently programmed.

In this case, it is not appropriate to use the verify method of this embodiment before the number of times of programming increases because an excess time is required for batch detection by column address unit. It is also inappropriate to use the verify method of the first embodiment even after the number of times of programming increases because the verify read and verify data-in must be performed even for a column address including only memory cells that are sufficiently programmed.

In consideration of the above condition, for example, when the verify method is switched in accordance with the number of times of programming, the above-described problem can be avoided.

For example, when the number of times of programming is smaller than a predetermined value (smaller than several times), the verify method of the first embodiment is employed, and when the number of times of programming is a predetermined value or more, the verify method of the third embodiment is employed.

With this arrangement, when the number of times of programming is small, and batch detection by column address unit fails at high probability, the batch detection by column address unit is not performed, and accordingly, the verify time can be shortened. When the number of times of programming is large, and batch detection by column address unit passes at high probability, the batch detection by column address unit is performed, and consequently, the verify read and verify data-in are sometimes omitted, and the verify time can be further shortened.

3.-5. Fourth Embodiment

A nonvolatile semiconductor memory according to the fourth embodiment of the present invention will be described below in detail.

In the above-described first and second embodiments (FIG. 19), after one cycle of program operation is ended, the verify read and verify data-in are repeated 32 times, and further, batch detection (verify) is performed.

In the above-described third embodiment (FIG. 26), after one cycle of a program operation is ended, batch detection by column address unit is performed. For memory cells of a column address that has passed the batch detection by column address unit, the verify read and verify data-in are omitted. The verify read and verify data-in are performed for only memory cells of a column address that has failed the batch detection by column address unit. Additionally, at the end of process, normal batch detection for memory cells of one page is executed.

The verify method according to the third embodiment has been proposed for the purpose of omitting unnecessary verify read and verify data-in from the verify method according to the first embodiment.

The verify method according to the fourth embodiment has also been proposed for the purpose of omitting unnecessary verify read and verify data-in from the verify method according to the first embodiment.

In this embodiment, the step of batch detection by word unit is newly prepared. This step of batch detection by word unit can be regarded as the same as the step of batch detection by column address unit in the third embodiment. Hence, the verify method of the fourth embodiment can be implemented using the circuit (FIGS. 24 and 25) described in the third embodiment.

3.-5.-1. Overall Arrangement

The verify method according to the fourth embodiment can be implemented using, e.g., the circuit (FIGS. 24 and 25)

described in the third embodiment. Hence, the overall arrangement of a 3Tr-NAND according to the fourth embodiment is the same as that shown in FIGS. 24 and 25.

3.-5.-2. Program Verify

When one cycle of program operation is ended, the program verify is performed.

Figure 28:
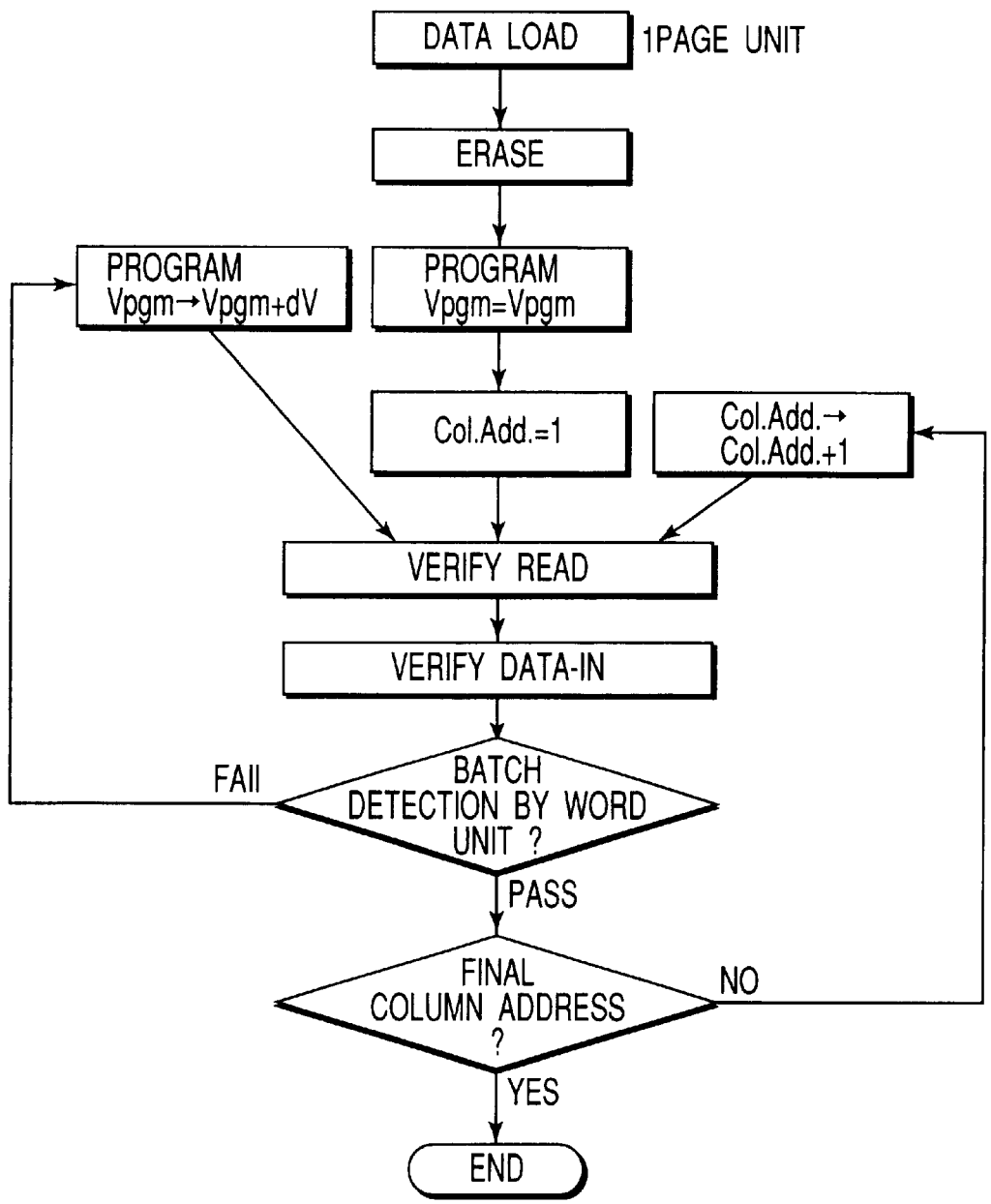
FIG. 28 is a flow chart showing the verify sequence of the present invention.

The program verify comprises the steps of verify read, verify data-in, and batch detection by word unit (verify), as shown in the flow chart of FIG. 28.

As a characteristic feature of the program verify of the fourth embodiment, the verify read, verify data-in, and batch detection by word unit are performed for each column address Col.Add., and until batch detection by word unit for the column address Col.Add. passes, the verify read, verify data-in, and batch detection by word unit are repeated for the same column address Col.Add. without advancing the process to the next column address Col.Add.

Figure 29:
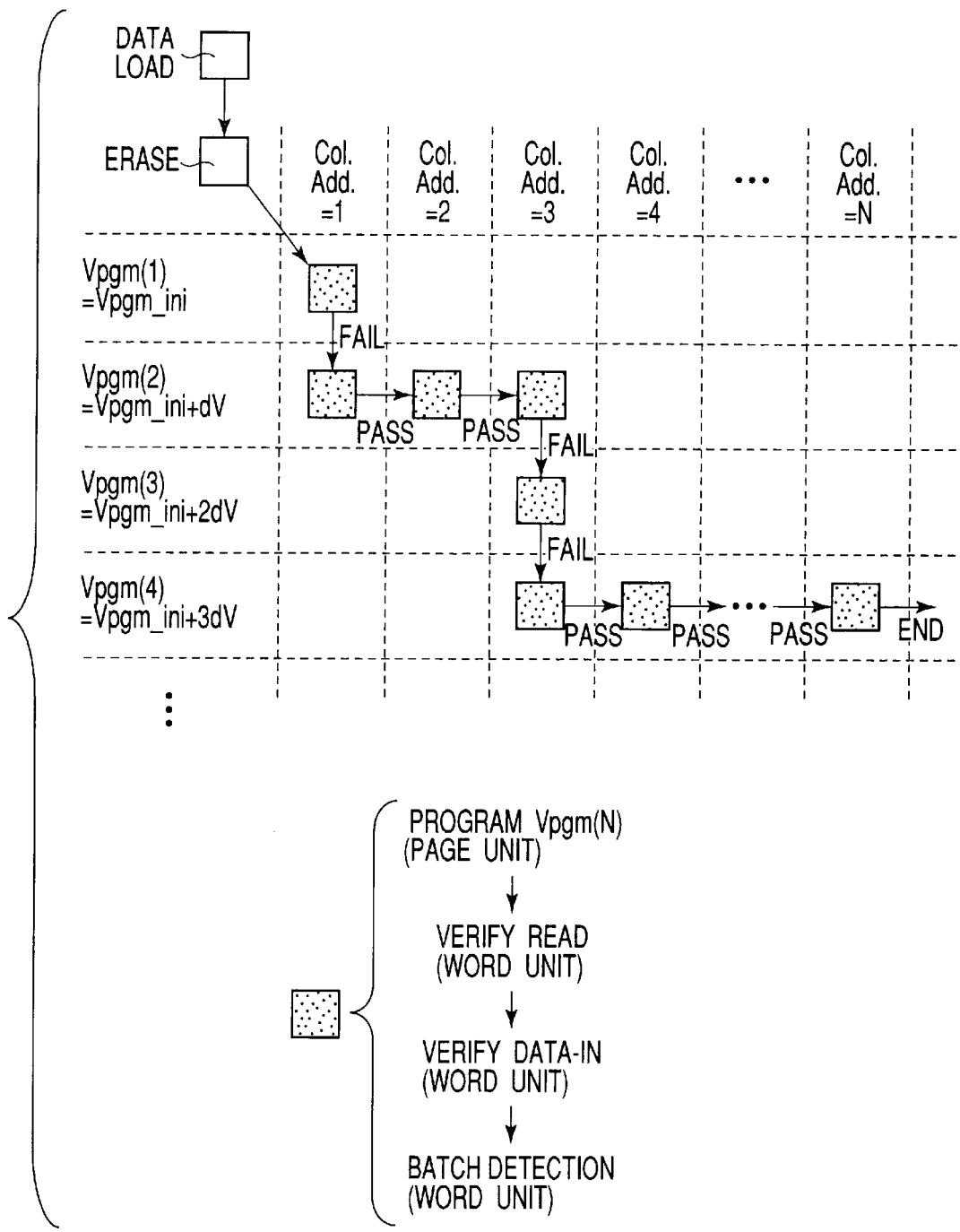
FIG. 29 is a view showing the concept of the verify sequence shown in FIG. 28.

The program verify of this embodiment will be described below in detail with reference to FIGS. 28 and 29. FIG. 29 is a view showing the concept of the verify sequence according to the fourth embodiment.

First, the column address Col.Add.=1 is set to select the memory cells (columns) of this column address. The number of memory cells (columns) selected by one column address is 16+6 (16 memory cells in the data area and six memory cells in the parity bit area).

After this, the verify read and verify data-in are executed for the memory cells corresponding to the column address Col.Add.=1. The detailed operation of the verify read and verify data-in is the same as that described in the third embodiment, and a repetitive operation will be omitted (Section 3.-4.-2. "Program verify", ② Verify Read and ③ Verify Data-In).

Subsequently, batch detection by word unit is performed. The detailed operation of the batch detection by word unit is the same as the batch detection by column address unit described in the third embodiment, and a repetitive operation will be omitted (Section 3.-4.-2. "Program verify", ① Batch Detection by Column Address Unit).

The batch detection by word unit is executed for only the memory cells of column address Col.Add.=1 and is not affected by memory cells of the remaining column addresses=2, 3, . . . 32 (more specifically, latch data in page buffers P/B of unselected columns).

If the batch detection by word unit fails, a program potential (e.g., 13 V) Vpgm-ini is stepped up by dV (e.g., 1 V), and the program operation is executed again using the stepped up program potential Vpgm-ini+dV. After this, the verify read, verify data-in, and batch detection by word unit for the memory cells of column address Col.Add.=1 are executed again.

On the other hand, if the batch detection by word unit passes, the column address Col.Add. is incremented by one, and the verify read, verify data-in, and batch detection by word unit for the memory cells of next column address Col.Add.=2 are executed.

As an important point, the verify read, verify data-in, and batch detection by word unit are performed for the memory cells of one column address Col.Add., though the program operation is performed for all memory cells of one page. Hence, even when the column address Col.Add. is incremented, the program potential Vpgm is sequentially stepped up in accordance with only the number of times of programming.

The above operation is performed for all column addresses Col.Add. That is, in the fourth embodiment, when the batch detection by word unit for the memory cells of the final column address Col.Add.=32 passes, the program operation is ended.

3.-5.-5. Summary

According to the verify method of the above-described fourth embodiment, the verify read, verify data-in, and batch detection by word unit are performed for each column address Col.Add., and until batch detection by word unit for the memory cells of the column address Col.Add. passes, the verify read, verify data-in, and batch detection by word unit are repeated for the same column address Col.Add. without advancing the process to the next column address Col.Add.

For the column address Col.Add. that has passed the batch detection by word unit, the verify read and verify data-in are not executed later. In the verify method according to this embodiment, since only the minimum verify read and verify data-in are performed, the verify time can be shortened.

For example, the verify time (the number of times of verify read) in the verify method of this embodiment will be compared with the verify time (the number of times of verify read) in the verify methods of the above-described first and second embodiments. Assume that one page is formed from N words, and the program operation is performed M times until programming of memory cells (one word) corresponding to one column address is ended.

In the verify methods according to the above-described first and second embodiments, the verify read and verify data-in are performed N×M times. However, in the verify method of the fourth embodiment, the verify read and verify data-in are performed N+M−1 times.

This will be described in more detail in accordance with the example shown in FIG. 29. When four column addresses Col.Add. are present (1, 2, 3, and 4), in the above-described first and second embodiments, all cells formed by the column address Col.Add.=1, . . . , 4 and the program potential Vpgm(1) are filled with rectangles (one rectangle corresponds to one cycle of verify read and verify data-in), so a total of 16 cycles of verify read and verify data-in are executed.

To the contrary, in the fourth embodiment, the number of rectangles from the column address Col.Add.=1 to column address Col.Add.=4 is 7 (=4+4−1). That is, the verify operation is ended by only seven cycles of verify read and verify data-in.

In the verify method according to the fourth embodiment, until the batch detection by word unit passes for the memory cells of one column address Col.Add., the verify read and verify data-in for the next column address Col.Add. are not performed.

Hence, when the verify read and verify data-in are being executed for the column address Col.Add.=1, for another column address, e.g., column address Col.Add.=4, programming of all memory cells may have already been completed.

That is, for the column address Col.Add.=4, the verify read and verify data-in are not performed unless the batch detection by word unit for the column address Col.Add.=3 passes. Hence, even when programming of all memory cells has already been completed for the column address Col.Add.=4, the latch data in the page buffer P/B may indicate that programming is non-sufficient.

For this reason, in the verify method of the fourth embodiment, for the memory cells of, e.g., the final column address Col.Add.=N (e.g., N=4), even when programming is possible at a low program potential Vpgm, the program-inhibit state may not be set until the program potential Vpgm rises to a high potential.

In the example shown in FIG. 29 as well, when the column address Col.Add.=4, programming is possible at a low program potential Vpgm(1)=Vpgm-ini, though the program-inhibit state is not set until the potential rises to a high program potential Vpgm(4)=Vpgm-ini+3 dV.

Hence, in the verify method of the fourth embodiment, a memory cell having a very high threshold voltage is generated by the program operation.

However, as described above, in the 3Tr-NAND, since over-programming poses no problem because of its operational characteristic feature, that the very high threshold voltage of a memory cell does not impede the memory operation.

However, as described above, excessive stress is generated on the tunnel oxide film of the memory cell by the over-programming. For this reason, if the stress on the tunnel oxide film poses a problem, the verify method of the third embodiment can be effectively used.

3.-6. Fifth Embodiment

A nonvolatile semiconductor memory according to the fifth embodiment of the present invention will be described below in detail.

In the verify methods (FIGS. 26 and 28) according to the above-described third and fourth embodiments, the number of times of verify read and verify data-in can be decreased as compared to the verify methods (FIG. 19) according to the above-described first and second embodiments, and consequently, the verify time can be shortened.

In the verify methods of the third and fourth embodiments, however, since batch detection (verify) is performed in units of column addresses (or in units of words), only the number of times of batch detection is larger than that in the verify methods of the first and second embodiments.

When the time required for batch detection by column address unit (or batch detection by word unit) and normal batch detection by page unit is shortened, the verify time can be further shortened.

In the fifth embodiment to be described below, a batch detection method capable of shortening the time required for batch detection (verify) will be described.

The batch detection method according to the fifth embodiment can be applied to any one of the nonvolatile semiconductor memories of the above-described first to fourth embodiments.

3.-6.-1. Batch Detecting Circuit

Figure 30:
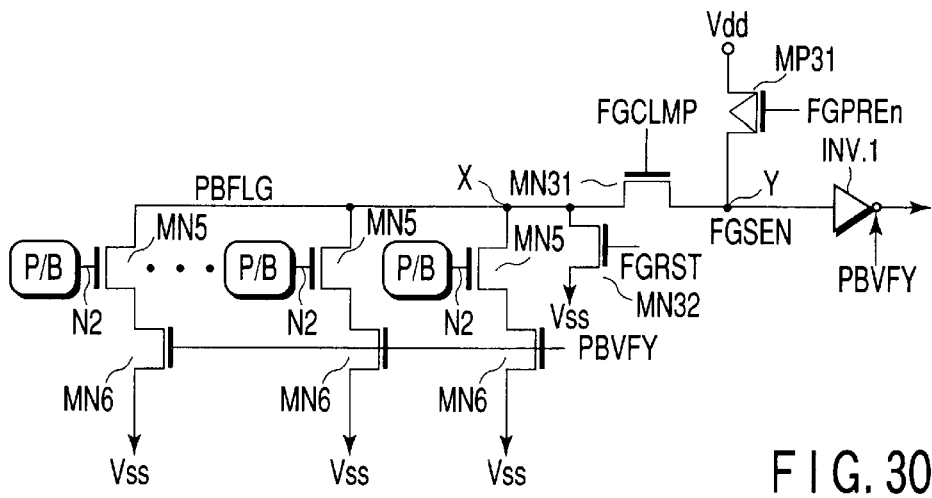
FIG. 30 is a circuit diagram showing a batch detecting circuit of the present invention.

FIG. 30 is a circuit diagram showing a batch detecting circuit which can be applied to a nonvolatile semiconductor memory according to the present invention.

Reference symbol P/B denotes a page buffer of one page corresponding to memory cells of one page (or all columns). For example, in a 3Tr-NAND having blocks as shown in FIG. 1 or 10, 704 page buffers P/B are arranged (including the data area and parity bit area).

A latch node N2 (corresponding to the node N2 of the latch circuit LATCH in, e.g., FIG. 15, 22, or 25) of each page buffer P/B is connected to the gate of a transistor MN5. The source of the transistor MN5 is connected to ground through a transistor MN6, and the drain of the transistor MN5 is connected to a common node X for batch detection.

The above arrangement is the same as that of the page buffer P/B shown in FIG. 15, 22, or 25.

In the batch detecting circuit according to this embodiment, the common node X is connected to a detection node Y through an NMOS transistor MN31. A control signal FGCLMP is input to the gate of the transistor MN31.

An NMOS transistor MN32 is connected between ground and the common node X. A control signal FGRST is input to the gate of the transistor MN32. The transistor MN32 has a function of resetting the potential of the common node X (function of setting a potential PBFLG at "L" level).

A PMOS transistor MP31 is connected between the detection node Y and the internal power supply terminal. A control signal FGPREn is input to the gate of the transistor MP31. The transistor MP31 has a function of precharging the potential PBFLG of the common node X to "H" level before batch detection.

The detection node Y is connected to an inverter INV.1. The inverter INV.1 is set in the operative state when a control signal PBVFY changes to "H" level, thereby detecting a change in potential of the common node X (actually, a change in potential of the detection node Y).

As a characteristic feature of this batch detecting circuit, a capacitance CF generated at the common node X is much larger than that generated at a node CS. To shorten the time required for batch detection, a change in potential PBFLG of the common node X must be instantaneously detected in the batch detection mode.

However, since the common node X is connected to the page buffers of all columns, the capacitance of the common node X is very large. For this reason, the potential of the common node X in the batch detection mode slowly changes. For example, if the transistor MN31 is not present, the time required by the inverter INV.1 to detect the change in potential is very long.

In the batch detecting circuit according to this embodiment, the transistor MN31 is provided to sufficiently decrease the capacitance of the detection node Y as compared to the capacitance CF of the common node X. As a result, even when the change in potential of the common node X is slow (or small), the change in potential of the detection node Y becomes quick (or large) due to the principle of conservation of charge.

Hence, the inverter INV.1 can detect the change in potential of the common node X (actually, the change in potential of the detection node Y) immediately after the control signal PBVFY changes to "H" level, so the time for batch detection, and additionally, the verify time can be shortened.

3.-6.-2. Batch Detecting Operation

Figure 31:
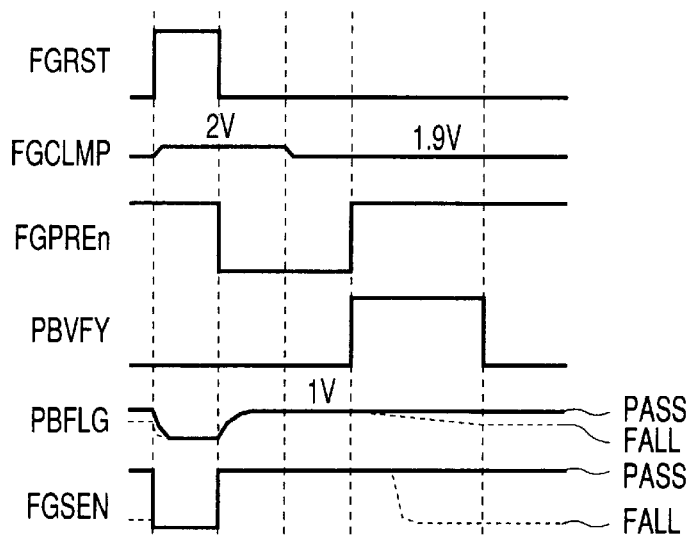
FIG. 31 is a timing chart showing signal waveforms used in the batch detecting circuit shown in FIG. 30.

FIG. 31 is a timing chart of the batch detecting operation when the batch detecting circuit shown in FIG. 30 is used.

The batch detecting operation according to this embodiment will be described below with reference to FIGS. 30 and 31.

First, the control signal FGRST is set at "H" level to turn on the transistor MN32. The control signal FGCLMP is set to about 2 V. As a result, the potential PBFLG of the common node X and a potential FGSEN of the detection node Y are reset to "L" level (ground potential Vss).

When the control signal FGPREn changes to "L" level, the detection node Y and common node X are precharged. The transistor MP31 for precharge is connected to the detection node Y, and a potential of about 2 V (control signal FGCLMP) is input to the gate of the transistor MN31 for clamping the nodes X and Y.

For this reason, the detection node Y is charged to a potential almost equal to an internal power supply potential Vdd (FGSEN=about 2 V). The common node X is charged to a potential of about 1 V (PBFLG=about 1 V) in consideration of the so-called threshold voltage drop of the transistor MN31.

After this, the potential of the control signal FGCLMP is reduced by about 0.1 V and set to about 1.9 V. In addition, the control signal FGPREn is set at "H" level, and the control signal PBVFY is set at "H" level to set the inverter INV.1 in the operative state. As a result, the change in potential of the common node X is detected by the inverter INV.1.

That is, if the potentials of the nodes N2 of all page buffers P/B are at "L" level ("0"-programming is sufficient or "1"-programming is performed), the potential PBFLG of the common node X maintains the precharge level ("H" level). Hence, the output signal from the inverter INV.1 is at "L" level (batch detection passes).

On the other hand, if the potential of the node N2 of at least one page buffer P/B is at "H" level ("0"-programming is non-sufficient), the potential PBFLG of the common node X gradually drops from the precharge level ("H" level) to "L" level. The smaller the number of page buffers P/B having nodes N2 at "H" level is, the lower the drop speed of the potential PBFLG of the common node X becomes.

However, in the batch detecting circuit of this embodiment, the capacitance CS of the detection node Y is much smaller than the capacitance CF of the common node X. For this reason, for example, if the potential PBFLG drops by $(0.1+\Delta VF)$, the potential FGSEN of the detection node Y drops by $\Delta VS$ $(=\Delta VF \times CF/CS)$ due to the principle of conservation of charge.

The value $\Delta VS$ is much larger than $0.1+\Delta VF$.

That is, as shown in FIG. 31, even when the change in potential PBFLG of the common node X is small, the change in potential FGSEN of the detection node Y is very large. As a result, even when the potential of the common node X slowly changes, the inverter INV.1 can quickly detect the change in potential of the detection node Y.

Hence, the output signal from the inverter INV.1 quickly changes to "H" level (batch detection fails).

3.-6.-3. Summary

According to the batch detecting circuit of the fifth embodiment of the present invention, since the time required for batch detection can be largely shortened, the verify time can be shortened.

3.-7. Sixth Embodiment

A nonvolatile semiconductor memory according to the sixth embodiment of the present invention will be described below in detail.

In the above-described fourth embodiment (FIGS. 28 and 29), the verify read, verify data-in, and batch detection by word unit are executed for each column address Col.Add., and until batch detection by word unit for the memory cells of the column address Col.Add. passes, the verify read, verify data-in, and batch detection by word unit are repeated for the same column address Col.Add. without advancing the process to the next column address Col.Add.

For the memory cells of the column address Col.Add. which has passed the batch detection by word unit, the verify read, verify data-in, and batch detection are not performed anymore. For the memory cells of the final column address, over-programming occurs at high probability. In the 3Tr-NAND, over-programming poses no problem in operation.

Hence, in the verify method according to the fourth embodiment, latch data (program data) in the page buffer P/B need not be changed in accordance with the verify read result.

That is, the latch circuit LATCH in the page buffer P/B always latches program data input from the exterior of the chip. The batch detection by word unit can be executed using, e.g., the batch detecting circuit provided in the read/write circuit on the basis of read data read by the verify read and the latch data in the page buffer P/B.

In this case, since the verify data-in step of transferring the verify read result from the read/write circuit (sense amplifier) to the page buffer P/B can be omitted, the verify time can be shortened by a time corresponding to the verify data-in sequence. In addition, since the circuit for changing latch data in accordance with the verify read result or circuit for batch detection need not be arranged in the page buffer P/B, the page buffer P/B can be simplified, and the layout area can be reduced.

As described above in the fourth embodiment, over-programming poses no problem in an operation of the 3Tr-NAND. However, since overstress is generated on the tunnel oxide film, the problem of reliability may rise. Especially, in the fourth embodiment, over-programming may occur in the memory cells of the final or almost final column address. In the sixth embodiment, over-programming may occur in all "0"-programming cells independently of the column address.

Hence, whether the verify method of the fourth embodiment is to be employed or that of the sixth embodiment is to be employed for, e.g., a 3Tr-NAND is determined in accordance with the application purpose or specifications of the product.

3.-7.-1. Overall Arrangement

Figure 33:
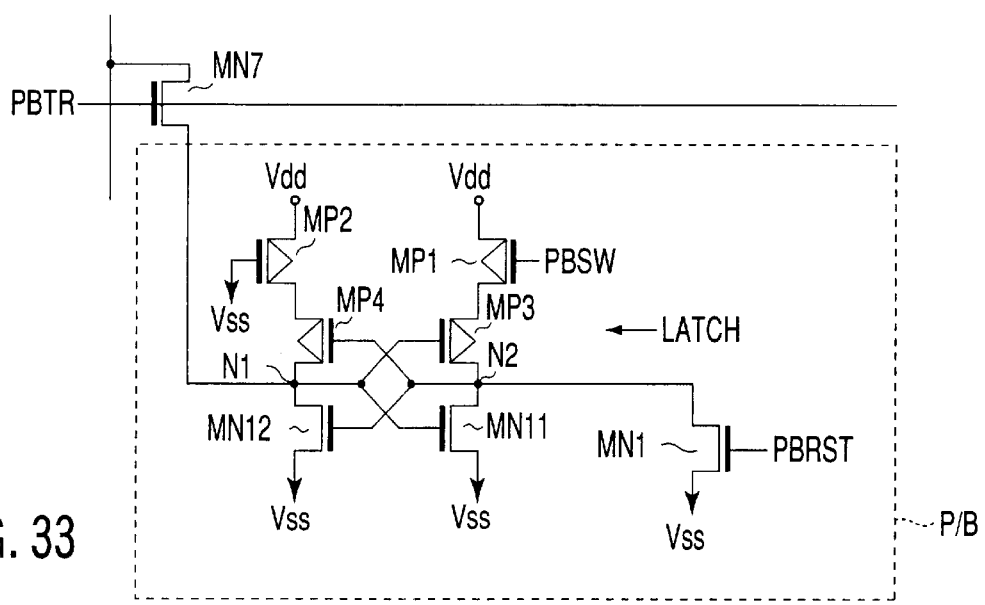
FIG. 33 is a circuit diagram showing details of a page buffer P/B shown in FIG. 32.
Figure 32:
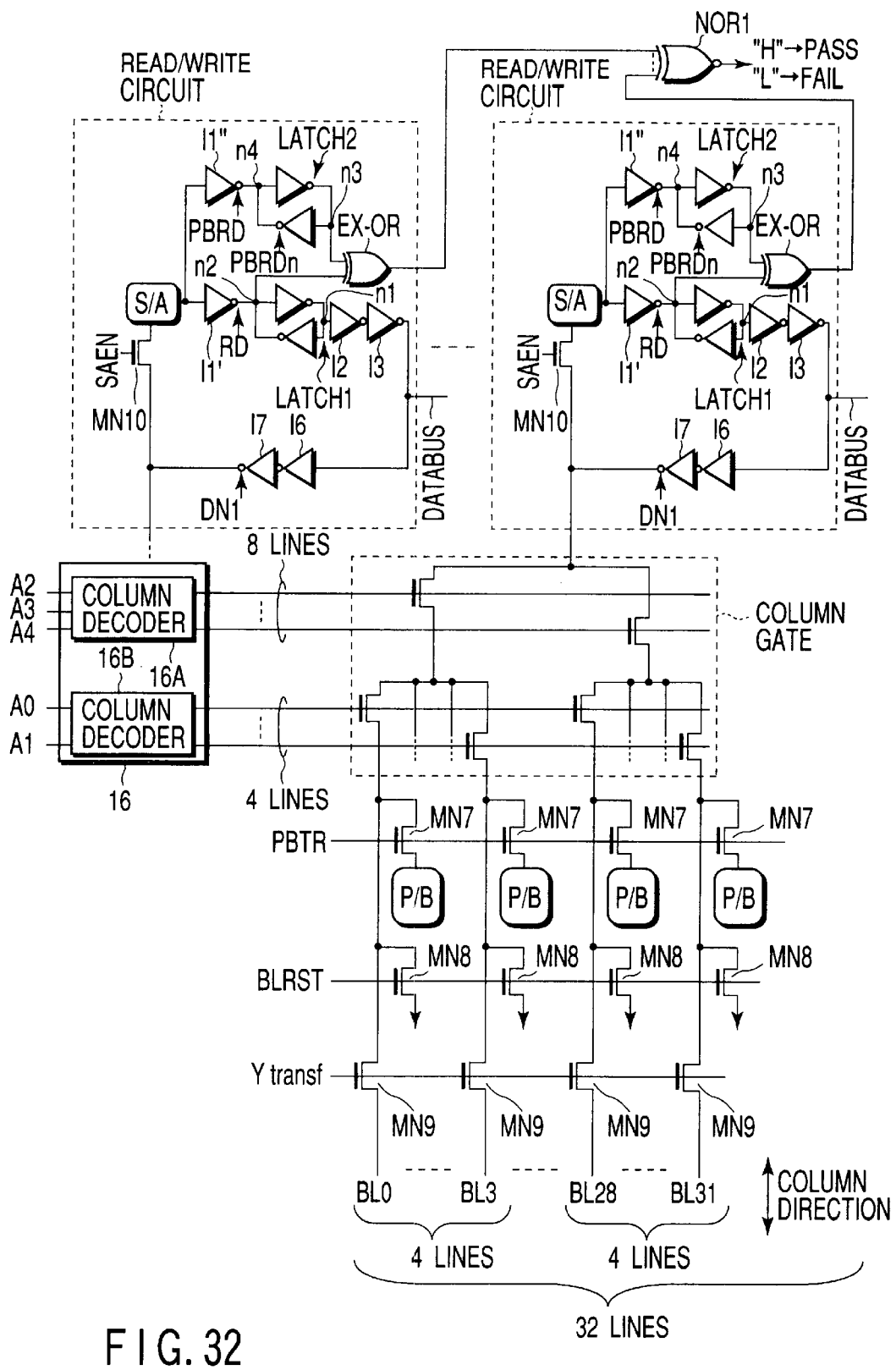
FIG. 32 is a block diagram showing a 3Tr-NAND of the present invention.

FIG. 32 is a block diagram showing a main part of a 3Tr-NAND according to the sixth embodiment of the present invention. FIG. 33 is a circuit diagram showing details of a page buffer P/B shown in FIG. 32.

FIG. 32 corresponds to the block diagram of FIG. 1, and the same reference numerals as in FIG. 1 denote the same blocks in FIG. 32. FIG. 32 shows details of a portion corresponding to one sense amplifier S/A·0 and 32 bit lines (one bit line group) BL0 to BL31 connected to the sense amplifier in FIG. 10. Each of the remaining sense amplifiers S/A·1 to S/A·21 and 32 bit lines connected to the sense amplifier in FIG. 10 also have the same circuit arrangement as in FIG. 32.

The circuit of this embodiment is different from that of the above-described second embodiment (FIG. 21) in the page buffer P/B and read/write circuit. The remaining portions are the same as in the circuit of the above-described second embodiment.

Hence, the circuit of the sixth embodiment will be described below only about its characteristic portion that is different from the circuit of the above-described second embodiment. A description of the remaining portions, i.e., portions that are the same as in the circuit of the above-described second embodiment will be omitted.

As shown in FIG. 33, a node N2 of a latch circuit LATCH in the page buffer P/B is connected to ground through an NMOS transistors MN1. A control signal PBRST is input to the gate of the transistor MN1. The control signal PBRST changes to "L" level in resetting the page buffer P/B.

In the circuit of this embodiment, the page buffer P/B and the circuit arrangement in the periphery are very simple as compared to the circuits of, e.g., the above-described first to third embodiments (FIGS. 15, 22, and 25). That is, in the circuit of the sixth embodiment, the page buffer P/B has only the latch circuit LATCH and transistor MN1. A circuit for changing latch data in accordance with the verify read result or a circuit for batch detection is not arranged.

Hence, according to the verify method of this embodiment, the layout area of the page buffer P/B and its neighboring circuits can be reduced, and a verify operation according to the present invention can be executed with a very simple circuit arrangement.

As shown in FIG. 32, the 32 bit lines BL0 to BL31 are connected to the read/write circuit through a column gate. One read/write circuit includes one sense amplifier S/A.

An NMOS transistor MN10 is connected between the sense amplifier S/A and the column gate. The transistor MN10 is ON/OFF-controlled by a control signal (sense amplifier enable signal) SAEN. The control signal SAEN changes to "H" level in the verify read. At this time, the sense amplifier S/A is also simultaneously activated (set in the operative state).

The output node of the sense amplifier S/A is connected to a node n2 of a latch circuit LATCH1 through an inverter I1'. The inverter I1' is set in the operative state when a control signal RD is at "H" level. The latch circuit LATCH1 senses the output data from the inverter I1' when the control signal RD is at "H" level, and latches the output data from the inverter I1' when the control signal RD changes to "L" level and a control signal RDn (inverted of control signal RD) changes to "H" level.

The output node of the sense amplifier S/A is connected to a node n4 of a latch circuit LATCH2 through an inverter I1". The inverter I1" is set in the operative state when a control signal PBRD is at "H" level. The latch circuit LATCH2 senses the output data from the inverter I1" when the control signal PBRD is at "H" level, and latches the output data from the inverter I1" when the control signal PBRD changes to "L" level and a control signal PBRDn (inverted signal of control signal PBRD) changes to "H" level.

Nodes n1 and n3 of the two latch circuits LATCH1 and LATCH2 in one read/write circuit are input to an exclusive OR circuit Ex-OR. This exclusive OR circuit Ex-OR determines whether verify read data matches latch data (program data), and the result is input to a NOR circuit NOR1.

Only one NOR circuit NOR1 is provided in correspondence with all read/write circuits and determines for 22 memory cells selected by a column address whether verify read data matches latch data (program data) (performs batch detection).

For example, for all the 22 memory cells selected by the column address, if the verify read data matches the latch data (program data), the output signal from the NOR circuit NOR1 changes to "H" level (batch detection passes). For at least one of the 22 memory cells selected by the column address, if the verify read data does not match the latch data (program data), the output signal from the NOR circuit NOR1 changes to "L" level (batch detection fails).

The node n1 of the latch circuit LATCH1 is connected to the node n3 through inverters I2 and I3. The node n3 is connected to a data bus DATABUS. The inverter I3 is set in the operative state when a control signal SAOUT is at "H" level. In the normal data read, since the control signal SAOUT changes to "H" level, read data is output to the data bus DATABUS.

In the verify read according to the present invention, the control signal SAOUT is always at "L" level.

Inverters I6 and I7 are connected between the node n3 and the column gate. The inverter I7 is set in the operative state when a control signal DN1 is at "H" level. In the data load in the program mode, the control signal DN1 changes to "H" level. Hence, the program data is input, through the inverters I6 and I7 and column gate, to the page buffer P/B connected to the selected bit line.

3.-7.-2. Program Verify

The program verify in the data rewrite mode will be described below. The data rewrite operation has already been described in detail in the first embodiment (Section 3.-2.-3. "Data Rewrite Operation"), and a repetitive description will be omitted here.

After one cycle of a program operation is ended, the program verify is executed.

Figure 34:
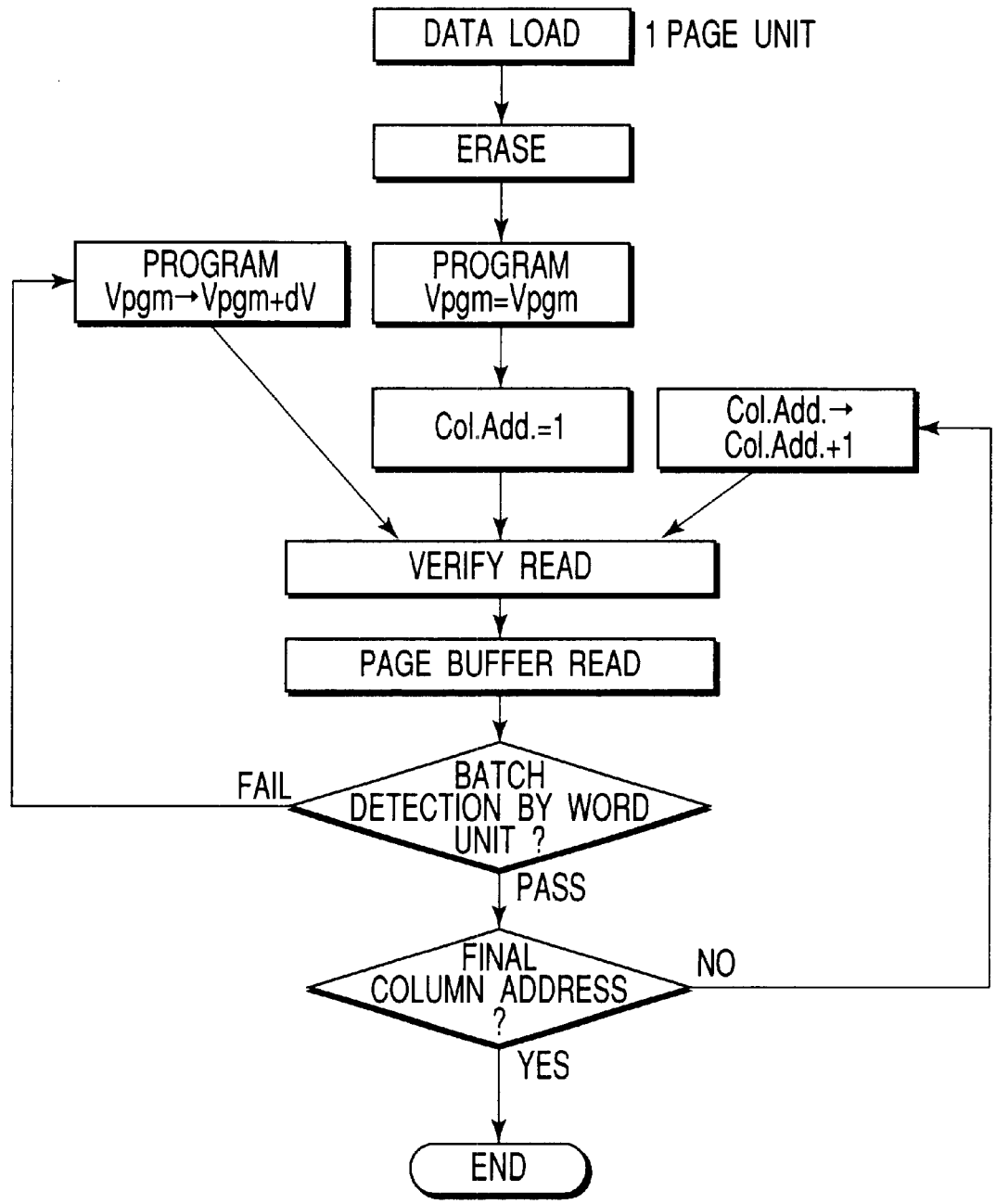
FIG. 34 is a flow chart showing the verify sequence of the 3Tr-NAND shown in FIG. 32.

The program verify comprises the steps of verify read, page buffer read, and batch detection by word unit (verify), as shown in the flow chart of FIG. 34. In the program verify of the sixth embodiment, although the verify data-in step is not present, the page buffer read step of reading program data in the page buffer P/B in the verify is added.

The verify read, page buffer read, and batch detection by word unit are performed for each column address Col.Add., and until batch detection by word unit for the memory cells of the column address Col.Add. passes, the verify read, page buffer read, and batch detection by word unit are repeated for the same column address Col.Add. without advancing the process to the next column address Col.Add.

For the column address Col.Add. that has passed the batch detection by word unit, the verify read and page buffer read are not performed anymore. In the verify method of this embodiment, since the verify data-in can be omitted, and only the minimum verify read and page buffer read are executed, the verify time can be shortened.

Figure 35:
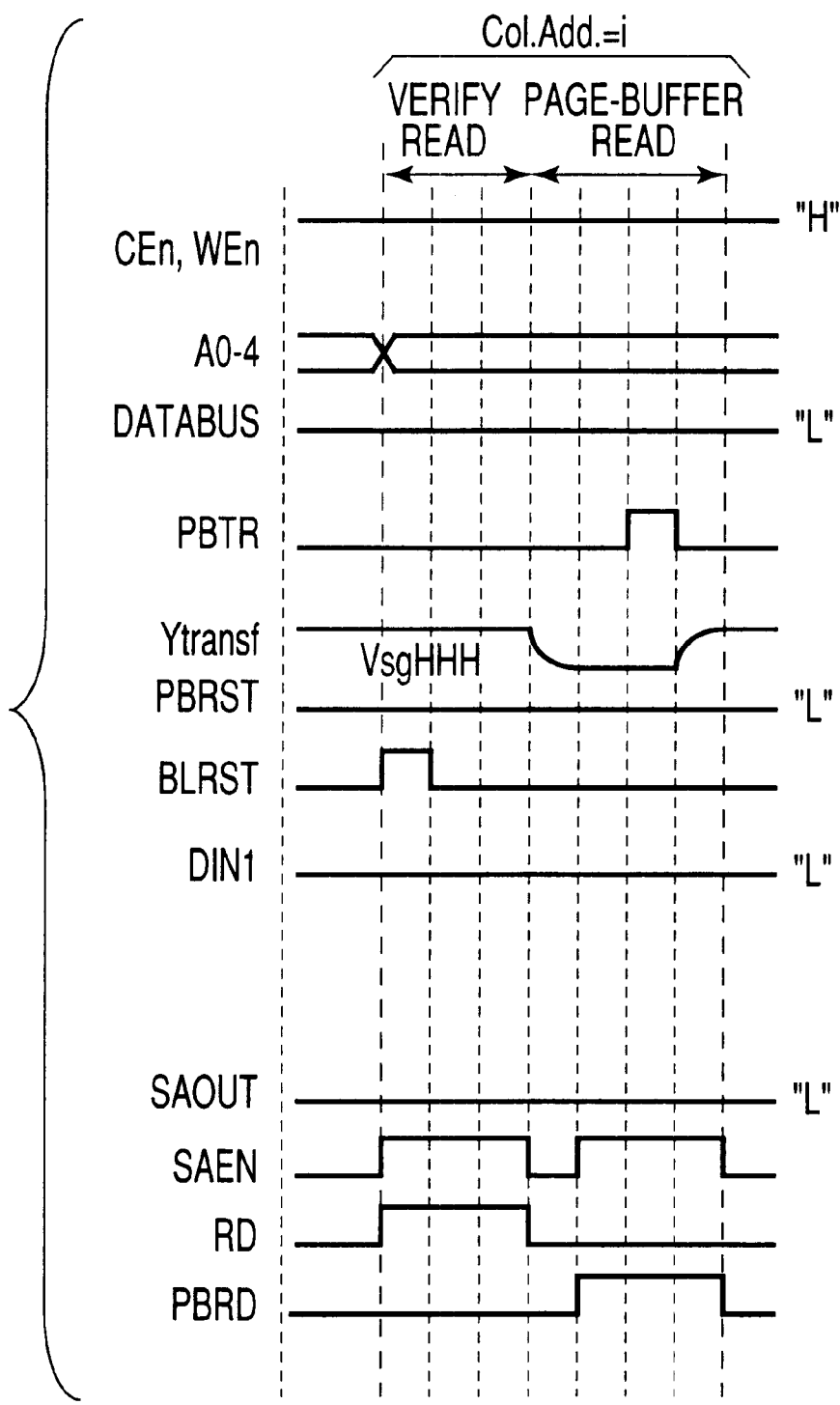
FIG. 35 is a timing chart showing signal waveforms in the verify of the 3Tr-NAND shown in FIG. 32.

FIG. 35 is a waveform chart showing the operation of the 3Tr-NAND in the verify read and page buffer read.

The verify operation according to the present invention will be described below with reference to FIGS. 32, 33, 34, and 35.

① Verify Read

The program verify read is performed as in the normal data read (read potential is 0 V) except a read potential Vpv to be applied to a selected word line is set to a positive potential (e.g., about 0.5 V).

In the normal data read, after read data detection (sensing) and data value determination are performed by the sense amplifier in the read/write circuit shown in FIG. 32, the read data is output to the data bus DATABUS. However, in the program verify read, after read data detection (sensing) and data value determination are done by the sense amplifier in the read/write circuit shown in FIG. 32, the read data (verify result) is only latched to the latch circuit LATCH1 in the read/write circuit shown in FIG. 32.

First, since control signals BLRST, SAEN, and RD change to "H" level, all bit lines are reset to the ground potential Vss, the transistor MN10 in the read/write circuit shown in FIG. 32 is turned on, and the sense amplifier S/A and the inverter I1' are set in the operative state.

After this, a bit line BL is precharged to a power supply potential Vdd ("H" level, i.e., "1" state) (the precharge circuit is not illustrated in FIG. 32).

The potentials of the source-side select gate lines SGS in all cell units are set to Vsg (e.g., about 3.5 V), and the potentials of source lines SL and p-well region (P-well) are set to 0 V. The potential of the drain-side select gate line SGD in each cell unit including the selected memory cell is set to Vsg, and the drain-side select gate line SGD in each cell unit including the unselected memory cell is set to 0 V.

The potentials of all word lines are set to the read potential Vpv.

As a result, the data of the memory cells of one selected page are read out to the bit lines. Since a control signal Ytransf is set at "H" level (e.g., VsgHHH) in advance, the read data of the memory cells of the selected page are transferred to the input section of the page buffer P/B through a transistor MN9 in FIG. 32.

In this embodiment, a control signal PBTR is always at "L" level, and the transistor MN7 shown in FIGS. 32 and 33 is also in the OFF state. Hence, in the program verify read, the read data of the memory cells of the selected page are not input to the page buffer P/B.

When the threshold voltage of the memory cell exceeds Vpv, the bit line BL keeps the precharge potential ("0"-programming is sufficient). On the other hand, if the threshold voltage of the memory cell is less than Vpv, the potential of the bit line BL gradually drops from the precharge potential to the ground potential ("0"-programming is non-sufficient or "1"-programming is performed).

This change in potential of the bit line BL is detected (sensed) by the sense amplifier S/A shown in FIG. 32. However, as shown in FIG. 32, in one bit line group including the 32 bit lines BL0 to BL31, only one bit line is electrically connected to the sense amplifier S/A.

In addition, since the control signals SAEN and RD are at "H" level, the read data detected by the sense amplifier S/A is detected by the latch circuit LATCH1 through the inverter I1'.

In the program verify read, the control signal SAOUT is set at "L" level, unlike the normal data read. For this reason, the read data (verify read result) is not output to the data bus DATABUS.

After that, when the control signals SAEN and RD change to "L" level, and the control signal RDn (inverted signal of the control signal RD) changes to "H" level, the read data is latched by the latch circuit LATCH1 in the read/write circuit shown in FIG. 32.

② Page Buffer Read

When the verify read is ended, the page buffer read is performed.

First, since the control signal Ytransf changes from "H" level to "L" level, the transistor MN9 shown in FIG. 32 is set in the cut-off state. That is, the input nodes of all page buffers P/B and the bit lines are electrically disconnected from each other.

This aims at properly transferring the latch data (program data) in the page buffer P/B to the read/write circuit by disconnecting the bit line having a large capacitance from the page buffer P/B.

In addition, since the control signals SAEN and PBRD change to "H" level, the transistor MN10 in the read/write circuit shown in FIG. 32 is turned on, and the sense amplifier S/A and inverter I1" are set in the operative state.

After that, when the control signal PBTR changes to "H" level, in the column selected by the column address signals, a node N1 of the latch circuit LATCH shown in FIG. 33 is electrically connected to the read/write circuit shown in FIG. 32 through the transistor MN7. As a result, the latch data (program data) in the page buffer P/B of the selected column is transferred to the read/write circuit.

The column selected in the page buffer read is the same as that selected in the verify read.

The latch data in the page buffer P/B is detected (sensed) by the sense amplifier S/A shown in FIG. 32. In addition, since the control signals SAEN and PBRD are at "H" level, the read data detected by the sense amplifier S/A is detected by the latch circuit LATCH2 through the inverter I1".

After that, when the control signals SAEN and PBRD change to "L" level, and the control signal PBRDn (inverted signal of the control signal PBRD) changes to "H" level, the read data is latched by the latch circuit LATCH2 in the read/write circuit shown in FIG. 32.

③ Batch Detection by Word Unit (Verify)

After ① verify read and ② page buffer read, batch detection by word unit described above are executed. The operation of batch detection by word unit is automatically performed in the read/write circuit after the verify read and page buffer read are ended.

The batch detection by word unit comprise two steps.

In the first step, the data values latched by the two latch circuits LATCH1 and LATCH2 are compared in units of sense amplifiers.

More specifically, when the verify read data matches the latch data in the page buffer P/B, the value of the node n1 of the latch circuit LATCH1 also matches the value of the node n3 of the latch circuit LATCH2 (n1=n3="0" or n1=n3="1"). This means that programming ("0"-programming or "1"-programming) of the memory cells is properly ended, and the output signal from the exclusive OR circuit Ex-OR is "0".

On the other hand, when the verify read data does not match the latch data in the page buffer P/B, the value of the node n1 of the latch circuit LATCH1 does not match the value of the node n3 of the latch circuit LATCH2 (n1≠n3). This means that programming ("0"-programming or "1"-programming) of the memory cells is non-sufficient, and the output signal from the exclusive OR circuit Ex-OR is "1".

In the second step, the detection result determined by each read/write circuit is input to the NOR circuit NOR1 to obtain a batch detection result in the selected column.

More specifically, the output signals from the exclusive OR circuits Ex-OR of all read/write circuits are input to the NOR circuit NOR1. When the output signals from the exclusive OR circuits Ex-OR of all read/write circuits are "0", i.e., only when programming is sufficiently done for all memory cells of the selected column, the output signal from the NOR circuit NOR1 becomes "1" ("H" level). That is, when the output signal from the NOR circuit NOR1 is at "H" level, the batch detection passes. The process advances to the next column address to execute the program operation, or if the column address is the final column address, the program operation is ended.

When the output signal from the exclusive OR circuit Ex-OR of at least one read/write circuit is "1", i.e., when programming is non-sufficient for at least one memory cell of the selected column, the output signal from the NOR circuit NOR1 becomes "0" ("L" level). When the output signal from the NOR circuit NOR1 is at "L" level, the batch detection fails, so the program operation is performed again for the current column address.

A program potential Vpgm is stepped up as the number of times of program operation increases.

3.-7.-3. Summary

The verify method (FIG. 34) according to the sixth embodiment is based on the verify method (FIG. 28) according to the fourth embodiment. To omit the verify data-in, batch detection is performed by the read/write circuit, and the page buffer read is executed after the verify read.

Since the verify data-in step of transferring the verify read result from the read/write circuit (sense amplifier) to the page buffer P/B can be omitted, the verify time can be shortened by a time corresponding to the verify data-in sequence. In addition, since the page buffer P/B need not incorporate the circuit for changing the latch data in accordance with the verify read result or the circuit for batch detection, the page buffer P/B can be simplified, and the layout area can be reduced.

In the verify method according to the sixth embodiment, the latch data (program data) in the page buffer P/B does not change in accordance with the verify read result. That is, the latch data is kept unchanged from the program data written from the exterior of the chip to the page buffer P/B. For example, for a "0"-programming cell, even when the "0"-programming is sufficient, it is continuously executed until batch detection passes for the final column address.

Hence, over-programming readily occurs in the verify method according to the sixth embodiment. However, the over-programming poses no problem in the operation of the 3Tr-NAND.

On the other hand, when over-programming occurs, overstress is generated on the tunnel oxide film, and the amount of charges that pass through the tunnel oxide film of the memory cell increases, the tunnel oxide film may rapidly degrade to cause a problem of reliability. Whether the verify method of the sixth embodiment is to be employed for, e.g., a 3Tr-NAND or that of another embodiment is to be employed is determined in consideration of which one of the layout area, verify time, and the degree of degradation of the tunnel oxide film of a memory cell has priority in manufacturing a product.

4. Others

The present invention has been described assuming a 3Tr-NAND. However, the present invention can be applied to any other nonvolatile semiconductor memory having a page buffer and sense amplifier. The present invention has been described by exemplifying a binary memory which stores binary data ("1" or "0") in a memory cell. However, the present invention can also be applied to a multilevel memory which stores ternary or multilevel data ("0", "1", . . . ) in a memory cell.

5. Effect of Invention

As has been described above, according to the nonvolatile semiconductor memory of the present invention, firstly, since read data detection and data value determination in the verify read are done using a sense amplifier for the normal data read, the data (e.g., the state of a memory cell in the program operation) can be correctly determined in the verify read (basic effect).

Secondly, based on the basic effect, the layout of the page buffer section can be facilitated by improving the operation timing (second embodiment), the verify time can be shortened by improving the verify sequence (third and fourth embodiments), the time required for batch detection can be shortened (fifth embodiment), and the verify data-in can be omitted by executing batch detection not by the page buffer but by the read/write circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
   a memory cell;
   a bit line for transmitting/receiving data to/from said memory cell;
   a page buffer connected to said bit line to latch the data;
   a read circuit including a sense amplifier; and
   a column gate connected between said page buffer and said sense amplifier,
   wherein in a normal read mode, first data read out from said memory cell is detected by said sense amplifier, and even in a verify read, second data read out from said memory cell is detected by said sense amplifier.

2. A memory according to claim 1, wherein the second data is detected by said sense amplifier and then transferred from said read circuit to said page buffer.

3. A memory according to claim 2, wherein in detecting the second data by said sense amplifier, said page buffer is electrically disconnected from said bit line, and in transferring the second data to said page buffer, said page buffer is electrically connected to said read circuit.

4. A memory according to claim 3, further comprising a logic circuit for determining on the basis of a control signal and column address signal whether said page buffer is to be electrically connected to said read circuit,
   wherein said logic circuit has a function of, when the first data is read out from said memory cell belonging to a specific column and detected by said sense amplifier, electrically connecting said page buffer belonging to the specific column to said read circuit to transfer the second data to said page buffer belonging to the specific column.

5. A memory according to claim 3, further comprising a logic circuit for determining on the basis of a control signal whether said page buffer is to be electrically connected to said read circuit,
   wherein said logic circuit has a function of, in transferring the second data to said page buffer, electrically connecting said page buffer to said read circuit, and when the first data is read out from said memory cell belonging to a specific column and detected by said sense amplifier, said column gate has a function of electrically connecting said page buffer belonging to the specific column to said read circuit to transfer the second data to said page buffer belonging to the specific column.

6. A memory according to claim 5, further comprising
   a first transistor connected between said bit line and an input node of said page buffer, and
   a second transistor connected between ground and the input node of said page buffer,
   wherein before the second data is transferred to said page buffer, the first transistor is set in a cut-off state in advance to electrically disconnect said page buffer from said bit line, and the second transistor is temporarily turned on to reset the input node of said page buffer to a ground potential.

7. A memory according to claim 2, wherein said read circuit has a latch circuit, and in the verify read, the second data is detected by said sense amplifier and latched by said latch circuit, and then, transferred from said latch circuit to said page buffer.

8. A memory according to claim 7, wherein said read circuit is connected to a data bus, the first data is transferred to the data bus in the normal read mode, and the second data is transferred not to the data bus but to said latch circuit in the verify read.

9. A memory according to claim 1, wherein whether a program for increasing a threshold voltage of said memory cell is to be executed or inhibited is determined on the basis of the data latched by said page buffer.

10. A memory according to claim 1, further comprising a batch detecting circuit for detecting whether programming for said memory cell is ended,
   wherein said page buffer is connected to a common node of said batch detecting circuit, and said batch detecting circuit detects a change in potential of a common node, thereby detecting whether programming for said memory cell is ended.

11. A memory according to claim 10, wherein said page buffer has first and second transistors connected in series between the common node and ground, said first transistor being turned on or off on the basis of the data latched by said page buffer, and said second transistor being turned on or off on the basis of a control signal and column address signal in batch detection by said batch detecting circuit.

12. A memory according to claim 10, wherein
   said batch detecting circuit comprises a detection node, a transistor connected between the common node and the detection node, and an inverter connected to the detection node, and
   a capacitance of the common node is larger than that of the detection node, and batch detection by said batch detecting circuit is performed by detecting a change in potential of the detection node.

13. A memory according to claim 1, wherein
   said read circuit comprises first and second latch circuits, and
   the second data is detected by said sense amplifier and then latched by said first latch circuit in the verify read, and the data latched by said page buffer is detected by said sense amplifier and then latched by said second latch circuit in a page buffer read.

14. A memory according to claim 13, wherein said read circuit is connected to a batch detecting circuit, and said batch detecting circuit detects whether programming for said memory cell is ended, on the basis of the data latched by said first latch circuit and the data latched by said second latch circuit.

15. A memory according to claim 1, further comprising two select gate transistors which sandwich said memory cell,
   wherein said memory cell and said two select gate transistors form one cell unit.

16. A verify method of a nonvolatile semiconductor memory, comprising the steps of:
   when one page is formed from N (N is a natural number of not less than 2) groups, sequentially selecting the N groups one by one in accordance with a column address;
   performing a verify read and verify data-in for one group selected in accordance with the column address; and
   performing the verify read and verify data-in for one group which is finally selected from the N groups, and then, simultaneously detecting for all the N groups whether programming is completed,
   wherein in the verify read, data read out from a memory cell is detected by a sense amplifier in a read circuit, and in the verify data-in, the data is transferred from the read circuit to a page buffer.

17. A method according to claim 16, wherein the group is formed from one word.

18. A method according to claim 16, wherein every time the number of times of programming increases, program potential is gradually increased.

19. A verify method of a nonvolatile semiconductor memory, comprising the steps of:
   when one page is formed from N (N is a natural number of not less than 2) groups, sequentially selecting the N groups one by one in accordance with a column address;
   for one group selected in accordance with the column address, performing column unit batch detection for detecting whether programming is completed, verify read, and verify data-in; and
   performing the column unit batch detection, verify read, and verify data-in for one group which is finally selected from the N groups, and then, simultaneously detecting for all the N groups whether programming is completed,
   wherein in the verify read, data read out from a memory cell is detected by a sense amplifier in a read circuit, in the verify data-in, the data is transferred from the read circuit to a page buffer, and when the result of the column unit batch detection for the group selected in accordance with the column address indicates that programming is ended, the verify read and verify data-in are omitted.

20. A method according to claim 19, wherein the group is formed from one word.

21. A method according to claim 19, wherein every time the number of times of programming increases, program potential is gradually increased.

22. A verify method of a nonvolatile semiconductor memory, comprising the steps of:
   when one page is formed from N (N is a natural number of not less than 2) groups, sequentially selecting the N groups one by one in accordance with a column address;
   for one group selected in accordance with the column address, performing a verify read, verify data-in, and word unit batch detection for detecting whether programming is completed;
   when a result of the word unit batch detection indicates that programming is not completed, performing the verify read, verify data-in, and word unit batch detection again for the group selected in accordance with the column address; and
   when the result of the word unit batch detection indicates that programming is completed, incrementing the column address and performing the verify read, verify data-in, and word unit batch detection for a newly selected group,
   wherein in the verify read, data read out from a memory cell is detected by a sense amplifier in a read circuit, and in the verify data-in, the data is transferred from the read circuit to a page buffer.

23. A method according to claim 22, wherein the group is formed from one word.

24. A method according to claim 23, wherein every time the number of times of programming increases, program potential is gradually increased.

25. A verify method of a nonvolatile semiconductor memory, comprising the steps of:
   when one page is formed from N (N is a natural number of not less than 2) groups, sequentially selecting the N groups one by one in accordance with a column address;
   for one group selected in accordance with the column address, performing a verify read, page buffer read, and word unit batch detection for detecting whether programming is completed;

when a result of the word unit batch detection indicates that programming is not completed, performing the verify read, page buffer read, and word unit batch detection again for the group selected in accordance with the column address; and when the result of the word unit batch detection indicates that programming is completed, incrementing the column address and performing the verify read, page buffer read, and word unit batch detection for a newly selected group, wherein in the verify read, data read out from a memory cell is detected by a sense amplifier in a read circuit and then latched by a first latch circuit, in the page buffer read, the data in a page buffer is detected by the sense amplifier in the read circuit and then latched by a second latch circuit, and in the word unit batch detection, batch detection is performed on the basis of the data latched by the first latch circuit and the data latched by the second latch circuit.

26. A method according to claim 25, wherein the group is formed from one word.

27. A method according to claim 25, wherein every time the number of times of programming increases, program potential is gradually increased.

28. A verify method of a nonvolatile semiconductor memory, comprising the steps of:

in a normal read mode, detecting first read data read out from a memory cell by a sense amplifier;

in programming, latching latch data by a page buffer and determining on the basis of the latch data whether a program for increasing a threshold voltage of the memory cell is to be executed or inhibited; and in a verify read, detecting second read data read out from the memory cell by the sense amplifier.

29. A nonvolatile semiconductor memory comprising:

a memory cell;

a bit line for transmitting/receiving data to/from said memory cell; and a page buffer connected to said bit line to latch the data, wherein said page buffer comprises a latch circuit formed from first and second inverters which are flip-flop-connected, a first transistor connected between a write circuit and a first node of said latch circuit to input data in a data load, and a second transistor connected between ground and a second node of said latch circuit and having a gate to which data read out from said memory cell in a verify read is input, an input node of said first inverter is connected to the first node, an output node of said first inverter is connected to the second node, and a third transistor is connected between said first inverter and a power supply terminal, said third transistor being turned off when the data is input to said page buffer, and an input node of said second inverter is connected to the second node, an output node of said second inverter is connected to the first node, and a fourth transistor normally in an ON state is connected between said second inverter and the power supply terminal.

30. A memory according to claim 29, wherein said page buffer is connected to a read circuit including a sense amplifier through a column gate.

31. A memory according to claim 29, further comprising a fifth transistor connected between the second node and ground, and wherein said fifth transistor has a function of resetting a state of said latch circuit.

32. A memory according to claim 29, further comprising a batch detecting circuit for detecting on the basis of a state of said latch circuit whether programming for said memory cell is completed, and a fifth transistor connected between ground and said batch detecting circuit and is turned on or off in accordance with a level of the second node.

* * * * *